US009258014B2

(12) United States Patent
Anderson

(10) Patent No.: US 9,258,014 B2
(45) Date of Patent: *Feb. 9, 2016

(54) USING PARITY DATA FOR CONCURRENT DATA AUTHENTICATION, CORRECTION, COMPRESSION, AND ENCRYPTION

(71) Applicant: STREAMSCALE, INC., Los Angeles, CA (US)

(72) Inventor: Michael H. Anderson, Los Angeles, CA (US)

(73) Assignee: STREAMSCALE, INC., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/543,641

(22) Filed: Nov. 17, 2014

(65) Prior Publication Data

US 2015/0207522 A1 Jul. 23, 2015

Related U.S. Application Data

(63) Continuation of application No. 13/727,581, filed on Dec. 26, 2012, now Pat. No. 8,914,706, which is a continuation-in-part of application No. 13/341,833, filed on Dec. 30, 2011, now Pat. No. 8,683,296.

(51) Int. Cl.
*H03M 13/00* (2006.01)
*H03M 13/37* (2006.01)
(Continued)

(52) U.S. Cl.
CPC ........... *H03M 13/11* (2013.01); *G06F 11/1076* (2013.01); *G06F 11/1096* (2013.01);
(Continued)

(58) Field of Classification Search
CPC ............ H03M 13/373; H03M 13/616; H03M 13/3761; H03M 13/3776; H03M 13/1191; H03M 13/134; H03M 13/151; H03M 13/6569; G06F 11/1076; G06F 11/1092; G06F 11/1096; G06F 12/0238; G06F 12/06; G06F 2211/1057; G06F 2211/109; G06F 2212/7202; G06F 2212/7208; H04L 1/0043; H04L 1/0057
USPC ............... 714/6.24, 6.1, 6.11, 6.2, 6.21, 6.32, 714/763, 752, 758, 768, 770, 773, 784, 786
See application file for complete search history.

(56) References Cited

U.S. PATENT DOCUMENTS 6,654,924 B1 * 11/2003 Hassner et al. ............... 714/758
6,823,425 B2 * 11/2004 Ghosh et al. .................. 711/114
(Continued)

OTHER PUBLICATIONS

Hafner et al., Matrix Methods for Lost Data Reconstruction in Erasure Codes, Nov. 16, 2005, USENIX FAST '05 Paper, pp. 183-196.*

(Continued)

*Primary Examiner* — John J Tabone, Jr.
(74) *Attorney, Agent, or Firm* — Christie, Parker & Hale, LLP

(57) ABSTRACT

A system for software error-correcting code (ECC) protection or compression of original data using ECC data in a first memory is provided. The system includes a processing core for executing computer instructions and accessing data from a main memory, and a non-volatile storage medium for storing the computer instructions. The software ECC protection or compression includes: a data matrix for holding the original data in the first memory; a check matrix for holding the ECC data in the first memory; an encoding matrix for holding first factors in the main memory, the first factors being for encoding the original data into the ECC data; and a thread for executing on the processing core. The thread includes a Galois Field multiplier for multiplying entries of the data matrix by an entry of the encoding matrix, and a sequencer for ordering operations using the Galois Field multiplier to generate the ECC data.

16 Claims, 21 Drawing Sheets

(51) Int. Cl.
*H03M 13/13* (2006.01)
*H04L 1/00* (2006.01)
*G06F 11/10* (2006.01)
*G06F 12/02* (2006.01)
*G06F 12/06* (2006.01)
*H03M 13/11* (2006.01)
*H03M 13/15* (2006.01)

(52) U.S. Cl.
CPC .......... *G06F12/0238* (2013.01); *G06F 12/06* (2013.01); *H03M 13/1191* (2013.01); *H03M 13/134* (2013.01); *H03M 13/1515* (2013.01); *H03M 13/373* (2013.01); *H03M 13/3761* (2013.01); *H03M 13/3776* (2013.01); *H03M 13/616* (2013.01); *H04L 1/0043* (2013.01); *G06F 11/1092* (2013.01); *G06F 2211/109* (2013.01); *G06F 2211/1057* (2013.01)

(56) References Cited

U.S. PATENT DOCUMENTS

| | | | |
|---|---|---|---|
| 7,350,126 B2 * | 3/2008 | Winograd et al. | 714/752 |
| 7,930,337 B2 | 4/2011 | Hasenplaugh et al. | |
| 8,145,941 B2 * | 3/2012 | Jacobson | 714/6.24 |
| 8,352,847 B2 * | 1/2013 | Gunnam | 714/801 |
| 8,683,296 B2 * | 3/2014 | Anderson et al. | 714/763 |
| 2011/0029756 A1 * | 2/2011 | Biscondi et al. | 712/22 |
| 2012/0272036 A1 * | 10/2012 | Muralimanohar et al. | 711/202 |
| 2013/0108048 A1 * | 5/2013 | Grube et al. | 380/270 |
| 2013/0110962 A1 * | 5/2013 | Grube et al. | 709/213 |
| 2013/0111552 A1 * | 5/2013 | Grube et al. | 726/3 |
| 2013/0124932 A1 * | 5/2013 | Schuh et al. | 714/718 |
| 2013/0173956 A1 * | 7/2013 | Anderson | 714/6.24 |
| 2013/0173996 A1 * | 7/2013 | Anderson et al. | 714/770 |

OTHER PUBLICATIONS

Anvin; The mathematics of RAID-6; First Version Jan. 20, 2004; Last Updated Dec. 20, 2011; pp. 1-9.

Maddock, et al.; White Paper, Surviving Two Disk Failures Introducing Various "RAID 6" Implementations; Xyratex; pp. 1-13.

Plank; All About Erasure Codes:—Reed-Solomon Coding—LDPC Coding; Logistical Computing and Internetworking Laboratory, Department of Computer Science, University of Tennessee; ICL—Aug. 20, 2004; 52 sheets.

Li et al.; Preventing Silent Data Corruptions from Propagating During Data Reconstruction; IEEE Transactions on Computers, vol. 59, No. 12, Dec. 2010; pp. 1611-1624.

* cited by examiner

FIG. 7

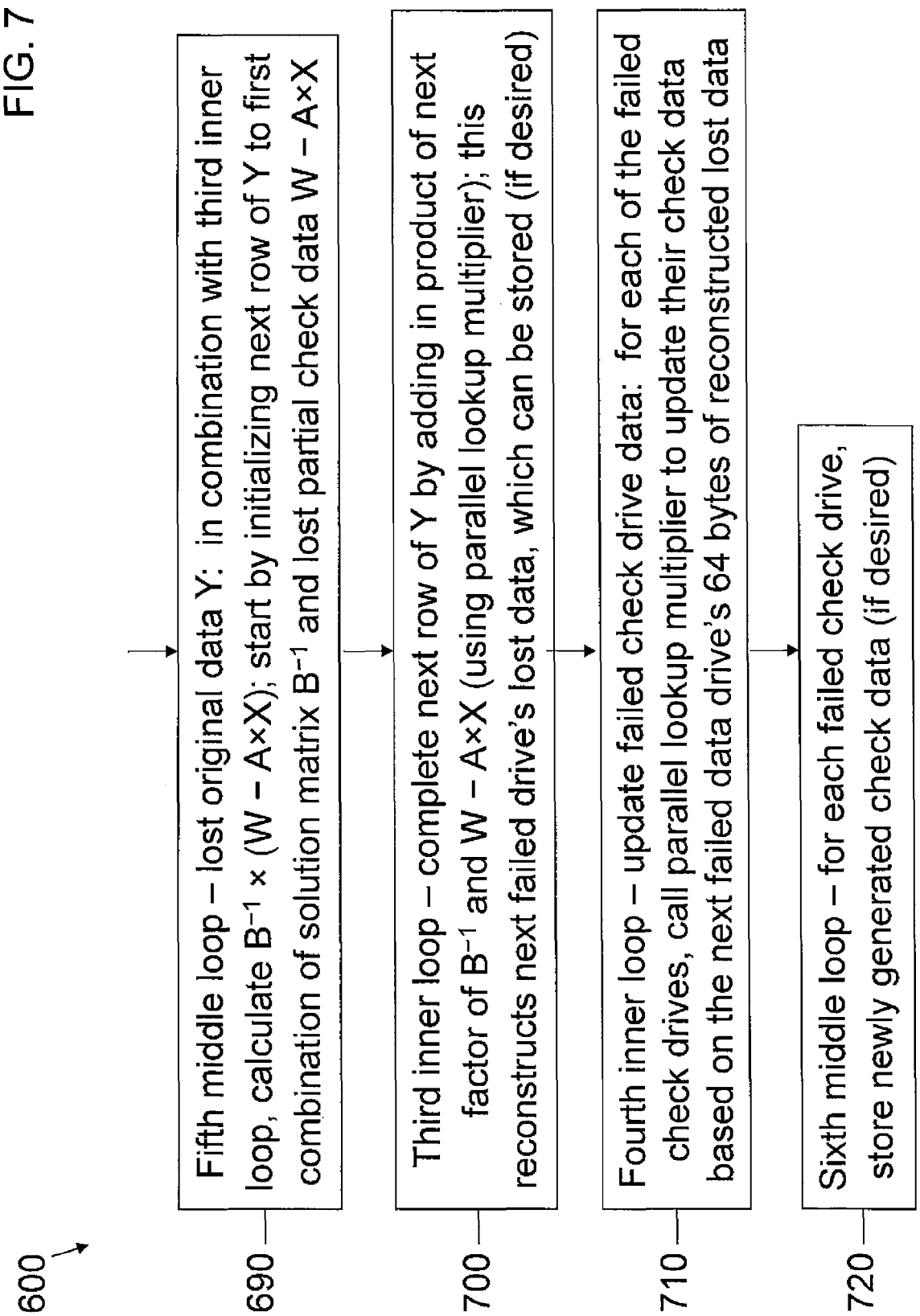

690 — Fifth middle loop – lost original data Y: in combination with third inner loop, calculate $B^{-1} \times (W - A \times X)$; start by initializing next row of Y to first combination of solution matrix $B^{-1}$ and lost partial check data $W - A \times X$ 700 — Third inner loop – complete next row of Y by adding in product of next factor of $B^{-1}$ and $W - A \times X$ (using parallel lookup multiplier); this reconstructs next failed drive's lost data, which can be stored (if desired)

710 — Fourth inner loop – update failed check drive data: for each of the failed check drives, call parallel lookup multiplier to update their check data based on the next failed data drive's 64 bytes of reconstructed lost data 720 — Sixth middle loop – for each failed check drive, store newly generated check data (if desired)

600

USING PARITY DATA FOR CONCURRENT DATA AUTHENTICATION, CORRECTION, COMPRESSION, AND ENCRYPTION

CROSS REFERENCE TO RELATED APPLICATION

This application is a continuation and claims priority to and the benefit of U.S. patent application Ser. No. 13/727,581, entitled USING PARITY DATA FOR CONCURRENT DATA AUTHENTICATION, CORRECTION, COMPRESSION, AND ENCRYPTION, filed on Dec. 26, 2012, which is a continuation-in-part of U.S. patent application Ser. No. 13/341,833, entitled ACCELERATED ERASURE CODING SYSTEM AND METHOD (hereinafter "the Benefit Application"), now U.S. Pat. No. 8,683,296, filed on Dec. 30, 2011, the entire contents of all of which are incorporated herein by reference.

BACKGROUND

1. Field

Aspects of embodiments of the present invention are directed toward a system and method of using parity data for erasure code data verification, correction, encryption, and compression, alone or in combination with each other.

2. Description of Related Art (from the Benefit Application)

An erasure code is a type of error-correcting code (ECC) useful for forward error-correction in applications like a redundant array of independent disks (RAID) or high-speed communication systems. In a typical erasure code, data (or original data) is organized in stripes, each of which is broken up into N equal-sized blocks, or data blocks, for some positive integer N. The data for each stripe is thus reconstructable by putting the N data blocks together. However, to handle situations where one or more of the original N data blocks gets lost, erasure codes also encode an additional M equal-sized blocks (called check blocks or check data) from the original N data blocks, for some positive integer M.

The N data blocks and the M check blocks are all the same size. Accordingly, there are a total of N+M equal-sized blocks after encoding. The N+M blocks may, for example, be transmitted to a receiver as N+M separate packets, or written to N+M corresponding disk drives. For ease of description, all N+M blocks after encoding will be referred to as encoded blocks, though some (for example, N of them) may contain unencoded portions of the original data. That is, the encoded data refers to the original data together with the check data.

The M check blocks build redundancy into the system, in a very efficient manner, in that the original data (as well as any lost check data) can be reconstructed if any N of the N+M encoded blocks are received by the receiver, or if any N of the N+M disk drives are functioning correctly. Note that such an erasure code is also referred to as "optimal." For ease of description, only optimal erasure codes will be discussed in this application. In such a code, up to M of the encoded blocks can be lost, (e.g., up to M of the disk drives can fail) so that if any N of the N+M encoded blocks are received successfully by the receiver, the original data (as well as the check data) can be reconstructed. N/(N+M) is thus the code rate of the erasure code encoding (i.e., how much space the original data takes up in the encoded data). Erasure codes for select values of N and M can be implemented on RAID systems employing N+M (disk) drives by spreading the original data among N "data" drives, and using the remaining M drives as "check" drives. Then, when any N of the N+M drives are correctly functioning, the original data can be reconstructed, and the check data can be regenerated.

Erasure codes (or more specifically, erasure coding systems) are generally regarded as impractical for values of M larger than 1 (e.g., RAID5 systems, such as parity drive systems) or 2 (RAID6 systems), that is, for more than one or two check drives. For example, see H. Peter Anvin, "The mathematics of RAID-6," the entire content of which is incorporated herein by reference, p. 7, "Thus, in 2-disk-degraded mode, performance will be very slow. However, it is expected that that will be a rare occurrence, and that performance will not matter significantly in that case." See also Robert Maddock et al., "Surviving Two Disk Failures," p. 6, "The main difficulty with this technique is that calculating the check codes, and reconstructing data after failures, is quite complex. It involves polynomials and thus multiplication, and requires special hardware, or at least a signal processor, to do it at sufficient speed." In addition, see also James S. Plank, "All About Erasure Codes:—Reed-Solomon Coding—LDPC Coding," slide 15 (describing computational complexity of Reed—Solomon decoding), "Bottom line: When n & m grow, it is brutally expensive." Accordingly, there appears to be a general consensus among experts in the field that erasure coding systems are impractical for RAID systems for all but small values of M (that is, small numbers of check drives), such as 1 or 2.

Modern disk drives, on the other hand, are much less reliable than those envisioned when RAID was proposed. This is due to their capacity growing out of proportion to their reliability. Accordingly, systems with only a single check disk have, for the most part, been discontinued in favor of systems with two check disks.

In terms of reliability, a higher check disk count is clearly more desirable than a lower check disk count. If the count of error events on different drives is larger than the check disk count, data may be lost and that cannot be reconstructed from the correctly functioning drives. Error events extend well beyond the traditional measure of advertised mean time between failures (MTBF). A simple, real world example is a service event on a RAID system where the operator mistakenly replaces the wrong drive or, worse yet, replaces a good drive with a broken drive. In the absence of any generally accepted methodology to train, certify, and measure the effectiveness of service technicians, these types of events occur at an unknown rate, but certainly occur. The foolproof solution for protecting data in the face of multiple error events is to increase the check disk count.

3. Description of Related Art (New)

Parity data is used in digital error detecting and correcting logic, such as erasure codes. An erasure code is a type of error-correcting code (ECC) useful for forward error-correction in applications like a redundant array of independent disks (or devices, also known as RAID) or high-speed communication systems. In a typical erasure code, data (or original data) is organized in stripes, each of which is broken up into N equal-sized blocks, or data blocks, for some positive integer N. The data for each stripe is thus reconstructable by putting the N data blocks together. However, to handle situations where one or more of the original N data blocks get lost (for example, missing, corrupted, etc.), erasure codes also encode an additional M equal-sized blocks (called check blocks or check data; also referred to as parity blocks or parity data) from the original N data blocks, for some positive integer M.

The N data blocks and the M check blocks are all the same size. Accordingly, there are a total of N+M equal-sized blocks after encoding. The N+M blocks may, for example, be transmitted to a receiver as N+M separate packets, or written to N+M corresponding disk drives, or physically or logically separated from each other by some other device or convention. For ease of description, all N+M blocks after encoding will be referred to as encoded blocks, though some (for example, N of them) may contain unencoded portions of the original data. That is, the encoded data refers to the original data together with the check data. Another way to look at this is that the original data can be trivially encoded into N blocks, one for each original data block. Still another way to look at this is that the original N data blocks can be encoded into N+M encoded blocks.

The M check blocks build redundancy into the system, in a very efficient manner, in that the original data (as well as any lost check data) can be reconstructed if any N of the N+M encoded blocks are received by the receiver, or if any N of the N+M disk drives are functioning correctly (or, in short, if any N of the N+M encoded blocks are available). Note that such an erasure code is also referred to as "optimal." For ease of description, only optimal erasure codes will be discussed in this application. In such a code, up to M of the encoded blocks can be lost, (e.g., up to M of the disk drives can fail) so that if any N of the N+M encoded blocks are received successfully by the receiver, the original data (as well as the check data) can be reconstructed. N/(N+M) is thus the code rate of the erasure code encoding (i.e., how much space the original data takes up in the encoded data). Erasure codes for select values of N and M can be implemented on RAID systems employing N+M (disk) drives by spreading the original data among N "data" drives, and using the remaining M drives as "check" drives. Then, when any N of the N+M drives are correctly functioning, the original data can be reconstructed, and the check data can be regenerated.

Systems and methods of implementing practical erasure codes for arbitrary values of N and M are described in the Benefit Application and included herein. The advent of such practical implementations allows potentially a large number M of check drives in a RAID environment, some or most of which would not even be needed in a typical failure scenario.

Erasure codes are usually described with an underlying assumption that, at any time, each encoded block is known either to contain entirely correct data or to contain corrupted or missing data. Accordingly, it is only a matter of making sure that there are N encoded blocks that are assumed to have correct data in order to guarantee that the original data can be reconstructed. Silent data corruptions (SDCs), this is, the introduction of errors into the encoded blocks, which can take place in any portion of the memory or storage hierarchy, are therefore assumed not to exist in this framework.

However, studies of real life data show otherwise. SDCs are introduced throughout the memory and storage hierarchy. Left undetected (and uncorrected), SDCs can propagate and compromise data, amplifying their negative effects.

In Li, M. & Shu, J., *Preventing Silent Data Corruptions from Propagating During Data Reconstruction*, 59 IEEE TRANSACTIONS ON COMPUTERS 1611-24 (vol. 12, December 2010) the authors describe the SDC phenomenon with erasure codes and propose solutions for SDC detection and correction during data reconstruction. However, as already mentioned, SDCs can be introduced anywhere in the memory or storage hierarchy, so it would be desirable to prevent their occurrence anywhere, and not just during data reconstruction.

SUMMARY

From the Benefit Application

Aspects of embodiments of the present invention address these problems by providing a practical erasure coding system that, for byte-level RAID processing (where each byte is made up of 8 bits), performs well even for values of N+M as large as 256 drives (for example, N=127 data drives and M=129 check drives). Further aspects provide for a single precomputed encoding matrix (or master encoding matrix) S of size $M_{max} \times N_{max}$, or $(N_{max}+M_{max}) \times N_{max}$ or $-1) \times N_{max}$, elements (e.g., bytes), which can be used, for example, for any combination of $N \leq N_{max}$ data drives and $M \leq M_{max}$ check drives such that $N_{max}+M_{max} \leq 256$ (e.g., $N_{max}=127$ and $M_{max}=129$, or $N_{max}=63$ and $M_{max}=193$). This is an improvement over prior art solutions that rebuild such matrices from scratch every time N or M changes (such as adding another check drive). Still higher values of N and M are possible with larger processing increments, such as 2 bytes, which affords up to N+M=65,536 drives (such as N=32,767 data drives and M=32,769 check drives).

Higher check disk count can offer increased reliability and decreased cost. The higher reliability comes from factors such as the ability to withstand more drive failures. The decreased cost arises from factors such as the ability to create larger groups of data drives. For example, systems with two checks disks are typically limited to group sizes of 10 or fewer drives for reliability reasons. With a higher check disk count, larger groups are available, which can lead to fewer overall components for the same unit of storage and hence, lower cost.

Additional aspects of embodiments of the present invention further address these problems by providing a standard parity drive as part of the encoding matrix. For instance, aspects provide for a parity drive for configurations with up to 127 data drives and up to 128 (non-parity) check drives, for a total of up to 256 total drives including the parity drive. Further aspects provide for different breakdowns, such as up to 63 data drives, a parity drive, and up to 192 (non-parity) check drives. Providing a parity drive offers performance comparable to RAID5 in comparable circumstances (such as single data drive failures) while also being able to tolerate significantly larger numbers of data drive failures by including additional (non-parity) check drives.

Further aspects are directed to a system and method for implementing a fast solution matrix algorithm for Reed—Solomon codes. While known solution matrix algorithms compute an N×N solution matrix (see, for example, J. S. Plank, "A tutorial on Reed-Solomon coding for fault-tolerance in RAID-like systems," Software—Practice & Experience, 27(9):995-1012, September 1997, and J. S. Plank and Y. Ding, "Note: Correction to the 1997 tutorial on Reed-Solomon coding," Technical Report CS-03-504, University of Tennessee, April 2003), requiring $O(N^3)$ operations, regardless of the number of failed data drives, aspects of embodiments of the present invention compute only an F×F solution matrix, where F is the number of failed data drives. The overhead for computing this F×F solution matrix is approximately $F^3/3$ multiplication operations and the same number of addition operations. Not only is F≤N, in almost any practical application, the number of failed data drives F is considerably smaller than the number of data drives N. Accordingly, the fast solution matrix algorithm is considerably faster than any known approach for practical values of F and N.

Still further aspects are directed toward fast implementations of the check data generation and the lost (original and check) data reconstruction. Some of these aspects are directed toward fetching the surviving (original and check) data a minimum number of times (that is, at most once) to carry out the data reconstruction. Some of these aspects are directed toward efficient implementations that can maximize or significantly leverage the available parallel processing power of multiple cores working concurrently on the check data generation and the lost data reconstruction. Existing implementations do not attempt to accelerate these aspects of the data generation and thus fail to achieve a comparable level of performance.

By providing practical and efficient systems and methods for erasure coding systems (which for byte-level processing can support up to N+M=256 drives, such as N=127 data drives and M=129 check drives, including a parity drive), applications such as RAID systems that can tolerate far more failing drives than was thought to be possible or practical can be implemented with accelerated performance significantly better than any prior art solution.

SUMMARY

New

Aspects of embodiments of the present invention are directed toward a system and method of using parity data for erasure code data verification and authentication, error detection and correction, compression, and encryption. In particular, aspects are directed toward verifying data, including detecting and correcting silent data corruptions (SDCs) in the memory or storage hierarchy.

In an exemplary embodiment, RAID parity data is maintained with the contents of a RAID cache. Accordingly, Read operations of data from the RAID cache can have any of their corresponding data and check blocks verified before or after the Read operations are performed. It may also to be possible to correct the errors, especially if they are not too numerous. In addition, Write operations of data to the RAID cache can have their corresponding data and check blocks verified (with possible error correction) before or after the Write operations are performed.

In further embodiments of the present invention, the number of check blocks kept in the RAID cache can differ from the number of check drives used to store the check (parity) data. That is, the RAID cache stripe size can differ from the external (e.g., disk drive) stripe size, which allows for both sizes to be optimized depending on factors such as hardware resources available, reliability versus RAID cache size and processing overhead, etc.

According to an exemplary embodiment of the present invention, a system for software error-correcting code (ECC) protection or compression of original data using ECC data in a first memory is provided. The system includes a processing core for executing computer instructions and accessing data from a main memory, and a non-volatile storage medium for storing the computer instructions. The processing core, the storage medium, and the computer instructions are configured to implement the software ECC protection or compression of the original data using the ECC data in the first memory. The software ECC protection or compression includes: a data matrix for holding the original data in the first memory; a check matrix for holding the ECC data in the first memory; an encoding matrix for holding first factors in the main memory, the first factors being for encoding the original data into the ECC data; and a thread for executing on the processing core. The thread includes a Galois Field multiplier for multiplying entries of the data matrix by an entry of the encoding matrix, and a sequencer for ordering operations through the data matrix and the encoding matrix using the Galois Field multiplier to generate the ECC data.

The sequencer may be configured to generate the ECC data on write operations of the original data to the first memory.

The sequencer may be further configured to regenerate the ECC data on read operations of the original data from the first memory.

The thread may further include a comparator for comparing the regenerated ECC data with the generated ECC data.

The thread may further include an error corrector for correcting errors in the held original data and the held ECC data.

The Galois Field multiplier may be a parallel multiplier for concurrently multiplying the entries of the data matrix by the entry of the encoding matrix.

The processing core may include a plurality of processing cores. The thread may include a plurality of threads. The software ECC protection or compression may further include a scheduler for generating the ECC data by dividing the data matrix into a plurality of data matrices, dividing the check matrix into a plurality of check matrices, assigning corresponding ones of the data matrices and the check matrices to the threads, and assigning the threads to the processing cores to concurrently generate portions of the ECC data corresponding to the check matrices from respective ones of the data matrices.

The processing core may include a plurality of processing cores. The thread may include a plurality of threads. The software ECC protection or compression may further include a scheduler for generating the ECC data by dividing the data matrix into a plurality of data matrices, dividing the check matrix into a plurality of check matrices, assigning corresponding ones of the data matrices and the check matrices to the threads, and assigning the threads to the processing cores to concurrently generate portions of the ECC data corresponding to the check matrices from respective ones of the data matrices.

The software ECC protection or compression may further include a second check matrix for holding second ECC data in the first memory. The encoding matrix may be further configured to hold second factors in the main memory, the second factors being for encoding the original data into the second ECC data. The sequencer may be further configured to order operations through the data matrix and the encoding matrix using the Galois Field multiplier to generate the second ECC data.

The sequencer may be further configured to regenerate the ECC data or the second ECC data on read operations of the original data from the first memory. The thread may further include a comparator for comparing the regenerated ECC data with the generated ECC data and for comparing the regenerated second ECC data with the generated second ECC data.

The thread may further include an error corrector for correcting errors in the held original data, the held ECC data, and the held second ECC data.

The Galois Field multiplier may be a parallel multiplier for concurrently multiplying the entries of the data matrix by the entry of the encoding matrix.

The processing core may include a plurality of processing cores. The thread may include a plurality of threads. The software ECC protection or compression may further include a scheduler for generating the ECC data and the second ECC data by: dividing the data matrix into a plurality of data matrices; dividing the check matrix into a plurality of check matrices; dividing the second check matrix into a plurality of second check matrices; assigning corresponding ones of the data matrices, the check matrices, and the second check matrices to the threads; and assigning the threads to the processing cores to concurrently generate portions of the ECC data corresponding to the check matrices from respective ones of the data matrices and to concurrently generate portions of the second ECC data corresponding to the second check matrices from respective ones of the data matrices.

The processing core may include a plurality of processing cores. The thread may include a plurality of threads. The software ECC protection or compression may further include a scheduler for generating the ECC data and the second ECC data by: dividing the data matrix into a plurality of data matrices; dividing the check matrix into a plurality of check matrices; dividing the second check matrix into a plurality of second check matrices; assigning corresponding ones of the data matrices, the check matrices, and the second check matrices to the threads; and assigning the threads to the processing cores to concurrently generate portions of the ECC data corresponding to the check matrices from respective ones of the data matrices and to concurrently generate portions of the second ECC data corresponding to the second check matrices from respective ones of the data matrices.

The original data may include first ones and second ones of the original data. The ECC data may include corresponding first ones and second ones of the ECC data. The thread may further include a compressor for compressing the original data in the first memory by storing the first ones of the original data in the first memory, storing the second ones of the ECC data in the first memory, not storing the second ones of the original data in the first memory, and corresponding the second ones of the ECC data to the first ones of the original data.

The compressor may be further configured to not store the first ones of the ECC data in the first memory.

The thread may further include a decompressor for regenerating the second ones of the original data from the first ones of the original data and the second ones of the ECC data.

The decompressor may include an error corrector for regenerating one of the second ones of the original data by performing error correction on a corresponding one of the first ones of the original data using a corresponding one of the second ones of the ECC data.

The compressor may be configured to correspond each one of the second ones of the ECC data directly to one of the first ones of the original data, or indirectly to the one of the first ones of the original data via a different one of the second ones of the ECC data that corresponds to the one of the first ones of the ECC data.

The thread may further include a comparator for keeping the first ones of the original data distinct from one another.

The compressor may be further configured to store the first ones of the ECC data in the first memory. The comparator may be further configured to compare the generated ECC data with the first ones of the ECC data to identify a duplicate of one of the first ones of the original data.

The thread may further include an error corrector. The compressor may be configured to, when adding new original data having new ECC data to the first memory, use the error corrector to identify a corresponding one of the first ones of the original data that can generate the new original data by performing error correction on the corresponding one of the first ones of the original data using the new ECC data.

The compressor may be configured to: add the new original data to the first memory as one of the first ones of the original data when there is no said corresponding one of the first ones of the original data; and add the new ECC data to the first memory as one of the second ones of the ECC data, not add the new original data to the first memory, and correspond the new ECC data to the corresponding one of the first ones of the original data when the error corrector identifies the corresponding one of the first ones of the original data.

According to another exemplary embodiment of the present invention, a method of error-correcting code (ECC) protection or compression of original data with ECC data in a first memory using a computing system including a processing core for executing computer instructions and accessing data from a main memory, and a non-volatile storage medium for storing the computer instructions is provided. The method includes accessing the computer instructions from the storage medium, executing the computer instructions on the processing core, arranging the original data as a data matrix in the first memory, arranging the ECC data as a check matrix in the first memory, arranging first factors as an encoding matrix in the main memory, and encoding the original data into the ECC data using the first factors. The encoding of the original data into the ECC data includes multiplying entries of the data matrix by an entry of the encoding matrix using Galois Field multiplication, ordering operations through the data matrix and the encoding matrix using the Galois Field multiplication to generate the ECC data.

The encoding of the original data into the ECC data may further include encoding the ECC data when writing the original data to the first memory.

The method may further include re-encoding the original data into a copy of the ECC data when reading the original data from the first memory.

The method may further include comparing the ECC data with the copy of the ECC data.

The method may further include correcting errors in the original data or the ECC data by using the ECC data.

The processing core may include a plurality of processing cores. The encoding of the original data into the ECC data may further include dividing the data matrix into a plurality of data matrices, dividing the check matrix into a plurality of check matrices, and assigning corresponding ones of the data matrices and the check matrices to the processing cores to concurrently encode portions of the original data corresponding to the data matrices into respective portions of the ECC data corresponding to the check matrices.

The method may further include arranging second ECC data as a second check matrix in the first memory, arranging second factors in the encoding matrix, and encoding the original data into the second ECC data using the second factors. The encoding of the original data into the second ECC data may include multiplying entries of the data matrix by an entry of the encoding matrix using further Galois Field multiplication, and ordering operations through the data matrix and the encoding matrix using the further Galois Field multiplication to generate the second ECC data.

The original data may include first ones and second ones of the original data. The ECC data may include corresponding first ones and second ones of the ECC data. The method may further include compressing the original data in the first memory by storing the first ones of the original data in the first memory, storing the second ones of the ECC data in the first memory, not storing the second ones of the original data in the first memory, and corresponding the second ones of the ECC data to the first ones of the original data.

The method may further include not storing the first ones of the ECC data in the first memory.

The method may further include decompressing the original data by regenerating the second ones of the original data from the first ones of the original data and the second ones of the ECC data.

Said regenerating one of the second ones of the original data may include performing error correction on a corresponding one of the first ones of the original data using a corresponding one of the second ones of the ECC data.

The method may further include when adding new original data having new ECC data to the first memory, identifying a corresponding one of the first ones of the original data that can generate the new original data by performing error correction on the corresponding one of the first ones of the original data using the new ECC data.

The method may further include: adding the new original data to the first memory as one of the first ones of the original data when there is no said corresponding one of the first ones of the original data; and adding the new ECC data to the first memory as one of the second ones of the ECC data, not adding the new original data to the first memory, and corresponding the new ECC data to the corresponding one of the first ones of the original data after the identifying of the corresponding one of the first ones of the original data.

According to embodiments of the present invention, RAID cache data can be verified and any detected errors can possibly be corrected by maintaining some or all of the corresponding RAID parity data at all times in the RAID cache. This helps lessen or eliminate silent data corruptions (SDCs) resulting from any part of the memory or storage hierarchy associated with the RAID cache or storage subsystem.

Further embodiments are directed to other applications, such as data authentication, compression, and encryption.

BRIEF DESCRIPTION OF THE DRAWINGS

The accompanying drawings, together with the specification, illustrate exemplary embodiments of the present invention and, together with the description, serve to explain aspects and principles of the present invention. FIGS. 1-9 are from the Benefit Application, while

FIG. 1 shows an exemplary stripe of original and check data according to an embodiment of the present invention.

FIG. 2 shows an exemplary method for reconstructing lost data after a failure of one or more drives according to an embodiment of the present invention.

FIG. 3 shows an exemplary method for performing a parallel lookup Galois field multiplication according to an embodiment of the present invention.

FIG. 4 shows an exemplary method for sequencing the parallel lookup multiplier to perform the check data generation according to an embodiment of the present invention.

FIGS. 5-7 show an exemplary method for sequencing the parallel lookup multiplier to perform the lost data reconstruction according to an embodiment of the present invention.

FIG. 8 illustrates a multi-core architecture system according to an embodiment of the present invention.

FIG. 9 shows an exemplary disk drive configuration according to an embodiment of the present invention.

FIG. 10 illustrates an exemplary memory and storage hierarchy system according to an embodiment of the present invention.

FIG. 11 illustrates an exemplary RAID cache according to an embodiment of the present invention.

FIG. 12 illustrates an exemplary method for consistency checking or error detection according to an embodiment of the present invention.

FIG. 13 illustrates an exemplary method for detecting and correcting errors according to an embodiment of the present invention.

FIG. 14 illustrates an exemplary method for correcting errors according to an embodiment of the present invention.

FIG. 15 illustrates an exemplary method for correcting errors according to another embodiment of the present invention.

FIG. 16 illustrates an exemplary method of compressing data according to an embodiment of the present invention.

FIG. 17 illustrates an exemplary method of compressing data according to another embodiment of the present invention.

FIG. 18 illustrates an exemplary method of compressing data according to yet another embodiment of the present invention.

FIG. 19 illustrates an exemplary method of compressing data according to still yet another embodiment of the present invention.

FIG. 20 illustrates exemplary hardware or software logic for implementing the error detecting and correcting logic according to an embodiment of the present invention.

FIG. 21 illustrates an exemplary system for implementing software error-correcting code (ECC) protection or compression of original data using ECC data in a cache according to an embodiment of the present invention.

DETAILED DESCRIPTION

From the Benefit Application

Figure 1:
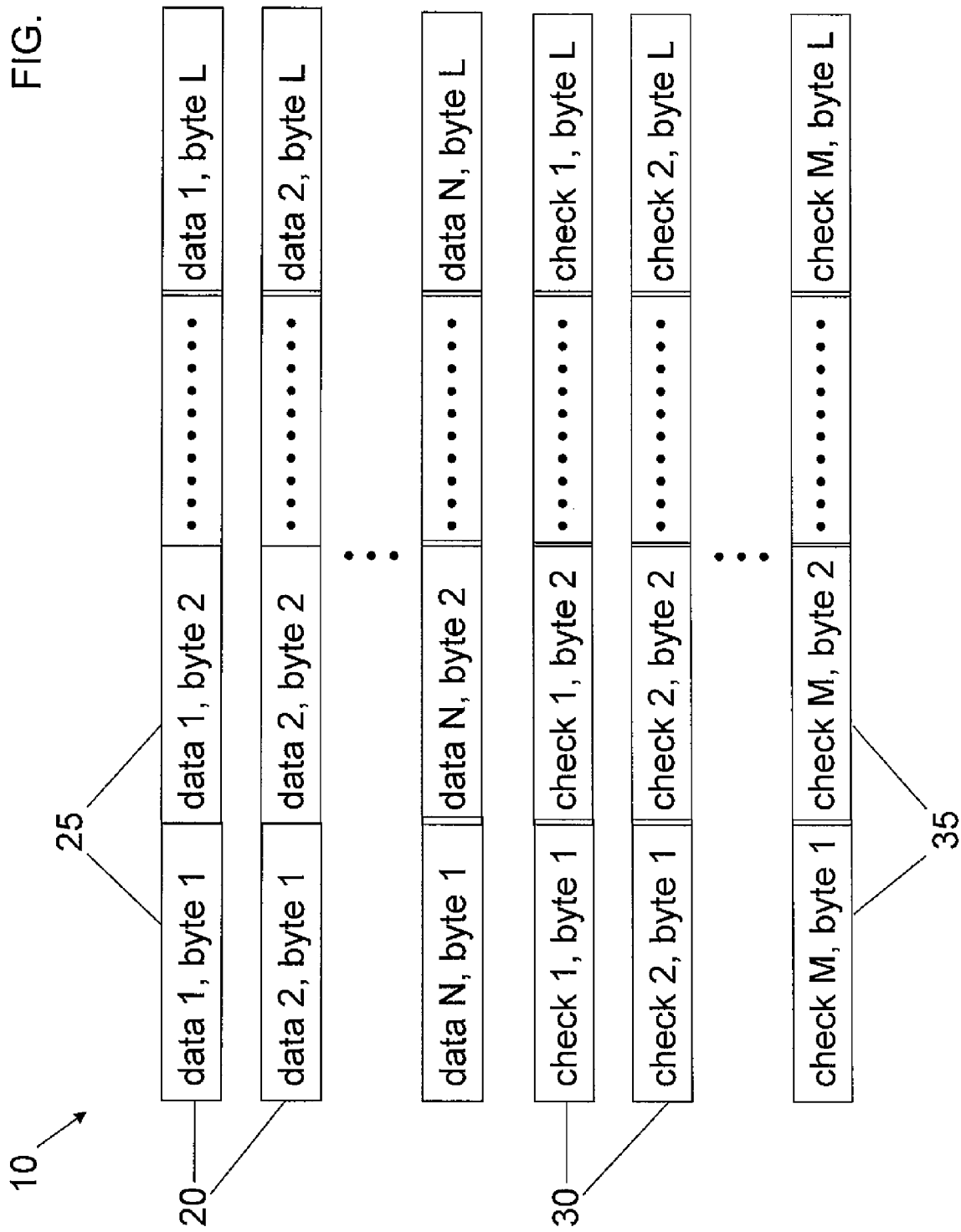

Hereinafter, exemplary embodiments of the invention will be described in more detail with reference to the accompanying drawings. In the drawings, like reference numerals refer to like elements throughout.

While optimal erasure codes have many applications, for ease of description, they will be described in this application with respect to RAID applications, i.e., erasure coding systems for the storage and retrieval of digital data distributed across numerous storage devices (or drives), though the present application is not limited thereto. For further ease of description, the storage devices will be assumed to be disk drives, though the invention is not limited thereto. In RAID systems, the data (or original data) is broken up into stripes, each of which includes N uniformly sized blocks (data blocks), and the N blocks are written across N separate drives (the data drives), one block per data drive.

In addition, for ease of description, blocks will be assumed to be composed of L elements, each element having a fixed size, say 8 bits or one byte. An element, such as a byte, forms the fundamental unit of operation for the RAID processing, but the invention is just as applicable to other size elements, such as 16 bits (2 bytes). For simplification, unless otherwise indicated, elements will be assumed to be one byte in size throughout the description that follows, and the term "element(s)" and "byte(s)" will be used synonymously.

Conceptually, different stripes can distribute their data blocks across different combinations of drives, or have different block sizes or numbers of blocks, etc., but for simplification and ease of description and implementation, the described embodiments in the present application assume a consistent block size (L bytes) and distribution of blocks among the data drives between stripes. Further, all variables, such as the number of data drives N, will be assumed to be positive integers unless otherwise specified. In addition, since the N=1 case reduces to simple data mirroring (that is, copying the same data drive multiple times), it will also be assumed for simplicity that N≥2 throughout.

The N data blocks from each stripe are combined using arithmetic operations (to be described in more detail below) in M different ways to produce M blocks of check data (check blocks), and the M check blocks written across M drives (the check drives) separate from the N data drives, one block per check drive. These combinations can take place, for example, when new (or changed) data is written to (or back to) disk. Accordingly, each of the N+M drives (data drives and check drives) stores a similar amount of data, namely one block for each stripe. As the processing of multiple stripes is conceptually similar to the processing of one stripe (only processing multiple blocks per drive instead of one), it will be further assumed for simplification that the data being stored or retrieved is only one stripe in size unless otherwise indicated. It will also be assumed that the block size L is sufficiently large that the data can be consistently divided across each block to produce subsets of the data that include respective portions of the blocks (for efficient concurrent processing by different processing units).

FIG. 1 shows an exemplary stripe 10 of original and check data according to an embodiment of the present invention.

Referring to FIG. 1, the stripe 10 can be thought of not only as the original N data blocks 20 that make up the original data, but also the corresponding M check blocks 30 generated from the original data (that is, the stripe 10 represents encoded data). Each of the N data blocks 20 is composed of L bytes 25 (labeled byte 1, byte 2, . . . , byte L), and each of the M check blocks 30 is composed of L bytes 35 (labeled similarly). In addition, check drive 1, byte 1, is a linear combination of data drive 1, byte 1; data drive 2, byte 1; . . . ; data drive N, byte 1. Likewise, check drive 1, byte 2, is generated from the same linear combination formula as check drive 1, byte 1, only using data drive 1, byte 2; data drive 2, byte 2; . . . ; data drive N, byte 2. In contrast, check drive 2, byte 1, uses a different linear combination formula than check drive 1, byte 1, but applies it to the same data, namely data drive 1, byte 1; data drive 2, byte 1; . . . ; data drive N, byte 1. In this fashion, each of the other check bytes 35 is a linear combination of the respective bytes of each of the N data drives 20 and using the corresponding linear combination formula for the particular check drive 30.

The stripe 10 in FIG. 1 can also be represented as a matrix C of encoded data. C has two sub-matrices, namely original data D on top and check data J on bottom. That is, $$C = \begin{bmatrix} D \\ J \end{bmatrix} = \begin{bmatrix} D_{11} & D_{12} & \ldots & D_{1L} \\ D_{21} & D_{22} & \ldots & D_{2L} \\ \vdots & \vdots & \ddots & \vdots \\ D_{N1} & D_{N2} & \ldots & D_{NL} \\ J_{11} & J_{12} & \ldots & J_{1L} \\ J_{21} & J_{22} & \ldots & J_{2L} \\ \vdots & \vdots & \ddots & \vdots \\ J_{M1} & J_{M2} & \ldots & J_{ML} \end{bmatrix},$$

where $D_{ij}$=byte j from data drive i and $J_{ij}$=byte j from check drive i. Thus, the rows of encoded data C represent blocks, while the columns represent corresponding bytes of each of the drives.

Further, in case of a disk drive failure of one or more disks, the arithmetic operations are designed in such a fashion that for any stripe, the original data (and by extension, the check data) can be reconstructed from any combination of N data and check blocks from the corresponding N+M data and check blocks that comprise the stripe. Thus, RAID provides both parallel processing (reading and writing the data in stripes across multiple drives concurrently) and fault tolerance (regeneration of the original data even if as many as M of the drives fail), at the computational cost of generating the check data any time new data is written to disk, or changed data is written back to disk, as well as the computational cost of reconstructing any lost original data and regenerating any lost check data after a disk failure.

For example, for M=1 check drive, a single parity drive can function as the check drive (i.e., a RAID4 system). Here, the arithmetic operation is bitwise exclusive OR of each of the N corresponding data bytes in each data block of the stripe. In addition, as mentioned earlier, the assignment of parity blocks from different stripes to the same drive (i.e., RAID4) or different drives (i.e., RAID5) is arbitrary, but it does simplify the description and implementation to use a consistent assignment between stripes, so that will be assumed throughout. Since M=1 reduces to the case of a single parity drive, it will further be assumed for simplicity that M≥2 throughout.

For such larger values of M, Galois field arithmetic is used to manipulate the data, as described in more detail later. Galois field arithmetic, for Galois fields of powers-of-2 (such as $2^P$) numbers of elements, includes two fundamental operations: (1) addition (which is just bitwise exclusive OR, as with the parity drive-only operations for M=1), and (2) multiplication. While Galois field (GF) addition is trivial on standard processors, GF multiplication is not. Accordingly, a significant component of RAID performance for M≥2 is speeding up the performance of GF multiplication, as will be discussed later. For purposes of description, GF addition will be represented by the symbol + throughout while GF multiplication will be represented by the symbol × throughout.

Briefly, in exemplary embodiments of the present invention, each of the M check drives holds linear combinations (over GF arithmetic) of the N data drives of original data, one linear combination (i.e., a GF sum of N terms, where each term represents a byte of original data times a corresponding factor (using GF multiplication) for the respective data drive) for each check drive, as applied to respective bytes in each block. One such linear combination can be a simple parity, i.e., entirely GF addition (all factors equal 1), such as a GF sum of the first byte in each block of original data as described above.

The remaining M−1 linear combinations include more involved calculations that include the nontrivial GF multiplication operations (e.g., performing a GF multiplication of the first byte in each block by a corresponding factor for the respective data drive, and then performing a GF sum of all these products). These linear combinations can be represented by an (N+M)×N matrix (encoding matrix or information dispersal matrix (IDM)) E of the different factors, one factor for each combination of (data or check) drive and data drive, with one row for each of the N+M data and check drives and one column for each of the N data drives. The IDM E can also be represented as $$\begin{bmatrix} I_N \\ H \end{bmatrix},$$

where $I_N$ represents the N×N identity matrix (i.e., the original (unencoded) data) and H represents the M×N matrix of factors for the check drives (where each of the M rows corresponds to one of the M check drives and each of the N columns corresponds to one of the N data drives).

Thus, $$E = \begin{bmatrix} I_N \\ H \end{bmatrix} = \begin{bmatrix} 1 & 0 & \ldots & 0 \\ 0 & 1 & \ldots & 0 \\ \vdots & \vdots & \ddots & \vdots \\ 0 & 0 & \ldots & 1 \\ H_{11} & H_{12} & \ldots & H_{1N} \\ H_{21} & H_{22} & \ldots & H_{2N} \\ \vdots & \vdots & \ddots & \vdots \\ H_{M1} & H_{M2} & \ldots & H_{MN} \end{bmatrix},$$

where $H_{ij}$=factor for check drive i and data drive j. Thus, the rows of encoded data C represent blocks, while the columns represent corresponding bytes of each of the drives. In addition, check factors H, original data D, and check data J are related by the formula J=H×D (that is, matrix multiplication), or $$\begin{bmatrix} J_{11} & J_{12} & \ldots & J_{1L} \\ J_{21} & J_{22} & \ldots & J_{2L} \\ \vdots & \vdots & \ddots & \vdots \\ J_{M1} & J_{M2} & \ldots & J_{ML} \end{bmatrix} =$$

$$\begin{bmatrix} H_{11} & H_{12} & \ldots & H_{1N} \\ H_{21} & H_{22} & \ldots & H_{2N} \\ \vdots & \vdots & \ddots & \vdots \\ H_{M1} & H_{M2} & \ldots & H_{MN} \end{bmatrix} \times \begin{bmatrix} D_{11} & D_{12} & \ldots & D_{1L} \\ D_{21} & D_{22} & \ldots & D_{2L} \\ \vdots & \vdots & \ddots & \vdots \\ D_{N1} & D_{N2} & \ldots & D_{NL} \end{bmatrix},$$

where $J_{11}=(H_{11}\times D_{11})+(H_{12}\times D_{21})+ \ldots +(H_{1N}\times D_{N1})$, $J_{12}=(H_{11}\times D_{12})+(H_{12}\times D_{22})+ \ldots +(H_{1N}\times D_{N2})$, $J_{21}=(H_{21}\times D_{11})+(H_{22}\times D_{21})+ \ldots +(H_{2N}\times D_{N1})$, and in general, $J_{ij}=(H_{i1}\times D_{1j})+(H_{i2}\times D_{2j})+ \ldots +(H_{iN}\times D_{Nj})$ for $1\leq i\leq M$ and $1\leq j\leq L$.

Such an encoding matrix E is also referred to as an information dispersal matrix (IDM). It should be noted that matrices such as check drive encoding matrix H and identity matrix $I_N$ also represent encoding matrices, in that they represent matrices of factors to produce linear combinations over GF arithmetic of the original data. In practice, the identity matrix $I_N$ is trivial and may not need to be constructed as part of the IDM E. Only the encoding matrix E, however, will be referred to as the IDM. Methods of building an encoding matrix such as IDM E or check drive encoding matrix H are discussed below. In further embodiments of the present invention (as discussed further in Appendix A), such (N+M)×N (or M×N) matrices can be trivially constructed (or simply indexed) from a master encoding matrix S, which is composed of $(N_{max}+M_{max})\times N_{max}$ (or $M_{max}\times N_{max}$) bytes or elements, where $N_{max}+M_{max}=256$ (or some other power of two) and $N\leq N_{max}$ and $M\leq M_{max}$. For example, one such master encoding matrix S can include a 127×127 element identity matrix on top (for up to $N_{max}=127$ data drives), a row of 1's (for a parity drive), and a 128×127 element encoding matrix on bottom (for up to $M_{max}=129$ check drives, including the parity drive, for a total of $N_{max}+M_{max}=256$ drives.

The original data, in turn, can be represented by an N×L matrix D of bytes, each of the N rows representing the L bytes of a block of the corresponding one of the N data drives. If C represents the corresponding (N+M)×L matrix of encoded bytes (where each of the N+M rows corresponds to one of the N+M data and check drives), then C can be represented as E×D=

$$\begin{bmatrix} I_N \\ H \end{bmatrix} \times D = \begin{bmatrix} I_N \times D \\ H \times D \end{bmatrix} = \begin{bmatrix} D \\ J \end{bmatrix},$$

where J=H×D is an M×L matrix of check data, with each of the M rows representing the L check bytes of the corresponding one of the M check drives. It should be noted that in the relationships such as C=E×D or J=H×D, × represents matrix multiplication over the Galois field (i.e., GF multiplication and GF addition being used to generate each of the entries in, for example, C or J).

In exemplary embodiments of the present invention, the first row of the check drive encoding matrix H (or the $(N+1)^{th}$ row of the IDM E) can be all 1's, representing the parity drive. For linear combinations involving this row, the GF multiplication can be bypassed and replaced with a GF sum of the corresponding bytes since the products are all trivial products involving the identity element 1. Accordingly, in parity drive implementations, the check drive encoding matrix H can also be thought of as an (M−1)×N matrix of non-trivial factors (that is, factors intended to be used in GF multiplication and not just GF addition).

Much of the RAID processing involves generating the check data when new or changed data is written to (or back to) disk. The other significant event for RAID processing is when one or more of the drives fail (data or check drives), or for whatever reason become unavailable. Assume that in such a failure scenario, F data drives fail and G check drives fail, where F and G are nonnegative integers. If F=0, then only check drives failed and all of the original data D survived. In this case, the lost check data can be regenerated from the original data D.

Accordingly, assume at least one data drive fails, that is, F≥1, and let K=N−F represent the number of data drives that survive. K is also a nonnegative integer. In addition, let X represent the surviving original data and Y represent the lost original data. That is, X is a K×L matrix composed of the K rows of the original data matrix D corresponding to the K surviving data drives, while Y is an F×L matrix composed of the F rows of the original data matrix D corresponding to the F failed data drives.

$$\begin{bmatrix} X \\ Y \end{bmatrix}$$

thus represents a permuted original data matrix D' (that is, the original data matrix D, only with the surviving original data X on top and the lost original data Y on bottom. It should be noted that once the lost original data Y is reconstructed, it can be combined with the surviving original data X to restore the original data D, from which the check data for any of the failed check drives can be regenerated.

It should also be noted that M−G check drives survive. In order to reconstruct the lost original data Y, enough (that is, at least N) total drives must survive. Given that K=N−F data drives survive, and that M−G check drives survive, it follows that (N−F)+(M−G)≥N must be true to reconstruct the lost original data Y. This is equivalent to F+G≤M (i.e., no more than F+G drives fail), or F≤M−G (that is, the number of failed data drives does not exceed the number of surviving check drives). It will therefore be assumed for simplicity that F≤M−G.

In the routines that follow, performance can be enhanced by prebuilding lists of the failed and surviving data and check drives (that is, four separate lists). This allows processing of the different sets of surviving and failed drives to be done more efficiently than existing solutions, which use, for example, bit vectors that have to be examined one bit at a time and often include large numbers of consecutive zeros (or ones) when ones (or zeros) are the bit values of interest.

Figure 2:
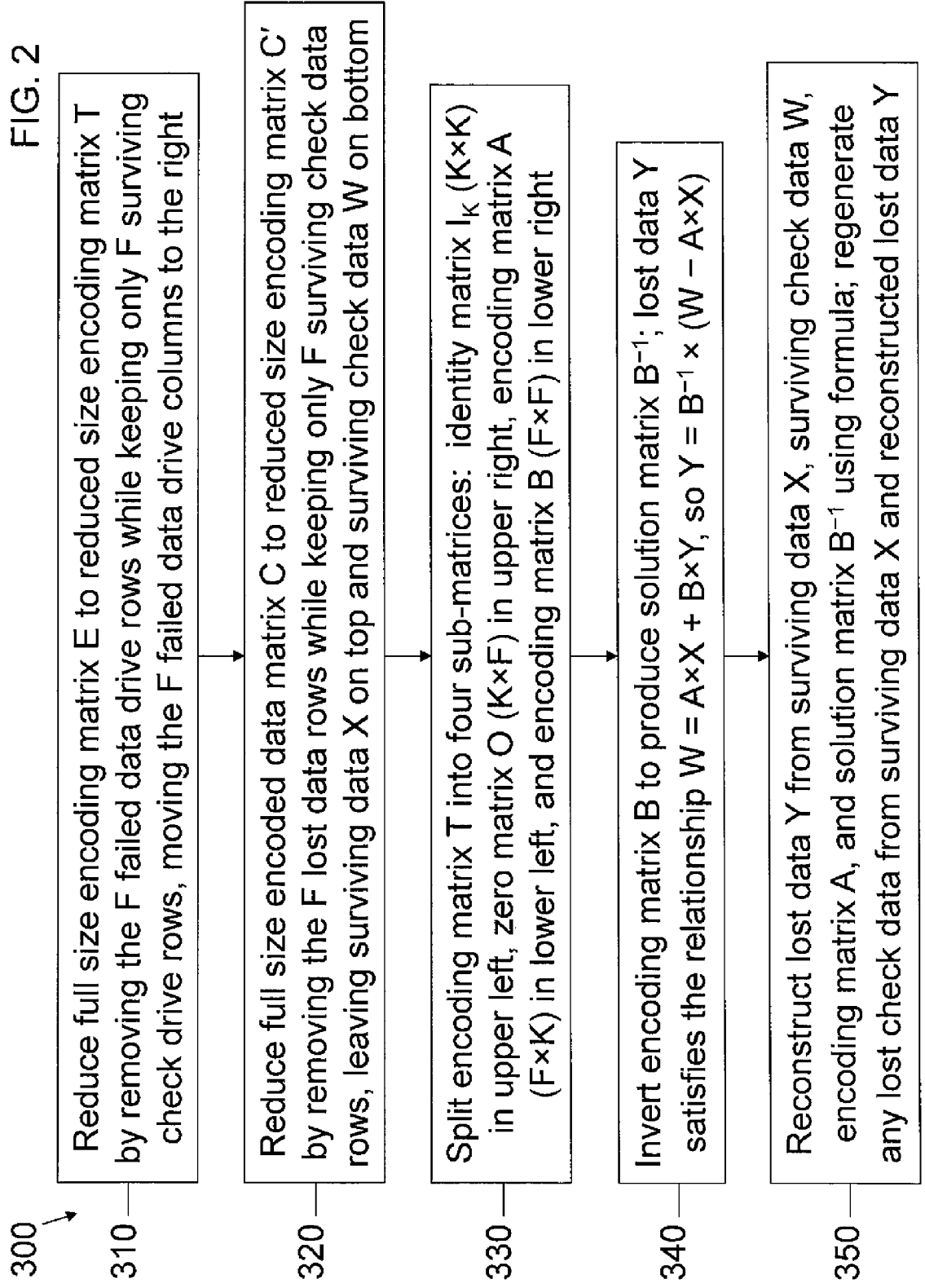

FIG. 2 shows an exemplary method 300 for reconstructing lost data after a failure of one or more drives according to an embodiment of the present invention.

While the recovery process is described in more detail later, briefly it consists of two parts: (1) determining the solution matrix, and (2) reconstructing the lost data from the surviving data. Determining the solution matrix can be done in three steps with the following algorithm (Algorithm 1), with reference to FIG. 2:

1. (Step 310 in FIG. 2) Reducing the (M+N)×N IDM E to an N×N reduced encoding matrix T (also referred to as the transformed IDM) including the K surviving data drive rows and any F of the M−G surviving check drive rows (for instance, the first F surviving check drive rows, as these will include the parity drive if it survived; recall that F≤M−G was assumed). In addition, the columns of the reduced encoding matrix T are rearranged so that the K columns corresponding to the K surviving data drives are on the left side of the matrix and the F columns corresponding to the F failed drives are on the right side of the matrix. (Step 320) These F surviving check drives selected to rebuild the lost original data Y will henceforth be referred to as "the F surviving check drives," and their check data W will be referred to as "the surviving check data," even though M−G check drives survived. It should be noted that W is an F×L matrix composed of the F rows of the check data J corresponding to the F surviving check drives. Further, the surviving encoded data can be represented as a sub-matrix C' of the encoded data C. The surviving encoded data C' is an N×L matrix composed of the surviving original data X on top and the surviving check data W on bottom, that is, $$C' = \begin{bmatrix} X \\ W \end{bmatrix}.$$

2. (Step 330) Splitting the reduced encoding matrix T into four sub-matrices (that are also encoding matrices): (i) a K×K identity matrix $I_K$ (corresponding to the K surviving data drives) in the upper left, (ii) a K×F matrix O of zeros in the upper right, (iii) an F×K encoding matrix A in the lower left corresponding to the F surviving check drive rows and the K surviving data drive columns, and (iv) an F×F encoding matrix B in the lower right corresponding to the F surviving check drive rows and the F failed data drive columns. Thus, the reduced encoding matrix T can be represented as $$\begin{bmatrix} I_K & O \\ A & B \end{bmatrix}.$$

3. (Step 340) Calculating the inverse $B^{-1}$ of the F×F encoding matrix B. As is shown in more detail in Appendix A, C'=T×D', or $$\begin{bmatrix} X \\ W \end{bmatrix} = \begin{bmatrix} I_K & O \\ A & B \end{bmatrix} \times \begin{bmatrix} X \\ Y \end{bmatrix},$$

which is mathematically equivalent to W=A×X+B×Y. $B^{-1}$ is the solution matrix, and is itself an F×F encoding matrix. Calculating the solution matrix $B^{-1}$ thus allows the lost original data Y to be reconstructed from the encoding matrices A and B along with the surviving original data X and the surviving check data W.

The F×K encoding matrix A represents the original encoding matrix E, only limited to the K surviving data drives and the F surviving check drives. That is, each of the F rows of A represents a different one of the F surviving cheek drives, while each of the K columns of A represents a different one of the K surviving data drives. Thus, A provides the encoding factors needed to encode the original data for the surviving check drives, but only applied to the surviving data drives (that is, the surviving partial check data). Since the surviving original data X is available, A can be used to generate this surviving partial check data.

In similar fashion, the F×F encoding matrix B represents the original encoding matrix E, only limited to the F surviving check drives and the F failed data drives. That is, the F rows of B correspond to the same F rows of A, while each of the F columns of B represents a different one of the F failed data drives. Thus, B provides the encoding factors needed to encode the original data for the surviving check drives, but only applied to the failed data drives (that is, the lost partial check data). Since the lost original data Y is not available, B cannot be used to generate any of the lost partial check data. However, this lost partial check data can be determined from A and the surviving check data W. Since this lost partial check data represents the result of applying B to the lost original data Y, $B^{-1}$ thus represents the necessary factors to reconstruct the lost original data Y from the lost partial check data.

It should be noted that steps 1 and 2 in Algorithm 1 above are logical, in that encoding matrices A and B (or the reduced encoding matrix T, for that matter) do not have to actually be constructed. Appropriate indexing of the IDM E (or the master encoding matrix S) can be used to obtain any of their entries. Step 3, however, is a matrix inversion over GF arithmetic and takes $O(F^3)$ operations, as discussed in more detail later. Nonetheless, this is a significant improvement over existing solutions, which require $O(N^3)$ operations, since the number of failed data drives F is usually significantly less than the number of data drives N in any practical situation.

(Step 350 in FIG. 2) Once the encoding matrix A and the solution matrix $B^{-1}$ are known, reconstructing the lost data from the surviving data (that is, the surviving original data X and the surviving check data W) can be accomplished in four steps using the following algorithm (Algorithm 2):

1. Use A and the surviving original data X (using matrix multiplication) to generate the surviving check data (i.e., A×X), only limited to the K surviving data drives. Call this limited check data the surviving partial check data.
2. Subtract this surviving partial check data from the surviving check data W (using matrix subtraction, i.e., W−A×X, which is just entry-by-entry GF subtraction, which is the same as GF addition for this Galois field). This generates the surviving check data, only this time limited to the F failed data drives. Call this limited check data the lost partial check data.
3. Use the solution matrix $B^{-1}$ and the lost partial check data (using matrix multiplication, i.e., $B^{-1}$×(W−A×X) to reconstruct the lost original data Y. Call this the recovered original data Y.
4. Use the corresponding rows of the IDM E (or master encoding matrix S) for each of the G failed check drives along with the original data D, as reconstructed from the surviving and recovered original data X and Y, to regenerate the lost check data (using matrix multiplication).

As will be shown in more detail later, steps 1-3 together require O(F) operations times the amount of original data D to reconstruct the lost original data Y for the F failed data drives (i.e., roughly 1 operation per failed data drive per byte of original data D), which is proportionally equivalent to the O(M) operations times the amount of original data D needed to generate the check data J for the M check drives (i.e., roughly 1 operation per check drive per byte of original data D). In addition, this same equivalence extends to step 4, which takes O(G) operations times the amount of original data D needed to regenerate the lost check data for the G failed check drives (i.e., roughly 1 operation per failed check drive per byte of original data D). In summary, the number of operations needed to reconstruct the lost data is O(F+G) times the amount of original data D (i.e., roughly 1 operation per failed drive (data or check) per byte of original data D). Since F+G≤M, this means that the computational complexity of Algorithm 2 (reconstructing the lost data from the surviving data) is no more than that of generating the check data J from the original data D.

As mentioned above, for exemplary purposes and ease of description, data is assumed to be organized in 8-bit bytes, each byte capable of taking on $2^8$=256 possible values. Such data can be manipulated in byte-size elements using GF arithmetic for a Galois field of size $2^8$=256 elements. It should also be noted that the same mathematical principles apply to any power-of-two $2^P$ number of elements, not just 256, as Galois fields can be constructed for any integral power of a prime number. Since Galois fields are finite, and since GF operations never overflow, all results are the same size as the inputs, for example, 8 bits.

In a Galois field of a power-of-two number of elements, addition and subtraction are the same operation, namely a bitwise exclusive OR (XOR) of the two operands. This is a very fast operation to perform on any current processor. It can also be performed on multiple bytes concurrently. Since the addition and subtraction operations take place, for example, on a byte-level basis, they can be done in parallel by using, for instance, x86 architecture Streaming SIMD Extensions (SSE) instructions (SIMD stands for single instruction, multiple data, and refers to performing the same instruction on different pieces of data, possibly concurrently), such as PXOR (Packed (bitwise) Exclusive OR).

SSE instructions can process, for example, 16-byte registers (XMM registers), and are able to process such registers as though they contain 16 separate one-byte operands (or 8 separate two-byte operands, or four separate four-byte operands, etc.) Accordingly, SSE instructions can do byte-level processing 16 times faster than when compared to processing a byte at a time. Further, there are 16 XMM registers, so dedicating four such registers for operand storage allows the data to be processed in 64-byte increments, using the other 12 registers for temporary storage. That is, individual operations can be performed as four consecutive SSE operations on the four respective registers (64 bytes), which can often allow such instructions to be efficiently pipelined and/or concurrently executed by the processor. In addition, the SSE instructions allows the same processing to be performed on different such 64-byte increments of data in parallel using different cores. Thus, using four separate cores can potentially speed up this processing by an additional factor of 4 over using a single core.

For example, a parallel adder (Parallel Adder) can be built using the 16-byte XMM registers and four consecutive PXOR instructions. Such parallel processing (that is, 64 bytes at a time with only a few machine-level instructions) for GF arithmetic is a significant improvement over doing the addition one byte at a time. Since the data is organized in blocks of any fixed number of bytes, such as 4096 bytes (4 kilobytes, or 4 KB) or 32,768 bytes (32 KB), a block can be composed of numerous such 64-byte chunks (e.g., 64 separate 64-byte chunks in 4 KB, or 512 chunks in 32 KB).

Multiplication in a Galois field is not as straightforward. While much of it is bitwise shifts and exclusive OR's (i.e., "additions") that are very fast operations, the numbers "wrap" in peculiar ways when they are shifted outside of their normal bounds (because the field has only a finite set of elements), which can slow down the calculations. This "wrapping" in the GF multiplication can be addressed in many ways. For example, the multiplication can be implemented serially (Serial Multiplier) as a loop iterating over the bits of one operand while performing the shifts, adds, and wraps on the other operand. Such processing, however, takes several machine instructions per bit for 8 separate bits. In other words, this technique requires dozens of machine instructions per byte being multiplied. This is inefficient compared to, for example, the performance of the Parallel Adder described above.

For another approach (Serial Lookup Multiplier), multiplication tables (of all the possible products, or at least all the non-trivial products) can be pre-computed and built ahead of time. For example, a table of 256×256=65,536 bytes can hold all the possible products of the two different one-byte operands). However, such tables can force serialized access on what are only byte-level operations, and not take advantage of wide (concurrent) data paths available on modern processors, such as those used to implement the Parallel Adder above.

In still another approach (Parallel Multiplier), the GF multiplication can be done on multiple bytes at a time, since the same factor in the encoding matrix is multiplied with every element in a data block. Thus, the same factor can be multiplied with 64 consecutive data block bytes at a time. This is similar to the Parallel Adder described above, only there are several more operations needed to perform the operation. While this can be implemented as a loop on each bit of the factor, as described above, only performing the shifts, adds, and wraps on 64 bytes at a time, it can be more efficient to process the 256 possible factors as a (C language) switch statement, with inline code for each of 256 different combinations of two primitive GF operations: Multiply-by-2 and Add. For example, GF multiplication by the factor 3 can be effected by first doing a Multiply-by-2 followed by an Add. Likewise, GF multiplication by 4 is just a Multiply-by-2 followed by a Multiply-by-2 while multiplication by 6 is a Multiply-by-2 followed by an Add and then by another Multiply-by-2.

While this Add is identical to the Parallel Adder described above (e.g., four consecutive PXOR instructions to process 64 separate bytes), Multiply-by-2 is not as straightforward. For example, Multiply-by-2 in GF arithmetic can be implemented across 64 bytes at a time in 4 XMM registers via 4 consecutive PXOR instructions, 4 consecutive PCMPGTB (Packed Compare for Greater Than) instructions, 4 consecutive PADDB (Packed Add) instructions, 4 consecutive PAND (Bitwise AND) instructions, and 4 consecutive PXOR instructions. Though this takes 20 machine instructions, the instructions are very fast and results in 64 consecutive bytes of data at a time being multiplied by 2.

For 64 bytes of data, assuming a random factor between 0 and 255, the total overhead for the Parallel Multiplier is about 6 calls to multiply-by-2 and about 3.5 calls to add, or about 6×20+3.5×4=134 machine instructions, or a little over 2 machine instructions per byte of data. While this compares favorably with byte-level processing, it is still possible to improve on this by building a parallel multiplier with a table lookup (Parallel Lookup Multiplier) using the PSHUFB (Packed Shuffle Bytes) instruction and doing the GF multiplication in 4-bit nibbles (half bytes).

Figure 3:
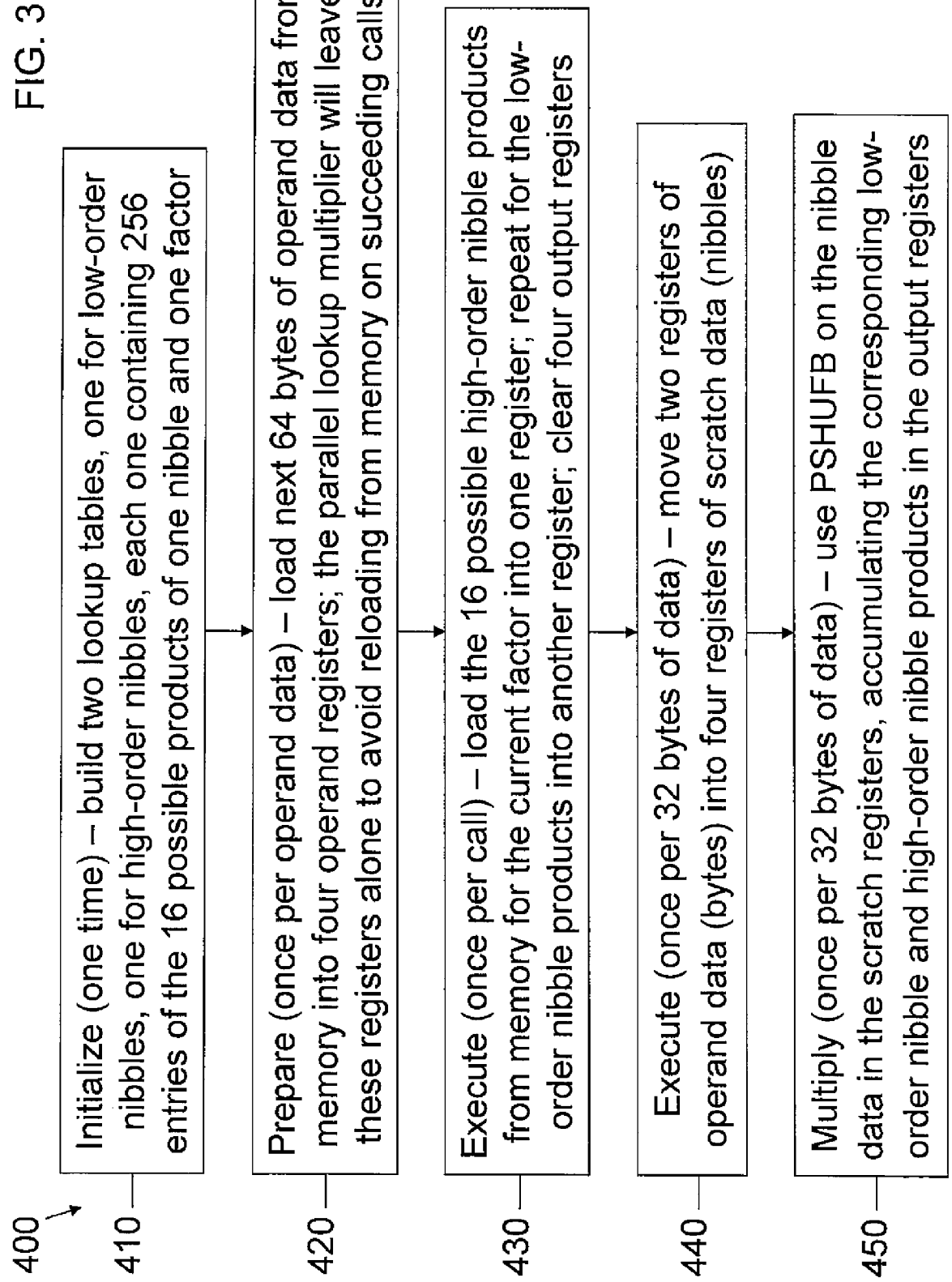

FIG. 3 shows an exemplary method 400 for performing a parallel lookup Galois field multiplication according to an embodiment of the present invention.

Referring to FIG. 3, in step 410, two lookup tables are built once: one lookup table for the low-order nibbles in each byte, and one lookup table for the high-order nibbles in each byte. Each lookup table contains 256 sets (one for each possible factor) of the 16 possible GF products of that factor and the 16 possible nibble values. Each lookup table is thus 256×16=4096 bytes, which is considerably smaller than the 65,536 bytes needed to store a complete one-byte multiplication table. In addition, PSHUFB does 16 separate table lookups at once, each for one nibble, so 8 PSHUFB instructions can be used to do all the table lookups for 64 bytes (128 nibbles).

Next, in step 420, the Parallel Lookup Multiplier is initialized for the next set of 64 bytes of operand data (such as original data or surviving original data). In order to save loading this data from memory on succeeding calls, the Parallel Lookup Multiplier dedicates four registers for this data, which are left intact upon exit of the Parallel Lookup Multiplier. This allows the same data to be called with different factors (such as processing the same data for another check drive).

Next in step 430, to process these 64 bytes of operand data, the Parallel Lookup Multiplier can be implemented with 2 MOVDQA (Move Double Quadword Aligned) instructions (from memory) to do the two table lookups and 4 MOVDQA instructions (register to register) to initialize registers (such as the output registers). These are followed in steps 440 and 450 by two nearly identical sets of 17 register-to-register instructions to carry out the multiplication 32 bytes at a time. Each such set starts (in step 440) with 5 more MOVDQA instructions for further initialization, followed by 2 PSRLW (Packed Shift Right Logical Word) instructions to realign the high-order nibbles for PSHUFB, and 4 PAND instructions to clear the high-order nibbles for PSHUFB. That is, two registers of byte operands are converted into four registers of nibble operands. Then, in step 450, 4 PSHUFB instructions are used to do the parallel table lookups, and 2 PXOR instructions to add the results of the multiplication on the two nibbles to the output registers.

Thus, the Parallel Lookup Multiplier uses 40 machine instructions to perform the parallel multiplication on 64 separate bytes, which is considerably better than the average 134 instructions for the Parallel Multiplier above, and only 10 times as many instructions as needed for the Parallel Adder. While some of the Parallel Lookup Multiplier's instructions are more complex than those of the Parallel Adder, much of this complexity can be concealed through the pipelined and/or concurrent execution of numerous such contiguous instructions (accessing different registers) on modern pipelined processors. For example, in exemplary implementations, the Parallel Lookup Multiplier has been timed at about 15 CPU clock cycles per 64 bytes processed per CPU core (about 0.36 clock cycles per instruction). In addition, the code footprint is practically nonexistent for the Parallel Lookup Multiplier (40 instructions) compared to that of the Parallel Multiplier (about 34,300 instructions), even when factoring the 8 KB needed for the two lookup tables in the Parallel Lookup Multiplier.

In addition, embodiments of the Parallel Lookup Multiplier can be passed 64 bytes of operand data (such as the next 64 bytes of surviving original data X to be processed) in four consecutive registers, whose contents can be preserved upon exiting the Parallel Lookup Multiplier (and all in the same 40 machine instructions) such that the Parallel Lookup Multiplier can be invoked again on the same 64 bytes of data without having to access main memory to reload the data. Through such a protocol, memory accesses can be minimized (or significantly reduced) for accessing the original data D during check data generation or the surviving original data X during lost data reconstruction.

Further embodiments of the present invention are directed towards sequencing this parallel multiplication (and other GF) operations. While the Parallel Lookup Multiplier processes a GF multiplication of 64 bytes of contiguous data times a specified factor, the calls to the Parallel Lookup Multiplier should be appropriately sequenced to provide efficient processing. One such sequencer (Sequencer 1), for example, can generate the check data J from the original data D, and is described further with respect to FIG. 4.

The parity drive does not need GF multiplication. The check data for the parity drive can be obtained, for example, by adding corresponding 64-byte chunks for each of the data drives to perform the parity operation. The Parallel Adder can do this using 4 instructions for every 64 bytes of data for each of the N data drives, or N/16 instructions per byte.

The M−1 non-parity check drives can invoke the Parallel Lookup Multiplier on each 64-byte chunk, using the appropriate factor for the particular combination of data drive and check drive. One consideration is how to handle the data access. Two possible ways are:
  1) "column-by-column," i.e., 64 bytes for one data drive, followed by the next 64 bytes for that data drive, etc., and adding the products to the running total in memory (using the Parallel Adder) before moving onto the next row (data drive); and
  2) "row-by-row," i.e., 64 bytes for one data drive, followed by the corresponding 64 bytes for the next data drive, etc., and keeping a running total using the Parallel Adder, then moving onto the next set of 64-byte chunks.

Column-by-column can be thought of as "constant factor, varying data," in that the (GF multiplication) factor usually remains the same between iterations while the (64-byte) data changes with each iteration. Conversely, row-by-row can be thought of as "constant data, varying factor," in that the data usually remains the same between iterations while the factor changes with each iteration.

Another consideration is how to handle the check drives. Two possible ways are:
  a) one at a time, i.e., generate all the check data for one check drive before moving onto the next check drive; and
  b) all at once, i.e., for each 64-byte chunk of original data, do all of the processing for each of the check drives before moving onto the next chunk of original data.

While each of these techniques performs the same basic operations (e.g., 40 instructions for every 64 bytes of data for each of the N data drives and M−1 non-parity check drives, or 5N(M−1)/8 instructions per byte for the Parallel Lookup Multiplier), empirical results show that combination (2)(b), that is, row-by-row data access on all of the check drives between data accesses performs best with the Parallel Lookup Multiplier. One reason may be that such an approach appears to minimize the number of memory accesses (namely, one) to each chunk of the original data D to generate the check data J. This embodiment of Sequencer 1 is described in more detail with reference to FIG. 4.

Figure 4:
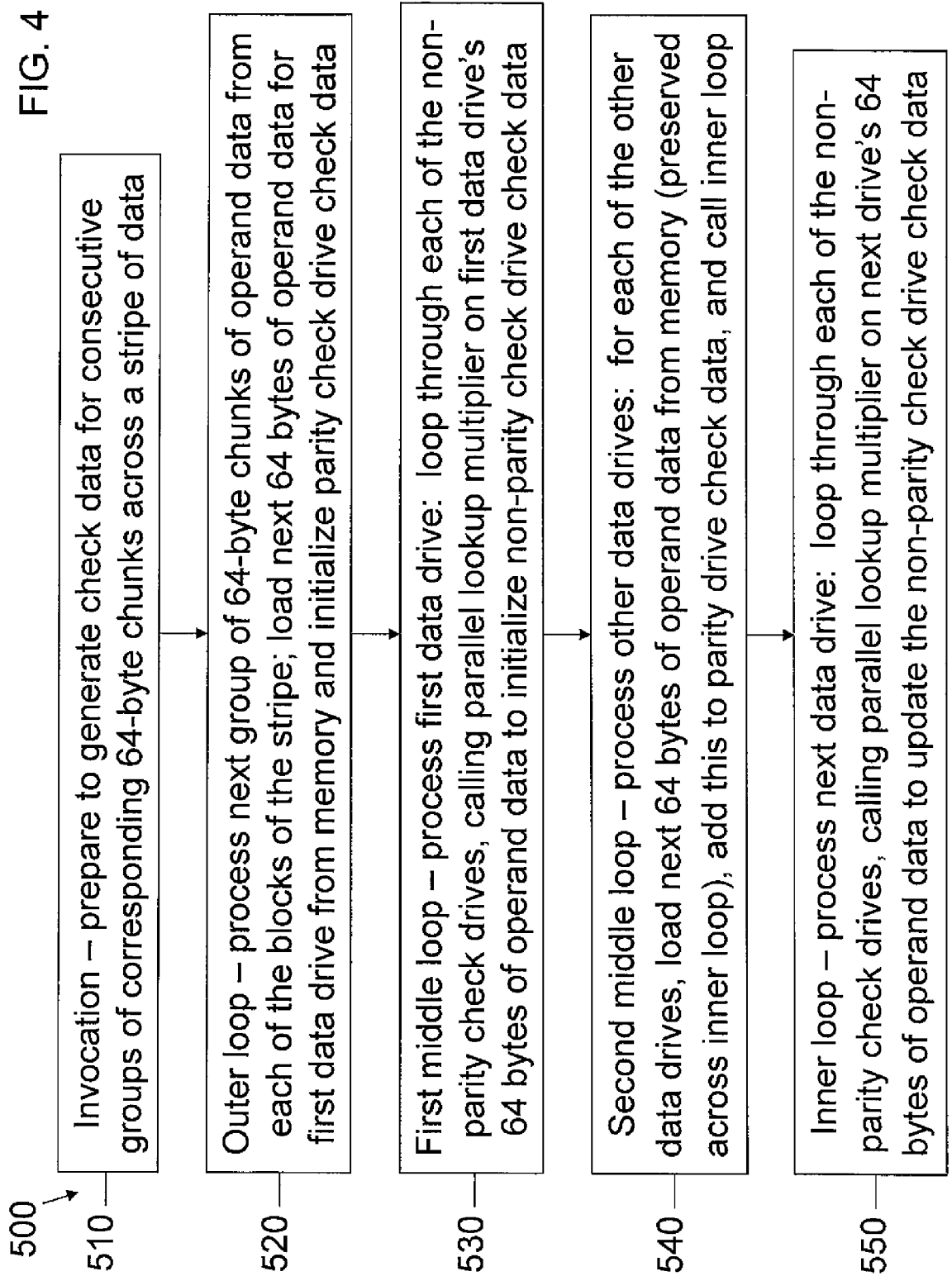

FIG. 4 shows an exemplary method 500 for sequencing the Parallel Lookup Multiplier to perform the check data generation according to an embodiment of the present invention.

Referring to FIG. 4, in step 510, the Sequencer 1 is called. Sequencer 1 is called to process multiple 64-byte chunks of data for each of the blocks across a stripe of data. For instance, Sequencer 1 could be called to process 512 bytes from each block. If, for example, the block size L is 4096 bytes, then it would take eight such calls to Sequencer 1 to process the entire stripe. The other such seven calls to Sequencer 1 could be to different processing cores, for instance, to carry out the check data generation in parallel. The number of 64-byte chunks to process at a time could depend on factors such as cache dimensions, input/output data structure sizes, etc.

In step 520, the outer loop processes the next 64-byte chunk of data for each of the drives. In order to minimize the number of accesses of each data drive's 64-byte chunk of data from memory, the data is loaded only once and preserved across calls to the Parallel Lookup Multiplier. The first data drive is handled specially since the check data has to be initialized for each check drive. Using the first data drive to initialize the check data saves doing the initialization as a separate step followed by updating it with the first data drive's data. In addition to the first data drive, the first check drive is also handled specially since it is a parity drive, so its check data can be initialized to the first data drive's data directly without needing the Parallel Lookup Multiplier.

In step 530, the first middle loop is called, in which the remainder of the check drives (that is, the non-parity check drives) have their check data initialized by the first data drive's data. In this case, there is a corresponding factor (that varies with each check drive) that needs to be multiplied with each of the first data drive's data bytes. This is handled by calling the Parallel Lookup Multiplier for each non-parity check drive.

In step 540, the second middle loop is called, which processes the other data drives' corresponding 64-byte chunks of data. As with the first data drive, each of the other data drives is processed separately, loading the respective 64 bytes of data into four registers (preserved across calls to the Parallel Lookup Multiplier). In addition, since the first check drive is the parity drive, its check data can be updated by directly adding these 64 bytes to it (using the Parallel Adder) before handling the non-parity check drives.

In step 550, the inner loop is called for the next data drive. In the inner loop (as with the first middle loop), each of the non-parity check drives is associated with a corresponding factor for the particular data drive. The factor is multiplied with each of the next data drive's data bytes using the Parallel Lookup Multiplier, and the results added to the check drive's check data.

Another such sequencer (Sequencer 2) can be used to reconstruct the lost data from the surviving data (using Algorithm 2). While the same column-by-column and row-by-row data access approaches are possible, as well as the same choices for handling the check drives, Algorithm 2 adds another dimension of complexity because of the four separate steps and whether to: (i) do the steps completely serially or (ii) do some of the steps concurrently on the same data. For example, step 1 (surviving check data generation) and step 4 (lost check data regeneration) can be done concurrently on the same data to reduce or minimize the number of surviving original data accesses from memory.

Empirical results show that method (2)(b)(ii), that is, row-by-row data access on all of the check drives and for both surviving check data generation and lost check data regeneration between data accesses performs best with the Parallel Lookup Multiplier when reconstructing lost data using Algorithm 2. Again, this may be due to the apparent minimization of the number of memory accesses (namely, one) of each chunk of surviving original data X to reconstruct the lost data and the absence of memory accesses of reconstructed lost original data Y when regenerating the lost check data. This embodiment of Sequencer 1 is described in more detail with reference to FIGS. 5-7.

Figure 5:
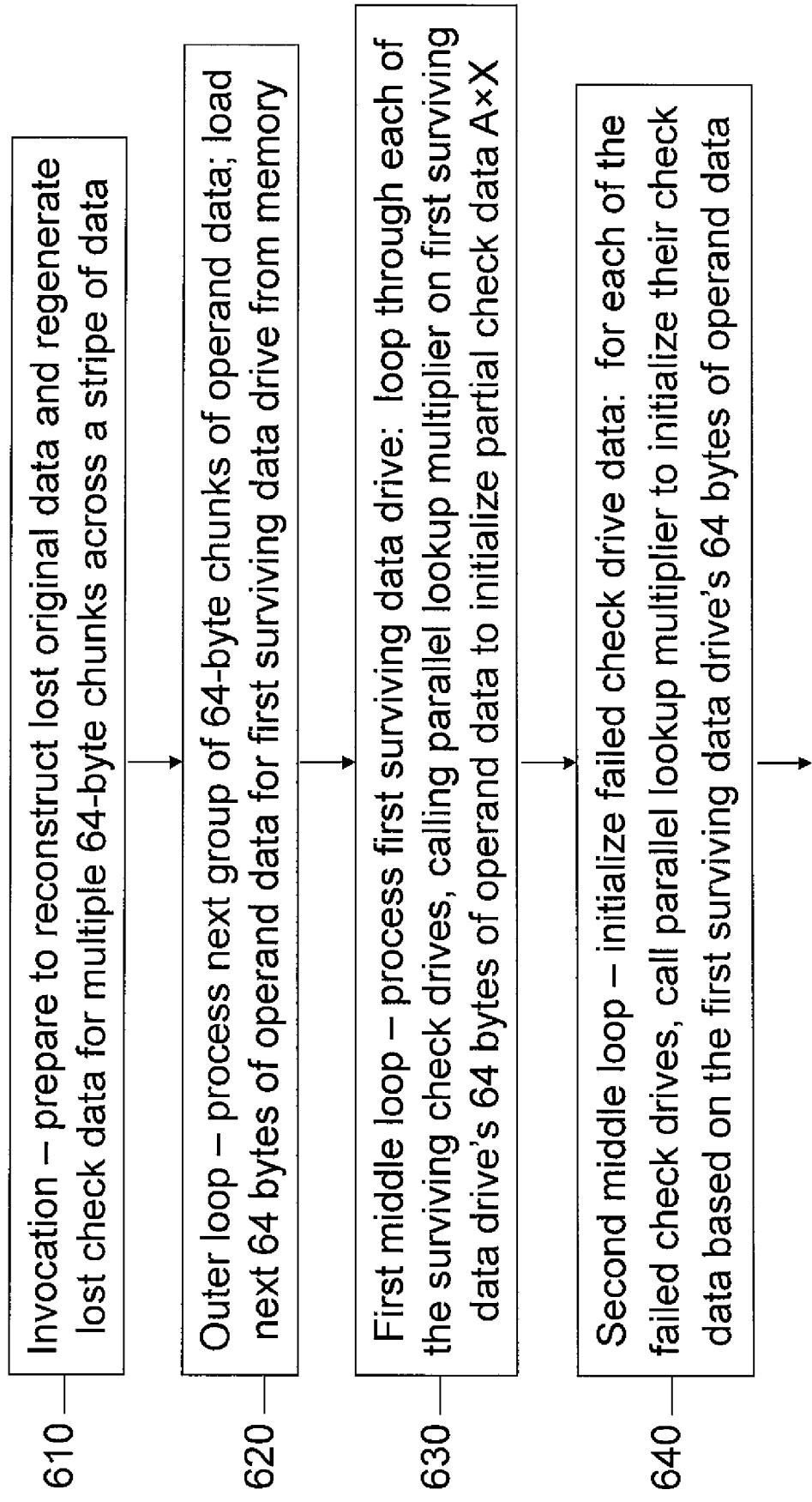
Figure 6:
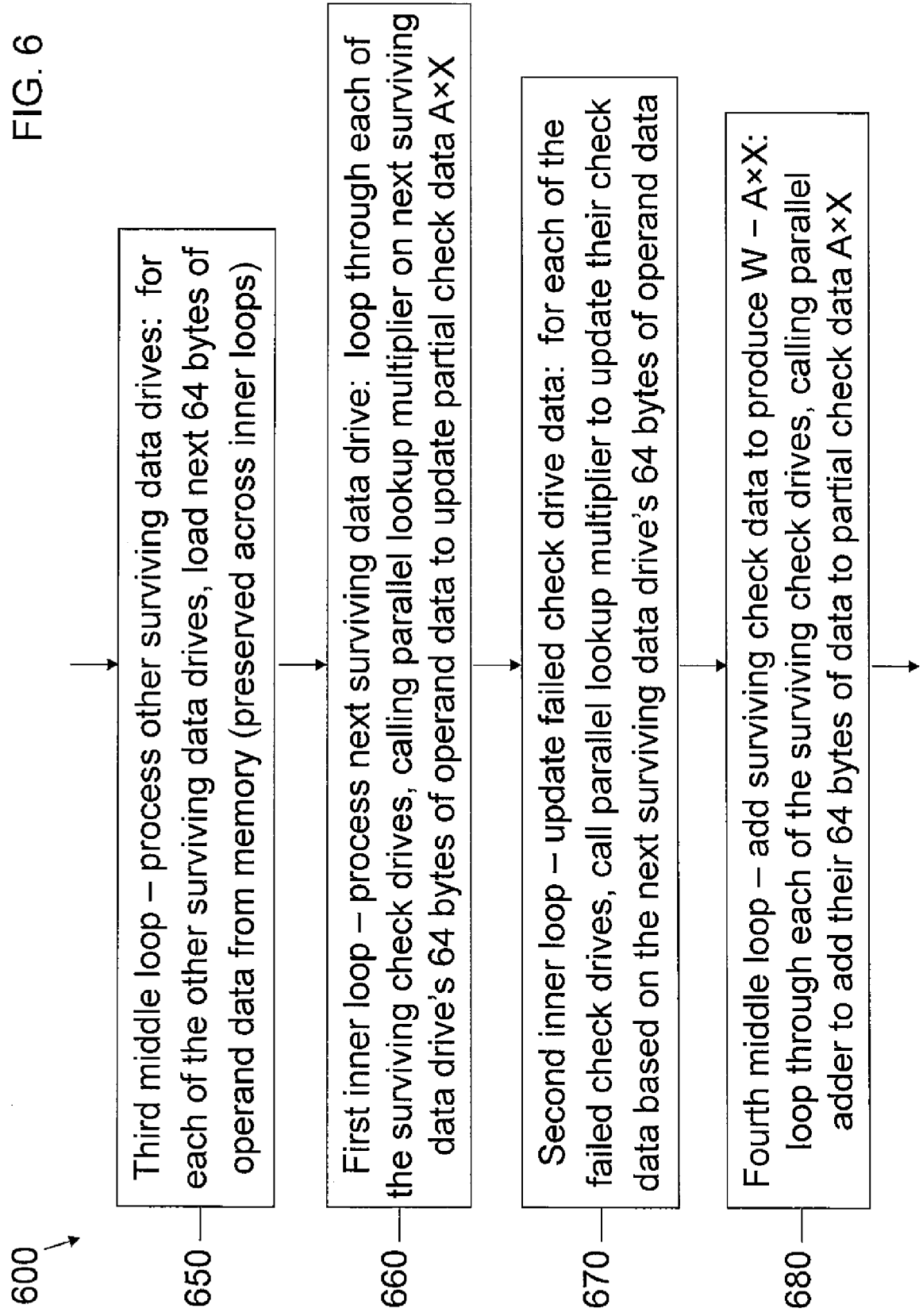

FIGS. 5-7 show an exemplary method 600 for sequencing the Parallel Lookup Multiplier to perform the lost data reconstruction according to an embodiment of the present invention.

Referring to FIG. 5, in step 610, the Sequencer 2 is called. Sequencer 2 has many similarities with the embodiment of Sequencer 1 illustrated in FIG. 4. For instance, Sequencer 2 processes the data drive data in 64-byte chunks like Sequencer 1. Sequencer 2 is more complex, however, in that only some of the data drive data is surviving; the rest has to be reconstructed. In addition, lost check data needs to be regenerated. Like Sequencer 1, Sequencer 2 does these operations in such a way as to minimize memory accesses of the data drive data (by loading the data once and calling the Parallel Lookup Multiplier multiple times). Assume for ease of description that there is at least one surviving data drive; the case of no surviving data drives is handled a little differently, but not significantly different. In addition, recall from above that the driving formula behind data reconstruction is $Y = B^{-1} \times (W - A \times X)$, where Y is the lost original data, $B^{-1}$ is the solution matrix, W is the surviving check data, A is the partial check data encoding matrix (for the surviving check drives and the surviving data drives), and X is the surviving original data.

In step 620, the outer loop processes the next 64-byte chunk of data for each of the drives. Like Sequencer 1, the first surviving data drive is again handled specially since the partial check data $A \times X$ has to be initialized for each surviving check drive.

In step 630, the first middle loop is called, in which the partial check data $A \times X$ is initialized for each surviving check drive based on the first surviving data drive's 64 bytes of data. In this case, the Parallel Lookup Multiplier is called for each surviving check drive with the corresponding factor (from A) for the first surviving data drive.

In step 640, the second middle loop is called, in which the lost check data is initialized for each failed check drive. Using the same 64 bytes of the first surviving data drive (preserved across the calls to Parallel Lookup Multiplier in step 630), the Parallel Lookup Multiplier is again called, this time to initialize each of the failed check drive's check data to the corresponding component from the first surviving data drive. This completes the computations involving the first surviving data drive's 64 bytes of data, which were fetched with one access from main memory and preserved in the same four registers across steps 630 and 640.

Continuing with FIG. 6, in step 650, the third middle loop is called, which processes the other surviving data drives' corresponding 64-byte chunks of data. As with the first surviving data drive, each of the other surviving data drives is processed separately, loading the respective 64 bytes of data into four registers (preserved across calls to the Parallel Lookup Multiplier).

In step 660, the first inner loop is called, in which the partial check data $A \times X$ is updated for each surviving check drive based on the next surviving data drive's 64 bytes of data. In this case, the Parallel Lookup Multiplier is called for each surviving check drive with the corresponding factor (from A) for the next surviving data drive.

In step 670, the second inner loop is called, in which the lost check data is updated for each failed check drive. Using the same 64 bytes of the next surviving data drive (preserved across the calls to Parallel Lookup Multiplier in step 660), the Parallel Lookup Multiplier is again called, this time to update each of the failed check drive's check data by the corresponding component from the next surviving data drive. This completes the computations involving the next surviving data drive's 64 bytes of data, which were fetched with one access from main memory and preserved in the same four registers across steps 660 and 670.

Next, in step 680, the computation of the partial check data A×X is complete, so the surviving check data W is added to this result (recall that W−A×X is equivalent to W+A×X in binary Galois Field arithmetic). This is done by the fourth middle loop, which for each surviving check drive adds the corresponding 64-byte component of surviving check data W to the (surviving) partial check data A×X (using the Parallel Adder) to produce the (lost) partial check data W−A×X.

Continuing with FIG. 7, in step 690, the fifth middle loop is called, which performs the two dimensional matrix multiplication $B^{-1} \times (W-A \times X)$ to produce the lost original data Y. The calculation is performed one row at a time, for a total of F rows, initializing the row to the first term of the corresponding linear combination of the solution matrix $B^{-1}$ and the lost partial check data W−A×X (using the Parallel Lookup Multiplier).

In step 700, the third inner loop is called, which completes the remaining F−1 terms of the corresponding linear combination (using the Parallel Lookup Multiplier on each term) from the fifth middle loop in step 690 and updates the running calculation (using the Parallel Adder) of the next row of $B^{-1} \times (W-A \times X)$. This completes the next row (and reconstructs the corresponding failed data drive's lost data) of lost original data Y, which can then be stored at an appropriate location.

In step 710, the fourth inner loop is called, in which the lost check data is updated for each failed check drive by the newly reconstructed lost data for the next failed data drive. Using the same 64 bytes of the next reconstructed lost data (preserved across calls to the Parallel Lookup Multiplier), the Parallel Lookup Multiplier is called to update each of the failed check drives' check data by the corresponding component from the next failed data drive. This completes the computations involving the next failed data drive's 64 bytes of reconstructed data, which were performed as soon as the data was reconstructed and without being stored and retrieved from main memory.

Finally, in step 720, the sixth middle loop is called. The lost check data has been regenerated, so in this step, the newly regenerated check data is stored at an appropriate location (if desired).

Aspects of the present invention can be also realized in other environments, such as two-byte quantities, each such two-byte quantity capable of taking on $2^{16}=65,536$ possible values, by using similar constructs (scaled accordingly) to those presented here. Such extensions would be readily apparent to one of ordinary skill in the art, so their details will be omitted for brevity of description.

Exemplary techniques and methods for doing the Galois field manipulation and other mathematics behind RAID error correcting codes are described in Appendix A, which contains a paper "Information Dispersal Matrices for RAID Error Correcting Codes" prepared for the present application.

Multi-Core Considerations

What follows is an exemplary embodiment for optimizing or improving the performance of multi-core architecture systems when implementing the described erasure coding system routines. In multi-core architecture systems, each processor die is divided into multiple CPU cores, each with their own local caches, together with a memory (bus) interface and possible on-die cache to interface with a shared memory with other processor dies.

Figure 8:
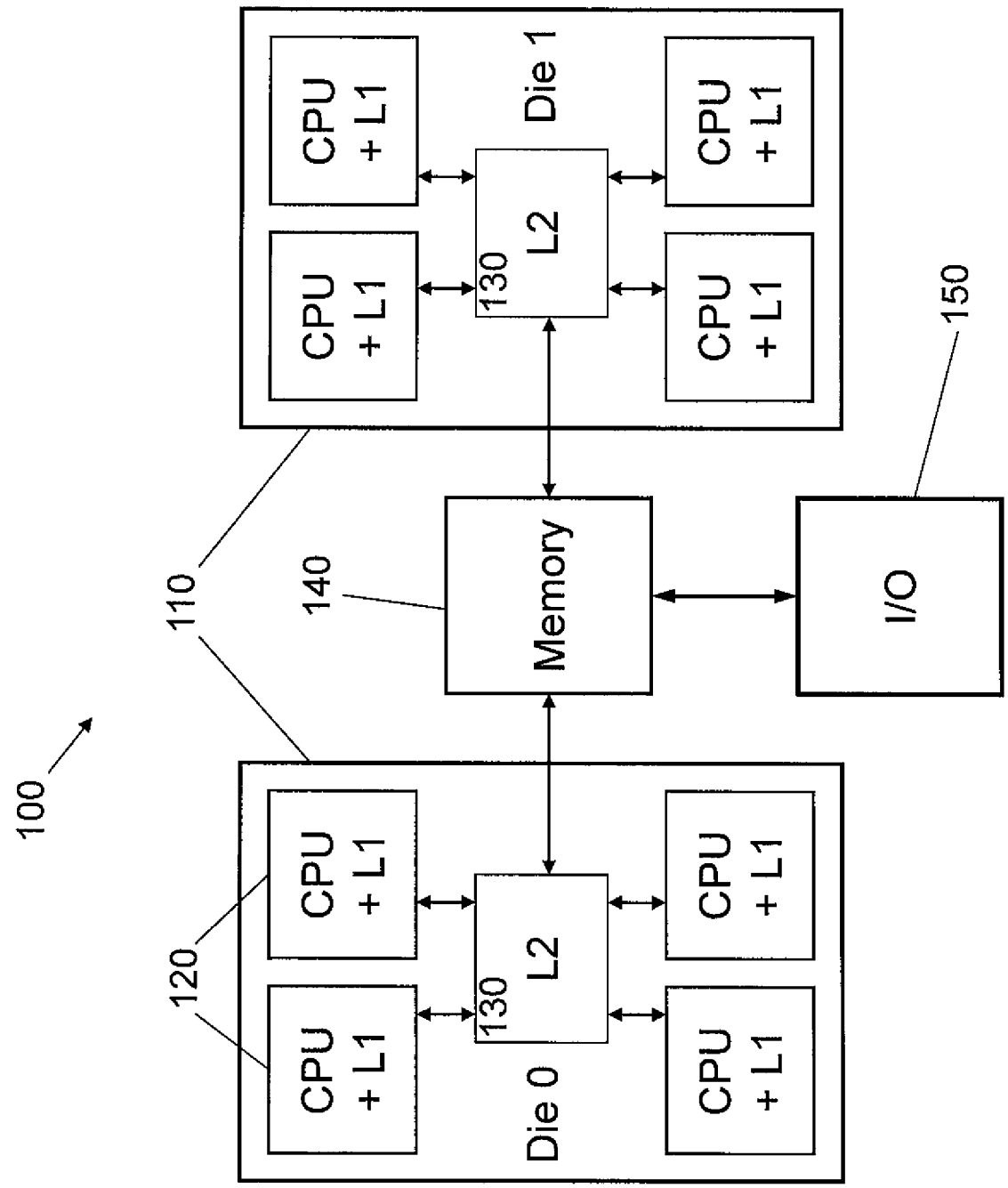

FIG. 8 illustrates a multi-core architecture system 100 having two processor dies 110 (namely, Die 0 and Die 1).

Referring to FIG. 8, each die 110 includes four central processing units (CPUs or cores) 120 each having a local level 1 (L1) cache. Each core 120 may have separate functional units, for example, an x86 execution unit (for traditional instructions) and a SSE execution unit (for software designed for the newer SSE instruction set). An example application of these function units is that the x86 execution unit can be used for the RAID control logic software while the SSE execution unit can be used for the GF operation software. Each die 110 also has a level 2 (L2) cache/memory bus interface 130 shared between the four cores 120. Main memory 140, in turn, is shared between the two dies 110, and is connected to the input/output (I/O) controllers 150 that access external devices such as disk drives or other non-volatile storage devices via interfaces such as Peripheral Component Interconnect (PCI).

Redundant array of independent disks (RAID) controller processing can be described as a series of states or functions. These states may include: (1) Command Processing, to validate and schedule a host request (for example, to load or store data from disk storage); (2) Command Translation and Submission, to translate the host request into multiple disk requests and to pass the requests to the physical disks; (3) Error Correction, to generate check data and reconstruct lost data when some disks are not functioning correctly; and (4) Request Completion, to move data from internal buffers to requestor buffers. Note that the final state, Request Completion, may only be needed for a RAID controller that supports caching, and can be avoided in a cacheless design.

Parallelism is achieved in the embodiment of FIG. 8 by assigning different cores 120 to different tasks. For example, some of the cores 120 can be "command cores," that is, assigned to the I/O operations, which includes reading and storing the data and check bytes to and from memory 140 and the disk drives via the I/O interface 150. Others of the cores 120 can be "data cores," and assigned to the GF operations, that is, generating the check data from the original data, reconstructing the lost data from the surviving data, etc., including the Parallel Lookup Multiplier and the sequencers described above. For example, in exemplary embodiments, a scheduler can be used to divide the original data D into corresponding portions of each block, which can then be processed independently by different cores 120 for applications such as check data generation and lost data reconstruction.

One of the benefits of this data core/command core subdivision of processing is ensuring that different code will be executed in different cores 120 (that is, command code in command cores, and data code in data cores). This improves the performance of the associated L1 cache in each core 120, and avoids the "pollution" of these caches with code that is less frequently executed. In addition, empirical results show that the dies 110 perform best when only one core 120 on each die 110 does the GF operations (i.e., Sequencer 1 or Sequencer 2, with corresponding calls to Parallel Lookup Multiplier) and the other cores 120 do the I/O operations. This helps localize the Parallel Lookup Multiplier code and associated data to a single core 120 and not compete with other cores 120, while allowing the other cores 120 to keep the data moving between memory 140 and the disk drives via the I/O interface 150.

Embodiments of the present invention yield scalable, high performance RAID systems capable of outperforming other systems, and at much lower cost, due to the use of high volume commodity components that are leveraged to achieve the result. This combination can be achieved by utilizing the mathematical techniques and code optimizations described elsewhere in this application with careful placement of the resulting code on specific processing cores. Embodiments can also be implemented on fewer resources, such as single-core dies and/or single-die systems, with decreased parallelism and performance optimization.

The process of subdividing and assigning individual cores 120 and/or dies 110 to inherently parallelizable tasks will result in a performance benefit. For example, on a Linux system, software may be organized into "threads," and threads may be assigned to specific CPUs and memory systems via the kthread_bind function when the thread is created. Creating separate threads to process the GF arithmetic allows parallel computations to take place, which multiplies the performance of the system.

Further, creating multiple threads for command processing allows for fully overlapped execution of the command processing states. One way to accomplish this is to number each command, then use the arithmetic MOD function (% in C language) to choose a separate thread for each command. Another technique is to subdivide the data processing portion of each command into multiple components, and assign each component to a separate thread.

Figure 9:
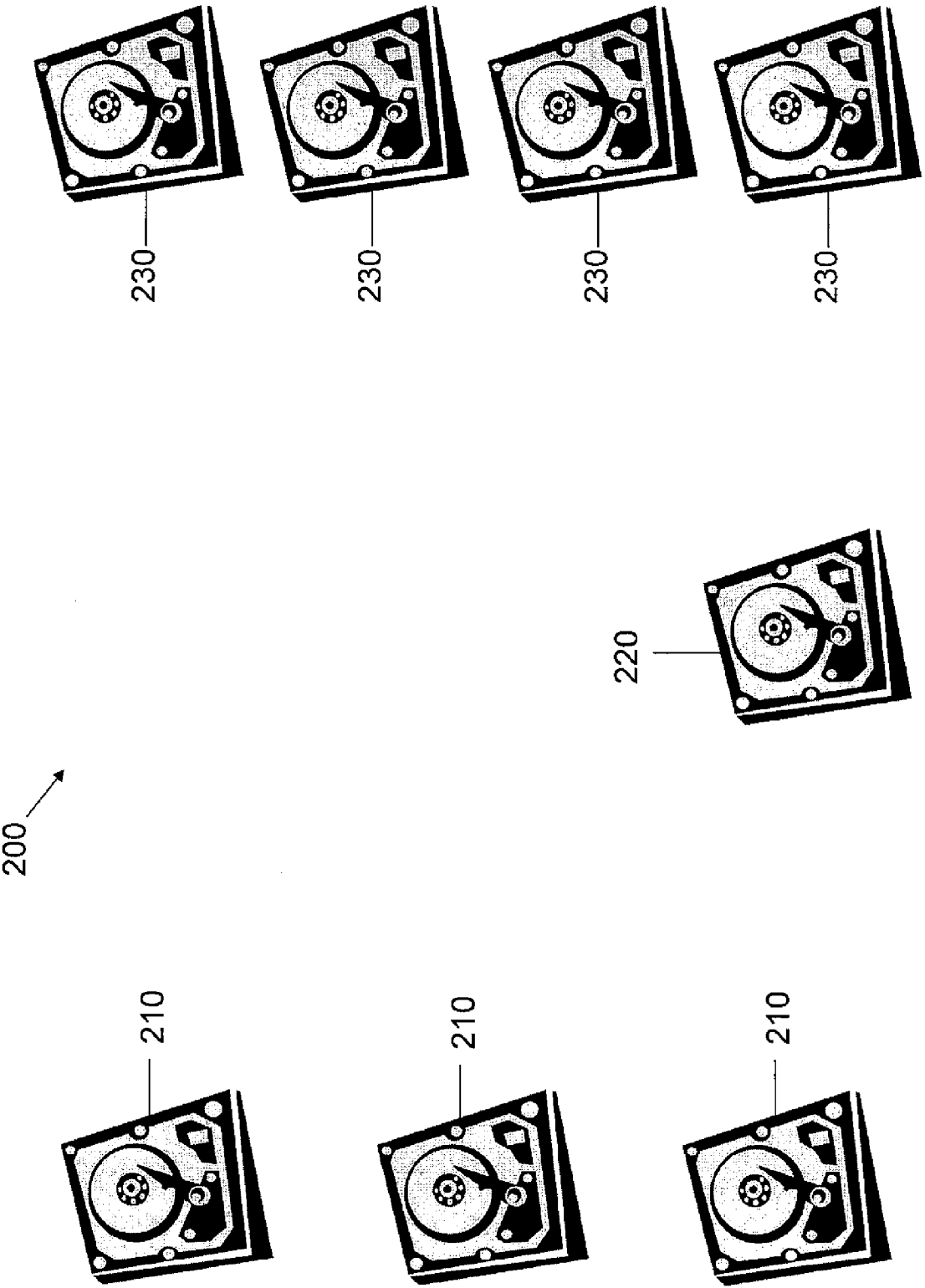

FIG. 9 shows an exemplary disk drive configuration 200 according to an embodiment of the present invention.

Referring to FIG. 9, eight disks are shown, though this number can vary in other embodiments. The disks are divided into three types: data drives 210, parity drive 220, and check drives 230. The eight disks break down as three data drives 210, one parity drive 220, and four check drives 230 in the embodiment of FIG. 9.

Each of the data drives 210 is used to hold a portion of data. The data is distributed uniformly across the data drives 210 in stripes, such as 192 KB stripes. For example, the data for an application can be broken up into stripes of 192 KB, and each of the stripes in turn broken up into three 64 KB blocks, each of the three blocks being written to a different one of the three data drives 210.

The parity drive 220 is a special type of check drive in that the encoding of its data is a simple summation (recall that this is exclusive OR in binary GF arithmetic) of the corresponding bytes of each of the three data drives 210. That is, check data generation (Sequencer 1) or regeneration (Sequencer 2) can be performed for the parity drive 220 using the Parallel Adder (and not the Parallel Lookup Multiplier). Accordingly, the check data for the parity drive 220 is relatively straightforward to build. Likewise, when one of the data drives 210 no longer functions correctly, the parity drive 220 can be used to reconstruct the lost data by adding (same as subtracting in binary GF arithmetic) the corresponding bytes from each of the two remaining data drives 210. Thus, a single drive failure of one of the data drives 210 is very straightforward to handle when the parity drive 220 is available (no Parallel Lookup Multiplier). Accordingly, the parity drive 220 can replace much of the GF multiplication operations with GF addition for both check data generation and lost data reconstruction.

Each of the check drives 230 contains a linear combination of the corresponding bytes of each of the data drives 210. The linear combination is different for each check drive 230, but in general is represented by a summation of different multiples of each of the corresponding bytes of the data drives 210 (again, all arithmetic being GF arithmetic). For example, for the first check drive 230, each of the bytes of the first data drive 210 could be multiplied by 4, each of the bytes of the second data drive 210 by 3, and each of the bytes of the third data drive 210 by 6, then the corresponding products for each of the corresponding bytes could be added to produce the first check drive data. Similar linear combinations could be used to produce the check drive data for the other check drives 230. The specifics of which multiples for which check drive are explained in Appendix A.

With the addition of the parity drive 220 and check drives 230, eight drives are used in the RAID system 200 of FIG. 9. Accordingly, each 192 KB of original data is stored as 512 KB (i.e., eight blocks of 64 KB) of (original plus check) data. Such a system 200, however, is capable of recovering all of the original data provided any three of these eight drives survive. That is, the system 200 can withstand a concurrent failure of up to any five drives and still preserve all of the original data.

Exemplary Routines to Implement an Embodiment

The error correcting code (ECC) portion of an exemplary embodiment of the present invention may be written in software as, for example, four functions, which could be named as ECCInitialize, ECCSolve, ECCGenerate, and ECCRegenerate. The main functions that perform work are ECCGenerate and ECCRegenerate. ECCGenerate generates check codes for data that are used to recover data when a drive suffers an outage (that is, ECCGenerate generates the check data J from the original data D using Sequencer 1). ECCRegenerate uses these check codes and the remaining data to recover data after such an outage (that is, ECCRegenerate uses the surviving check data W, the surviving original data X, and Sequencer 2 to reconstruct the lost original data Y while also regenerating any of the lost check data). Prior to calling either of these functions, ECCSolve is called to compute the constants used for a particular configuration of data drives, check drives, and failed drives (for example, ECCSolve builds the solution matrix $B^{-1}$ together with the lists of surviving and failed data and check drives). Prior to calling ECCSolve, ECCInitialize is called to generate constant tables used by all of the other functions (for example, ECCInitialize builds the IDM E and the two lookup tables for the Parallel Lookup Multiplier).

ECCInitialize

The function ECCInitialize creates constant tables that are used by all subsequent functions. It is called once at program initialization time. By copying or precomputing these values up front, these constant tables can be used to replace more time-consuming operations with simple table look-ups (such as for the Parallel Lookup Multiplier). For example, four tables useful for speeding up the GF arithmetic include:

1. mvct—an array of constants used to perform GF multiplication with the PSHUFB instruction that operates on SSE registers (that is, the Parallel Lookup Multiplier).

2. mast—contains the master encoding matrix S (or the Information Dispersal Matrix (IDM) E, as described in Appendix A), or at least the nontrivial portion, such as the check drive encoding matrix H 3. mul_tab—contains the results of all possible GF multiplication operations of any two operands (for example, 256× 256=65,536 bytes for all of the possible products of two different one-byte quantities)

4. div_tab—contains the results of all possible GF division operations of any two operands (can be similar in size to mul_tab)

ECCSolve

The function ECCSolve creates constant tables that are used to compute a solution for a particular configuration of data drives, check drives, and failed drives. It is called prior to using the functions ECCGenerate or ECCRegenerate. It allows the user to identify a particular case of failure by describing the logical configuration of data drives, check drives, and failed drives. It returns the constants, tables, and lists used to either generate check codes or regenerate data. For example, it can return the matrix B that needs to be inverted as well as the inverted matrix $B^{-1}$ (i.e., the solution matrix).

ECCGenerate

The function ECCGenerate is used to generate check codes (that is, the check data matrix J) for a particular configuration of data drives and check drives, using Sequencer 1 and the Parallel Lookup Multiplier as described above. Prior to calling ECCGenerate, ECCSolve is called to compute the appropriate constants for the particular configuration of data drives and check drives, as well as the solution matrix $B^{-1}$.

ECCRegenerate

The function ECCRegenerate is used to regenerate data vectors and check code vectors for a particular configuration of data drives and check drives (that is, reconstructing the original data matrix D from the surviving data matrix X and the surviving check matrix W, as well as regenerating the lost check data from the restored original data), this time using Sequencer 2 and the Parallel Lookup Multiplier as described above. Prior to calling ECCRegenerate, ECCSolve is called to compute the appropriate constants for the particular configuration of data drives, check drives, and failed drives, as well as the solution matrix $B^{-1}$.

Exemplary Implementation Details

As discussed in Appendix A, there are two significant sources of computational overhead in erasure code processing (such as an erasure coding system used in RAID processing): the computation of the solution matrix $B^{-1}$ for a given failure scenario, and the byte-level processing of encoding the check data J and reconstructing the lost data after a lost packet (e.g., data drive failure). By reducing the solution matrix $B^{-1}$ to a matrix inversion of a F×F matrix, where F is the number of lost packets (e.g., failed drives), that portion of the computational overhead is for all intents and purposes negligible compared to the megabytes (MB), gigabytes (GB), and possibly terabytes (TB) of data that needs to be encoded into check data or reconstructed from the surviving original and check data. Accordingly, the remainder of this section will be devoted to the byte-level encoding and regenerating processing.

As already mentioned, certain practical simplifications can be assumed for most implementations. By using a Galois field of 256 entries, byte-level processing can be used for all of the GF arithmetic. Using the master encoding matrix S described in Appendix A, any combination of up to 127 data drives, 1 parity drive, and 128 check drives can be supported with such a Galois field. While, in general, any combination of data drives and check drives that adds up to 256 total drives is possible, not all combinations provide a parity drive when computed directly. Using the master encoding matrix S, on the other hand, allows all such combinations (including a parity drive) to be built (or simply indexed) from the same such matrix. That is, the appropriate sub-matrix (including the parity drive) can be used for configurations of less than the maximum number of drives.

In addition, using the master encoding matrix S permits further data drives and/or check drives can be added without requiring the recomputing of the IDM E (unlike other proposed solutions, which recompute E for every change of N or M). Rather, additional indexing of rows and/or columns of the master encoding matrix S will suffice. As discussed above, the use of the parity drive can eliminate or significantly reduce the somewhat complex GF multiplication operations associated with the other check drives and replaces them with simple GF addition (bitwise exclusive OR in binary Galois fields) operations. It should be noted that master encoding matrices with the above properties are possible for any power-of-two number of drives $2^P = N_{max} + M_{max}$ where the maximum number of data drives $N_{max}$ is one less than a power of two (e.g., $N_{max}=127$ or 63) and the maximum number of check drives $M_{max}$ (including the parity drive) is $2^P - N_{max}$.

As discussed earlier, in an exemplary embodiment of the present invention, a modern x86 architecture is used (being readily available and inexpensive). In particular, this architecture supports 16 XMM registers and the SSE instructions. Each XMM register is 128 bits and is available for special purpose processing with the SSE instructions. Each of these XMM registers holds 16 bytes (8-bit), so four such registers can be used to store 64 bytes of data. Thus, by using SSE instructions (some of which work on different operand sizes, for example, treating each of the XMM registers as containing 16 one-byte operands), 64 bytes of data can be operated at a time using four consecutive SSE instructions (e.g., fetching from memory, storing into memory, zeroing, adding, multiplying), the remaining registers being used for intermediate results and temporary storage. With such an architecture, several routines are useful for optimizing the byte-level performance, including the Parallel Lookup Multiplier, Sequencer 1, and Sequencer 2 discussed above.

GLOSSARY OF SOME VARIABLES

A encoding matrix (F×K), sub-matrix of T
B encoding matrix (F×F), sub-matrix of T
$B^{-1}$ solution matrix (F×F)
C encoded data matrix $$((N+M) \times L) = \begin{bmatrix} D \\ J \end{bmatrix}$$

C' surviving encoded data matrix $$(N \times L) = \begin{bmatrix} X \\ W \end{bmatrix}$$

D original data matrix (N×L)
D' permuted original data matrix $$(N \times L) = \begin{bmatrix} X \\ Y \end{bmatrix}$$

E information dispersal matrix $$(IDM)((N+M) \times N) = \begin{bmatrix} I_N \\ H \end{bmatrix}$$

F number of failed data drives
G number of failed check drives
H check drive encoding matrix (M×N)
I identity matrix ($I_K$=K×K identity matrix, $I_N$=N×N identity matrix)
J encoded check data matrix (M×L)
K number of surviving data drives=N−F
L data block size (elements or bytes)
M number of check drives
$M_{max}$ maximum value of M
N number of data drives
$N_{max}$ maximum value of N O zero matrix (K×F), sub-matrix of T
S master encoding matrix (($M_{max}+N_{max}$)×$N_{max}$)
T transformed IDM $$(N \times N) = \begin{bmatrix} I_K & O \\ A & B \end{bmatrix}$$

W surviving check data matrix (F×L)
X surviving original data matrix (K×L)
Y lost original data matrix (F×L)

DETAILED DESCRIPTION

New

While optimal erasure codes have many applications, for ease of description, they will be described in this application primarily with respect to RAID applications, i.e., erasure coding systems for the storage and retrieval of digital data distributed across numerous storage devices (or drives), though the present application is not limited thereto. For further ease of description, the storage devices will be assumed to be disk drives, though the invention is not limited thereto. In RAID systems, the data (or original data) is broken up into stripes, each of which includes N uniformly sized blocks (data blocks), and the N blocks are written across N separate drives (the data drives), one block per data drive. For simplicity, it will be assumed that N≥2 throughout. The N=1 case essentially degenerates to simple data mirroring (i.e., replication of data without encoding), though many of the same general principles apply as with N≥2.

In addition, for ease of description, blocks will be assumed to be composed of L elements, each element having a fixed size, say 8 bits or one byte. An element, such as a byte, forms the fundamental unit of operation for the RAID processing, but the invention is just as applicable to other size elements, such as 16 bits (2 bytes). For simplification, unless otherwise indicated, elements will be assumed to be one byte in size throughout the description that follows, and the term "element(s)" and "byte(s)" will be used synonymously. It is understood, however, that this is only for convenience of description, and embodiments of the invention are extendible to any size elements (e.g., 2 bytes) as would be apparent to one of ordinary skill in the art.

Conceptually, RAID processing takes place at the element (e.g., byte) level, though parallel processing techniques (e.g., multiple cores, multiple instructions per cycle, instruction pipelining, and wide data paths) allows vast amounts of this processing to be done concurrently. While large block sizes L can be chosen to take advantage of this concurrent processing, the processing is still being done on a byte basis across each stripe (that is, each byte at the same byte position in each stripe). Accordingly, errors and failures can take place on units smaller than blocks, including bytes, and the same principles of being able to recover any lost or corrupted data from any N corresponding surviving units (including N surviving bytes at the same corresponding byte positions) across the stripes still apply.

The N data blocks from each stripe are combined using arithmetic operations (as described in the Benefit Application and included above) in M different ways to produce M blocks of check data (check blocks), and the M check blocks written across M drives (the check drives) separate from the N data drives, one block per check drive. It should be noted that the assignment of data and check blocks to the drives does not have to remain the same between stripes, provided each of the N+M data and check blocks goes to a different one of the N+M drives. For ease of description, however, the assignment will be assumed to be the same throughout this disclosure. It should also be noted that some or all of the N data blocks can be replaced with an equal number of additional check blocks. That is, provided there are N+M total data and check blocks, the N blocks of original data are reconstructable from any combination of N of the N+M total data and check blocks. Further, with the original data reconstructed, any of the check blocks can be regenerated. Thus, given any combination of N+M total data and check blocks, any N such blocks can be used at any point to reconstruct or regenerate the other M blocks.

In other words, conceptually, there is little difference between an original data block and a check block, except perhaps to an application that needs to process the original data. Since the RAID storage system would not likely have need to process the original data, the data could be all stored as (encoded) check blocks. That is, the data could instead be stored as N+M total check blocks, as the system could still reconstruct the original data from any N of them. This simple example demonstrates the ability of check blocks to both encode (for example, encrypt) and authenticate data.

For example, without knowledge of the algorithm and the multiplicative factors used to encode the check blocks—that is, the check drive encoding matrix (or check matrix) as defined in the Benefit Application and included above—the encoded data can appear to be encrypted to an observer of the data. Using a check matrix that is as least N×N, and storing the original data as check data rather than original data, should suffice to encrypt the original data to an unaware observer. In a similar fashion, with knowledge of the algorithm and the check matrix, data can have check blocks created for purposes of authentication. That is, receivers of the data and check blocks can regenerate the check blocks to verify the authenticity of the data bytes. Encryption and authentication can be performed together by using, for example, a check matrix of size (N+M)×(N+M) to create N encrypted data blocks and M check blocks for authentication. For purposes of the remainder of this disclosure, however, it will be assumed that the N blocks of original data are kept in their original (unencoded) form at the different memory and storage hierarchies, though the invention is not limited thereto.

These combinations and arithmetic operations of data blocks into check blocks can take place, for example, when new (or changed) data is written to (or back to) disk. Accordingly, each of the N+M drives (data drives and check drives) stores a similar amount of data, namely one block for each stripe. As the processing of multiple stripes is conceptually similar to the processing of one stripe (only processing multiple blocks per drive instead of one), it will be further assumed for simplification that the data being stored or retrieved represents one stripe of original data unless otherwise indicated. It will also be assumed that the block size L is sufficiently large that the data can be consistently divided across each block to produce subsets of the data (for example, 64 byte subsets) that include respective portions of the blocks (for efficient concurrent processing by different processing units).

Figure 10:
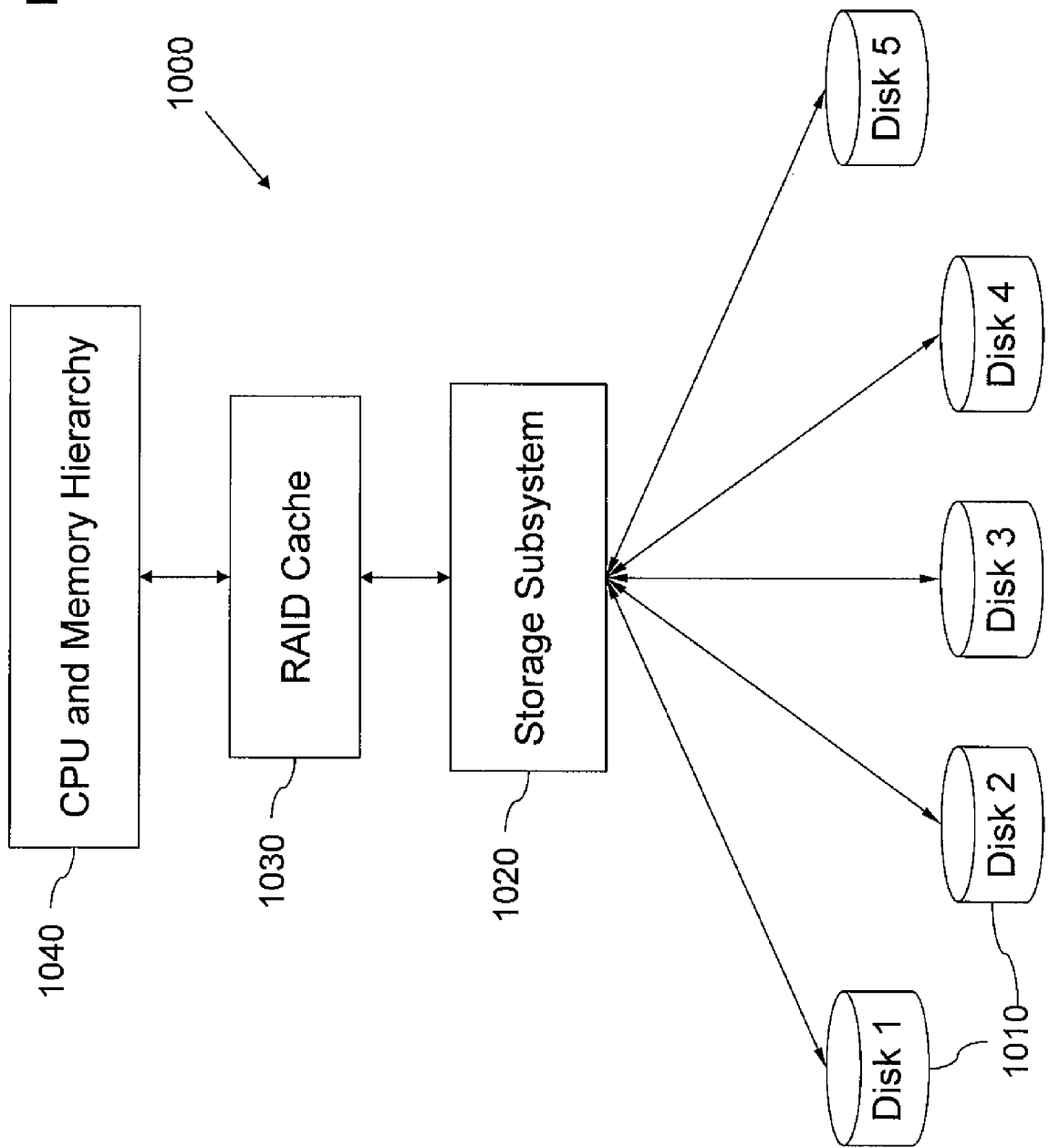
FIGS. 10-21 are new.

The data blocks (and, in some cases, the check blocks) for each stripe can be assumed to be buffered within a level of the memory and storage hierarchy of the computer implementing the erasure code. For ease of description and simplification, it will be assumed that the caching takes place in stripe size units, where the stripe includes at least the data blocks along with any check blocks being kept or maintained with the data blocks at the corresponding level of the memory or storage hierarchy. One such exemplary level will be referred to as the RAID cache level. See FIG. 10 for an exemplary memory and storage hierarchy system 1000 according to an embodiment of the present invention. In FIG. 10, the memory and storage hierarchy system 1000 includes disk drives 1010 (for example, five disk drives, labeled disk 1 through disk 5), a storage subsystem controller 1020 for transferring data to and from the different disk drives 1010, a RAID cache 1030 for maintaining recently accessed data in stripes, and a CPU and memory hierarchy 1040 for processing the data by a central processing unit (CPU) and a memory hierarchy that can include various hardware memory levels including processor cache and volatile memory, such as random access memory (RAM).

The RAID cache 1030 might only keep the N data blocks for each stripe resident in the RAID cache 1030. Assuming the corresponding N data drives are functioning, the RAID cache 1030 can build each stripe from the N data drives, process the stripe internally within the CPU and memory hierarchy 1040, and then write out any changes to the N data blocks, along with generating and writing out the corresponding changes to the M check blocks, at the appropriate time (e.g., when the stripe "ages out" of the RAID cache). By keeping the stripe in the RAID cache 1030, details such as keeping the check blocks up to date on the check drives, handling failing drives, etc., can be postponed until a more opportune moment presents itself to the RAID cache 1030. Thus, to the RAID cache 1030, the fundamental unit of memory or storage is the stripe, though the RAID cache 1030 may transfer data to the CPU and memory hierarchy 1040 as well as to the storage subsystem 1020 in units of blocks.

In other implementations, the RAID cache is a "write-through" cache. That is, when a change is written to one of the blocks in the RAID cache, the corresponding check blocks are updated and the contents of all of the updated blocks are written to their respective drives.

According to embodiments of the present invention, check blocks are also maintained in the RAID cache 1030 for each stripe. The number of such check blocks can be the same, less than, or even more than the number of check blocks maintained in the check drives. Erasure encodings, such as those described in the Benefit Application and included above, can support up to 256 total (data plus check) drives for byte-size elements (and far more drives for larger size elements, such as 65.536 drives for two-byte elements). Accordingly, the internal stripe size (i.e., number of data and check blocks maintained in the RAID cache 1030 for each stripe) can be as large as 256 blocks, even if the external stripe size (i.e., number of data and check blocks maintained in the disks) is considerably smaller. As such, concepts such as "stripe size" and "check blocks" may be used throughout this disclosure to refer to either (or both of) "internal stripe size" (i.e., RAID cache stripe size) or "external stripe size" (i.e., data drives plus check drives stripe size), and likewise for "internal check blocks" or "external check blocks," depending on the context. Similarly, an "internal stripe" can refer to all the data and check blocks that contribute to the internal stripe size, while an "external stripe" can refer to all the data and check blocks that contribute to the external stripe size.

For example, a system may have three data drives and five check drives in a RAID configuration. Thus, the external stripe size is eight blocks, namely three data blocks plus five check blocks (that is, five external check blocks) per stripe of data. According to an embodiment of the present invention, the RAID cache may maintain the contents of two of the five check drives (as well as all of the data drives) for each stripe. Here, the internal stripe size is five blocks, namely the three data blocks and two of the check blocks (that is, two internal check blocks). In another embodiment, the internal stripe size is eight blocks, that is, the same as the external stripe size. In yet another embodiment, the internal stripe size is 11 blocks, that is, the three data blocks and eight check blocks. Accordingly, internal stripes can be full or proper subsets of the external stripes and vice versa, the external stripes can be full or proper subsets of the internal stripes. It should be noted that internal check blocks can also be used to speed up or replace the step of generating the check blocks when the stripe needs to be written to (or back to) disk. However, the present invention is not limited thereto, and in other embodiments, different check matrices may be used at different levels of the storage hierarchy.

By maintaining internal check blocks, the RAID cache can also take advantage of the check blocks to detect and possibly correct errors (e.g., silent data corruptions, or SDCs) of the different memory and storage hierarchy levels. Normally, it is assumed that all data is valid, both within the computing system and throughout any storage hierarchy. While RAID drives (specifically, the check blocks) can handle situations where entire drives fail or are otherwise inaccessible, they can also do data verification and correction of what would otherwise be assumed to be valid data (that is, data that may have experienced one or more SDCs).

Internal and Multi-Level ECC

While the above discussion focuses on internal check bytes that, when stored on disk, are spread across multiple check drives, it is also possible to store such internal check bytes on the same drive, or a combination of the same drive and other (check) drives, such as in a hierarchical fashion over multiple levels. For example, suppose data and check bytes are to be arranged on a 24-drive system. In a first embodiment, the 24 drives can be divided into 21 data drives and 3 check drives. Thus, 21/24=87.5% of the system is available for data bytes, which means 12.5% of the system is used for check bytes. It also means that three check bytes are available for each data byte, in a single level.

In a second embodiment, by contrast, the same 24 drives are partitioned into 22 data drives and 2 check drives, providing two check bytes for each data byte in a standard RAID configuration. Thus, 22/24=91.7% of the drives are available for data, which means 8.3% of the drives are used for (standard RAID) check bytes. In addition, on each data drive, suppose the data is organized into 512-byte sectors. 64 such sectors (i.e., 32 KB of data bytes) can be grouped in a manner similar to 64 separate drives for RAID processing, and 2 check sectors (i.e., 1 KB of check bytes) created to provide internal ECC within the drive. That is, each of the sectors can be thought of as a data block, with two check blocks (sectors) being created to provide ECC protection as with the standard RAID processing, only using internal sectors instead of external blocks. This provides an additional two check bytes for each data byte, with these check bytes being computed and used with the same hardware or software used to process the standard RAID processing Thus, 64/66=97.0% of the drive is available for data bytes, which means 3.0% of the drive is used for check bytes.

Overall, in the second embodiment, there are four check bytes available for each data byte (two bytes within the drive, shared among 64 sectors, and two bytes outside the drive, shared among 22 data drives) in a two-level scheme of two bytes in each level. Further, the total data byte storage available in the second embodiment is $(22/24)\times(64/66)=8/9=88.9\%$, which means only 11.1% of the storage is devoted to check bytes. This compares favorably to the 87.5% data byte storage (12.5% check byte storage) of the first embodiment. In addition, the second embodiment provides four check bytes for each data byte, compared to only three in the first embodiment. Further, in the second embodiment, within each data drive, situations such as an unrecoverable read error (URE) of an individual sector can be resolved within the drive by using the check sectors to reconstruct the URE data, thus avoiding reading all the other 23 drives to resolve the URE as would be needed in the first embodiment.

In still other embodiments, the above multi-level approach is extended to more than two levels. For example, in a third embodiment, a third level can be added by grouping four such 24-drive systems ("subsystems") as described in the second embodiment into a 96-drive system with 4 additional check drives, for a total of 100 drives. The total data byte storage available in the third embodiment is then $(22/24)\times(64/66)\times(96/100)=64/75=85.3\%$, which means only 14.7% of the storage is for check bytes, yet provides eight check bytes for each data byte in three levels of two check bytes, two check bytes, and four check bytes. Thus, in the third embodiment, not only are the single drive situations (e.g., URE's) correctable within each drive, but more extensive situations (such as a failed drive) are correctable within a 24-drive subsystem (using the corresponding two check drives for the subsystem) and without having to read all the other 99 drives in the system.

Consistency and (Consistency) Distance

To appreciate the dual-purpose concept described earlier (i.e., data regeneration when known drives fail versus error detection/correction when unknown bytes become corrupted), data is normally stored or maintained in a consistent state (or at least what is believed to be a consistent state). In a consistent state, there are no apparent SDCs, based on the available check bytes or blocks to verify the other bytes. That is, with consistent data and check bytes, regenerating the check bytes from the data bytes produces the same check bytes as are already present. Otherwise, the check bytes are inconsistent. More generally, for an N+M block erasure code, N+M blocks are defined to be consistent if using any N of the blocks to regenerate the other M blocks produces the same blocks as are already present. Otherwise, the N+M blocks are inconsistent. It should be noted that any combination of N blocks (or corresponding bytes) can be used for this consistency check.

Thus, data blocks by themselves are assumed to be consistent, for there is nothing to indicate otherwise. Accordingly, without check blocks, SDCs can take place without detection, for N data blocks by themselves are always assumed to be in a consistent state. While erasure codes such as those used for RAID storage are usually described with reference to known error locations (i.e., missing or corrupted blocks), unknown errors (i.e., SDCs) will be defined in terms of data consistency and inconsistency. SDCs are thus detectable (and perhaps correctable) only to the extent that they cause the data and check bytes to be inconsistent. Since N data blocks cannot have any inconsistencies, N data blocks are always consistent, and thus cannot have any (detectable or correctable) SDCs.

The addition of check blocks allows for the detection and possible correction of SDCs. In general, for each check block added, one more SDC can be detected (with certainty) at each byte position. Put another way, an N+M set of consistent bytes could undergo as many as M SDCs and still not reach a different set of N+M consistent bytes, hence up to M SDCs can be detected with certainty.

This can also be expressed as a consistency distance, that is, the minimum number of element (e.g., byte) corrections needed to return a set of data and check bytes to a consistent state. Another way of expressing this is that the consistency distance of a set of data and check bytes is the Hamming distance (in bytes) from the set of data and check bytes to the nearest set of consistent data and check bytes. Consistent data and check bytes are thus distance 0. N data bytes by themselves are also distance 0 (since they are consistent), or distance 1 to the next nearest other consistent set (i.e., any single byte change also produces a consistent set). In general, N+M consistent data and check bytes are distance 0, or distance M+1 to the next nearest other consistent set. Inconsistent data has a nonzero consistency distance. The larger the distance, the more changes are needed to the individual bytes to return it to a consistent state. The consistency distance (or just distance) thus measures the degree of consistency.

An alternate (and possibly concurrent) use of the check bytes is to compress existing data bytes, such as in a cache. For example, denote two sets of N data bytes D1 and D2 and their corresponding sets of M check bytes C1 and C2. In the trivial case where D1 and D2 are the same, it suffices to store only one of them, such as D1, in the cache (along with each of their check bytes C1 and C2). That is, the two sets of check bytes C1 and C2 can be stored in the cache together with a pointer that points to the same data, such as D1. In this manner, the data bytes D2 do not also need to be stored, which results in data compression.

Likewise, if D1 and D2 differ (in bytewise comparison) by fewer than the number of check blocks (M), that is, the Hamming distance between D1 and D2 is less than M, it may be that the combination of N data bytes D1 and M check bytes C2 is an inconsistent set of N+M data and check bytes that is nonetheless correctable (as discussed in more detail below) to the consistent set of N+M data and check bytes D2 and C2. If so, it suffices to store only D1, and to point C2 to D1. That is, D2 can be compressed to a pointer to D1 only with a different set of check bytes C2, and can be uncompressed to D2 through error correction techniques as discussed more fully below. In other words, some or all of the error correcting capability can be exchanged for a data compression capability. It should be noted that this data compression can still be combined with actual error detection and correction by, for example, requiring D1 and D2 to differ by fewer bytes, thereby allowing these extra bytes to detect or correct actual errors (e.g., SDCs) that occur to D1, C1, or C2 over time while still being able to recover D2.

Further compression may also be possible by pointing new data to existing compressed data. That is, suppose data bytes D1 and D2, with corresponding check bytes C1 and C2, are stored as described above, with D1 actually being stored, C1 being stored and pointing to D1, and C2 being stored and also pointing to D1 (the data bytes D2 being reconstructable from doing error correction on the combination of data bytes D1 and check bytes C2). Now let new data bytes D3 with corresponding check bytes C3 be added to the cache. D3 may be sufficiently far from D1 (for example, have a Hamming distance from D1 that is $\geq M$) that the data bytes D3 cannot be recovered from the combination of the data bytes D1 and check bytes C3.

However, D3 may be sufficiently close to D2 (for example, have a Hamming distance from D2 that is $\leq M/2$) that the data bytes D3 can be recovered from error correcting the combination of data bytes D2 and check bytes C3. In this case, D3 would not have to be stored in the cache. Rather, the check bytes C3 are stored in the cache, only pointing to the check bytes C2. In this fashion, the data bytes D3 could be reconstructed by first reconstructing the data bytes D2 as described above, and then performing error correction on the recovered data bytes D2 using the check bytes C3. In this sense, the check bytes C3 indirectly point to the data bytes D1 by pointing to the check bytes C2, which directly point to the data bytes D1.

This process of data compression could thus potentially be extended several levels, each level of indirection adding another error correction operation to recover the appropriate intermediate data bytes until eventually the desired data bytes are recovered. In some embodiments, the amount of indirection (number of error correction operations) could be limited (say, to no more than a fixed number of compressed sets of intermediate data bytes) to lessen the potential computational complexity of decompressing the data from existing compressed sets of data bytes.

Pure detection of SDCs can thus be reduced to testing if the data and check bytes are consistent (i.e., has a distance greater than 0). Pure correction of SDCs can be reduced to replacing the data and check bytes with the closest consistent set of data and check bytes (that is, the set requiring the fewest number of byte changes), provided there is only one such closest set. Pure compression of data bytes can be accomplished by replacing similar combinations of data bytes with only one such set, together with corresponding sets of check bytes corresponding to their original data. Combinations of detection, correction, and compression are also possible, as described later.

Random SDCs usually make the data and check bytes more inconsistent (i.e., increases its distance), but only to a certain extent, and no more than distance M. This is because any inconsistent set of N+M data and check bytes is at most M corrections away (i.e., distance M) from a consistent set of data and check bytes. That is, any N of the data and check bytes are consistent (i.e., distance 0) and can be used to generate the other M bytes, thus producing a set of N+M consistent data and check bytes with at most M byte corrections (i.e., distance at most M). There are $$\binom{N+M}{N} = \binom{N+M}{M}$$

such possible subsets (different sets of corrections of at most M bytes) and thus, while M SDCs is detectable, it is (generally) not possible to correct them (for example, without knowing which of the numerous sets of corrections should be applied).

For ease of description, as described hereinafter, inconsistent data and check bytes are correctable if and only if there is a unique solution (that is, a unique set of byte changes) having a fewest number of corrections that returns the inconsistent data and check bytes to a consistent state (i.e., only one solution satisfying its consistency distance). Any consistent set of N+M data and check bytes is distance M+1 from any nearest other consistent set of data and check bytes. That is, the addition of M check blocks separates the consistent sets of data and check bytes by at least M+1 SDCs. Thus, any inconsistent set of data and check bytes having a combination of fewer than $$\frac{M+1}{2}$$

SDCs (i.e., less man or equal to $$\frac{M}{2}$$

SDCs) is guaranteed to be correctable, as such an inconsistent set of data and check bytes is more than distance $$\frac{M+1}{2}$$

from any nearest other set of consistent data and check bytes. However, it may be possible to correct up to M−1 SDCs, if there is only one set of consistent data that is distance M−1 or less from the inconsistent data and check bytes.

For example, if a set of data and check bytes is inconsistent, but can be made consistent in as few as two corrections (i.e., distance 2), then two SDCs are detectable. Further, if there is only one such combination of two data and check bytes that can be corrected to return the set to a consistent state, then those two data and check bytes (or rather, their SDCs) are correctable. In general, an N+M block erasure code has the capability of detecting up to M SDCs (i.e., its distance is at most M) at each byte position, and the possibility of correcting up to M−1 SDCs. However, the maximum number of correctable SDCs is data dependent, and can be as few as $$\frac{M}{2}$$

(rounded down), that is, $$\left\lfloor \frac{M}{2} \right\rfloor.$$

For a more practical example, suppose two of the check blocks are maintained internally in the RAID cache (that is, the internal stripe size is N+2 blocks). Then a simple consistency check of the N+2 blocks can be to use the N data blocks to regenerate the two check blocks, and then compare these two regenerated check blocks with the two existing check blocks. If there are any mismatches, then the internal stripe is inconsistent, that is, one or more SDCs have been detected. In this case, it may be possible to use the existing check blocks in the RAID cache to detect two SDCs or to correct one SDC, at each byte position, as will now be explained.

Figure 11:
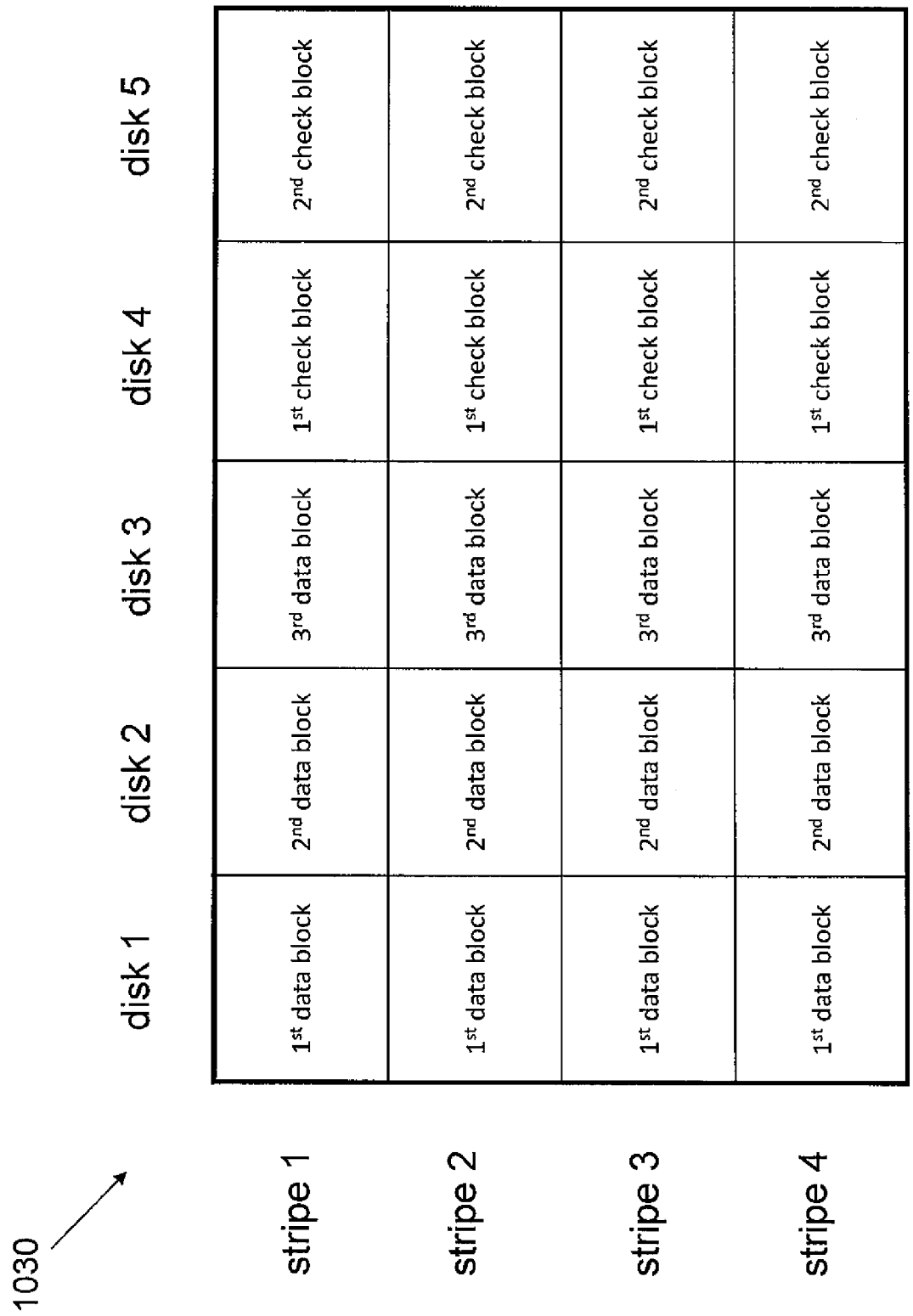

FIG. 11 illustrates an exemplary RAID cache 1030 according to an embodiment of the present invention. The cache is depicted as a two dimensional structure, with rows corresponding to stripes and columns corresponding to disk drives (including data drives and check drives). In this RAID cache 1030, the internal stripe size is five blocks, namely three data blocks and two check blocks. By incorporating two check blocks into each internal stripe, the RAID cache 1030 has dedicated 40% of its cache space to holding check data, which means that the RAID cache 1030 holds 40% fewer stripes compared to a comparable RAID cache that stores no check blocks in its internal stripes.

The check blocks do provide benefits, though. In addition to being able to write these check blocks to check drives when the stripe needs to be written to disk (that is, without a separate check data generation step), these check blocks provide, for example, error detection and correction capability (and/or encryption, authentication, and/or compression capability). These blocks represent an erasure code and thus, should any two of them become corrupted, they can be reconstructed or regenerated from the other three. However, as already mentioned, for a RAID cache (i.e., internal) level of the memory or storage hierarchy, that property also applies to the byte level. That is, for a given stripe, in this example, there can be up to 2×L corruptions, i.e., two per corresponding byte position across each of the five blocks. Accordingly, for simplification, at the RAID cache level, the data may hereinafter be thought of as individual corresponding bytes across each (internal) stripe. That is, the data will be processed at the byte level and not the block level. Consistency and distance will also be defined across the same boundaries.

Figure 12:
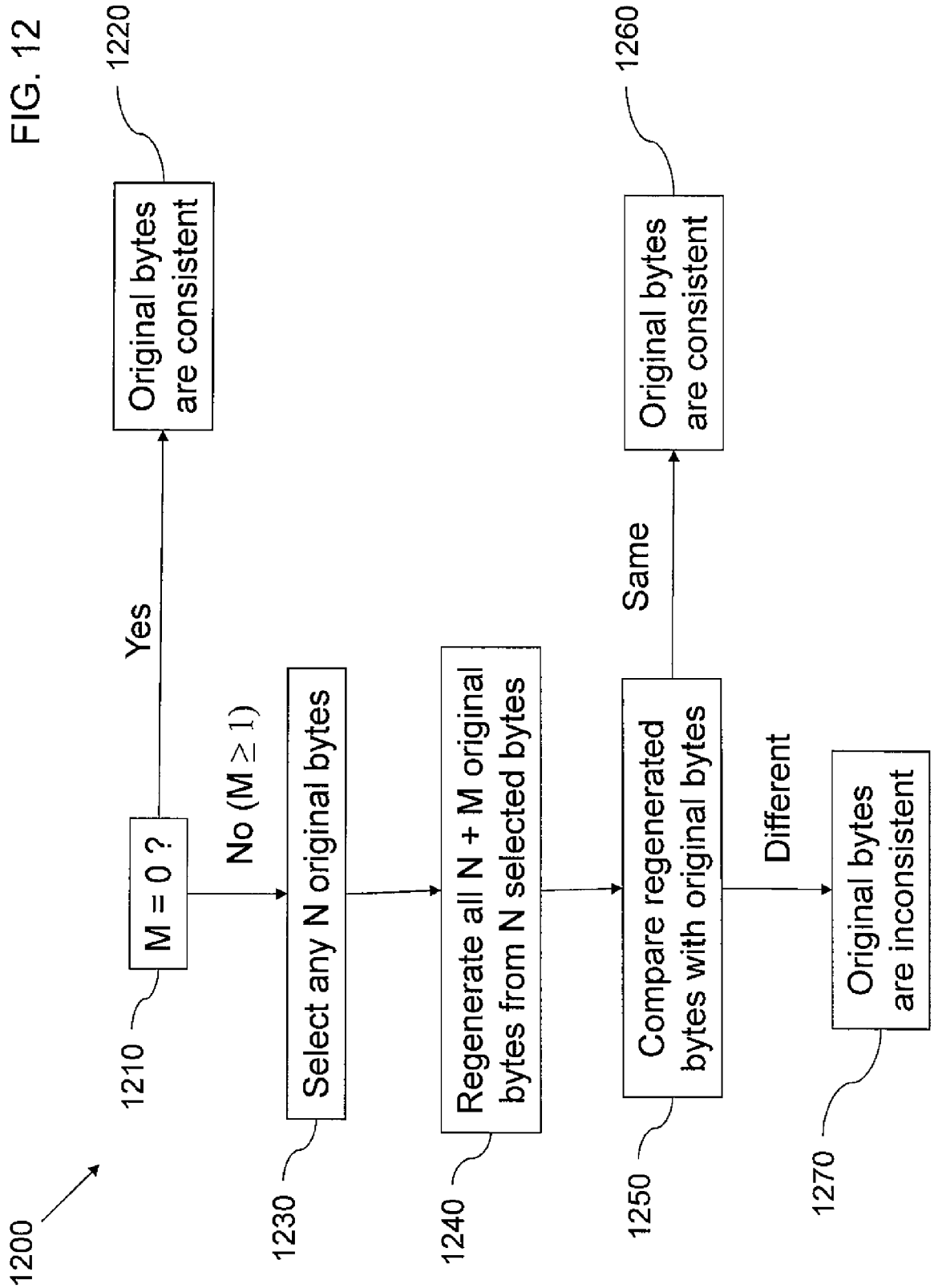

With this in mind, FIG. 12 illustrates an exemplary method 1200 for consistency checking a set of N+M original bytes in an erasure code according to an exemplary embodiment of the present invention. In step 1210, a check is made to see if M=0. If so, the processing proceeds to step 1220, where the data is assumed to be consistent since there is no way to tell otherwise. Otherwise, M≥1, so processing proceeds to step 1230, where a (proper) subset of N bytes is chosen. Any N of the original bytes can be chosen. Since the data is part of an erasure code, the N chosen bytes can be used in step 1240 to regenerate all N+M original bytes.

Next, in step 1250, the regenerated bytes are compared to the original bytes. If this byte wise comparison is the same across all N+M byte positions, then the regenerated data matches the original data, so processing proceeds to step 1260, and the data is consistent. Otherwise, the regenerated data is different from the original data, so there must be an inconsistency in the original data, so processing proceeds to step 1270, and the data is inconsistent.

As a simple example, if the N+M bytes include N data bytes and M check bytes, the consistency checking can be accomplished by regenerating the M check bytes from the N data bytes. As such, another term for consistency checking is check data regeneration verification. In addition, in place of (or in addition to) error detection, the M check bytes can be used for data authentication, allowing a sender and receiver that have knowledge of the check matrix to generate authentication bytes to verify the authenticity of a message. Authentication would take place if the received N+M data and check (authentication) bytes were consistent.

Error Detection and Correction

Returning to the example arrangement of FIG. 11, if an SDC occurs at a byte position in one block (say, the first data block), the data at the corresponding same byte positions in the other four blocks (that is, the second and third data blocks, and the first and second check blocks) can be used to detect the error and possibly correct it. Detection would take place when it is discovered that any combination of four or five blocks including the first data block is inconsistent at that byte position. Likewise, correction could take place when it is realized that the data at that byte position is consistent across the one combination of four blocks including the second and third data blocks, and the first and second check blocks. Using any three of the four bytes in the consistent combination of blocks to reconstruct the corrupted byte in the first data block will then yield consistent data across all five blocks.

Instead of detecting and correcting one error in a byte position across the five blocks, the two check blocks can instead be used to detect (up to) any two errors in the same byte position. Generally, for every check block added, each byte position can detect up to one more error, while for every two check blocks added, each byte position can detect up to two more errors or, instead, each byte position can correct up to one more error. Thus, error correction sometimes involves a tradeoff: in general, for every byte of error correction capability added (or at least error correction with certainty), one byte of error detection capability is removed. It should be noted that some error correction might still be possible using fewer than two check blocks per byte, as will be described later.

The choice of how to apportion the detection and correction capability should be made ahead of time, as it makes assumptions on the maximum number of SDCs that may be present. When the number of SDCs exceeds the assumed maximum, the results can be unpredictable (i.e., the SDCs may still be detectable, possibly even correctable, but this cannot be guaranteed; instead, the SDCs may go undetected, or the wrong bytes may be corrected). Thus, with two check blocks, the choice can be made up front whether to be able to either (1) detect up to two errors, or (2) correct up to one error. Likewise, with three check blocks, the choice can be made up front to be able to either (1) detect up to three errors, or (2) correct up to one error or detect two errors. It should be noted that with choice (2), the outcome, namely correct up to one error or detect two errors, depends on whether there is at most one error or whether there are two errors, respectively, in the data. It should also be noted that with choice (2), it still may also be possible to correct two errors, but this cannot be guaranteed.

Likewise, with four check blocks, the choice can be made up front to be able to (1) detect up to four errors, (2) correct up to one error or detect two to three errors, or (3) correct up to two errors. It should be noted that correction of an error implicitly requires the detection of that error, so the term "correct" will be used synonymously with "detect and correct" throughout this disclosure. In general, for any M, the choice can be made up front to be able to do one of $$\left\lfloor \frac{M}{2} \right\rfloor + 1$$

possible capabilities: (1) detect up to M errors, (2) correct up to one error or detect two to M−1 errors, (3) correct up to two errors or detect three to M−2 errors, . . . , or $$\left(\left\lfloor \frac{M}{2} \right\rfloor + 1\right)$$

correct up to $$\left\lfloor \frac{M}{2} \right\rfloor$$

errors or detect $$\left\lceil \frac{M}{2} \right\rceil$$

errors (that is, $$\frac{M}{2}$$

rounded up), as will be described further below with reference to FIG. 13. As before, it still may be possible to correct up to M−1 errors, but this cannot be guaranteed, as will be described further below with reference to FIGS. 14-15.

Figure 13:
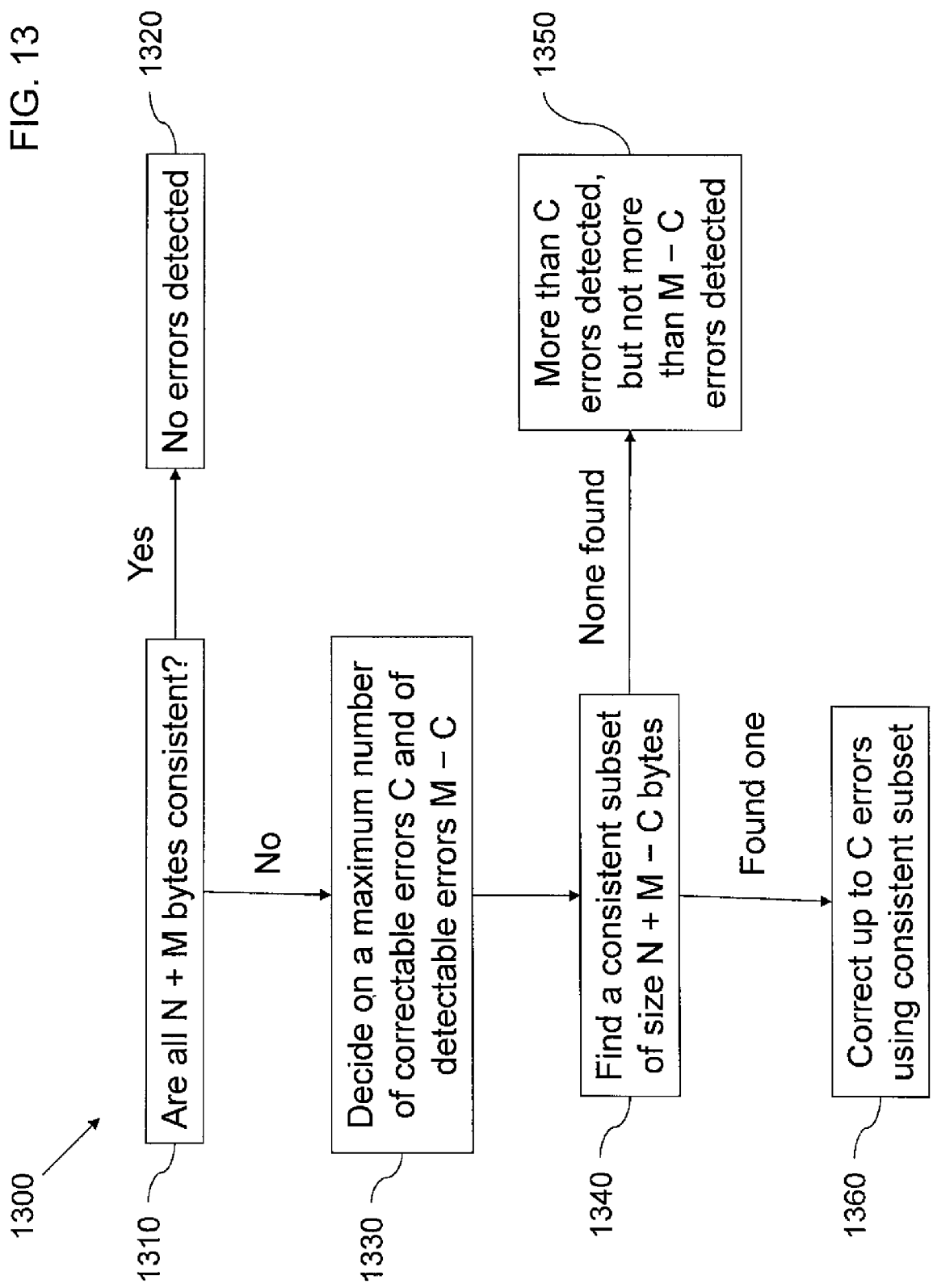

FIG. 13 illustrates an exemplary method 1300 for detecting and correcting errors according to an embodiment of the present invention.

Referring to FIG. 13, method 1300 assumes that there are N+M bytes distributed at the same byte position across all N+M blocks of a stripe. In step 1310, a check is made to see if the N+M bytes are consistent (using, for example, the consistency checking method 1200 of FIG. 12). If so, then processing proceeds to step 1320, and no errors have been detected. If not, then one or more SDCs have been detected, so processing proceeds to step 1330, where upper bounds on the maximum number of correctable errors C and detectable errors M−C are determined, where C≤M−C $$\left(\text{i.e., } C \geq \left\lfloor \frac{M}{2} \right\rfloor\right)$$

as discussed above. For example, these numbers may have been decided up front (i.e., predetermined), or they may be determined dynamically on a case-by-base basis. Method 1300 assumes that there are no more than M−C SDCs, for otherwise the results are unpredictable. Processing then proceeds to step 1340, where an attempt is made to correct up to C SDCs.

In further detail, in step 1340, every subset of size N+M−C bytes is tested for consistency (using, for example, method 1200) until a consistent subset is found. It should be noted that there are $$\binom{N+M}{N+M-C} = \binom{N+M}{C}$$

such subsets, though it may be possible to not test every one of them, as described later. It is guaranteed that if there are no more than C SDCs, there will be at least one such consistent subset. This is because at some point, a subset of size N+M−C bytes that excludes all of the (no more than C) SDCs will be picked. Since such a subset lacks any SDCs, it is consistent by construction. Furthermore, since there are no more than M−C SDCs in all N+M bytes (as assumed above), any subset of size N+M−C bytes can have no more than M−C SDCs in it. Since any such subset of size N+M−C bytes is also an erasure code of N+M−C bytes, it is consistent if and only if it has no SDCs.

If no such consistent subset of size N+M−C bytes is found, then processing proceeds to step 1350, where it is determined that more than C SDCs have been detected (had there been C or fewer SDCs, there would have been a consistent subset of size N+M−C bytes as discussed above). However, there can be no more than M−C SDCs (by assumption). Thus, between C+1 and M−C SDCs have been detected.

Otherwise, one such consistent subset has been found. Processing then proceeds to step 1360, where that subset is used to regenerate or reconstruct the missing C bytes, at least one of which will be different from the corresponding bytes in the original N+M bytes (otherwise the original N+M bytes would have been consistent), at which point up to C SDCs have been corrected.

As can be seen, it is possible to detect more SDCs than can be corrected. This follows from the consistency distance. Error detection can be thought of as starting from a consistent set of data and check bytes and injecting errors up to, but not including, the next closest consistent set of data and check bytes (i.e., up to distance M, as the next closest consistent set of data and check bytes is distance M+1). Error correction, on the other hand, can be thought of as starting from an inconsistent set of data and check bytes and correcting the fewest number of data and check bytes possible to reach the closest set of consistent data and check bytes. As there can be only one possible set of consistent data and check bytes within distance $$\left\lfloor \frac{M}{2} \right\rfloor$$

(otherwise there would be two different sets of consistent data and check bytes that were distance M or less apart, which cannot happen), any combination of up to $$\left\lfloor \frac{M}{2} \right\rfloor$$

SDCs is guarantees to be correctable (assuming that $$\left\lceil \frac{M}{2} \right\rceil$$

SDCs is an acceptable upper bound on the maximum number of SDCs that may be present).

Method 1200 of FIG. 12 provides a technique of consistency checking or pure error detection. Method 1300 of FIG. 13 expands upon this to incorporate a certain amount of error correction (at the expense of giving up a certain amount of error detection). Both methods are guaranteed to work given certain underlying assumptions (especially the maximum number of SDCs that may be present). Given a sufficient value for M, method 1200 will generally detect any number of random SDCs. As discussed earlier, random SDCs initially convert consistent data and check bytes into inconsistent data and check bytes, thus increasing their consistency distance. This consistency distance continues to grow and approaches or equals M as more random SDCs are introduced. Briefly, a random SDC is only going to be consistent with a given set of N bytes 1/256 of the time, for byte-size entries, and only 1/65,536 of the time for two-byte entries. That is, random SDCs likely make consistent data (or nearly consistent data) less consistent. This effect compounds with each random SDC, but is tempered somewhat by larger values of N and M (since this introduces more possible subsets to check for consistency, thus increasing the chance that one such consistent subset will be found).

Accordingly, the principle of detecting virtually any number of random SDCs can be extended somewhat into the notion of correcting more SDCs than $$\left\lfloor \frac{M}{2} \right\rfloor.$$

While the distance limits discussed above (especially in method 1300) provide guaranteed results, check bytes can be used to extend error correction conceivably as far as M−1 errors, as will now be explained with reference to FIG. 14.

Figure 14:
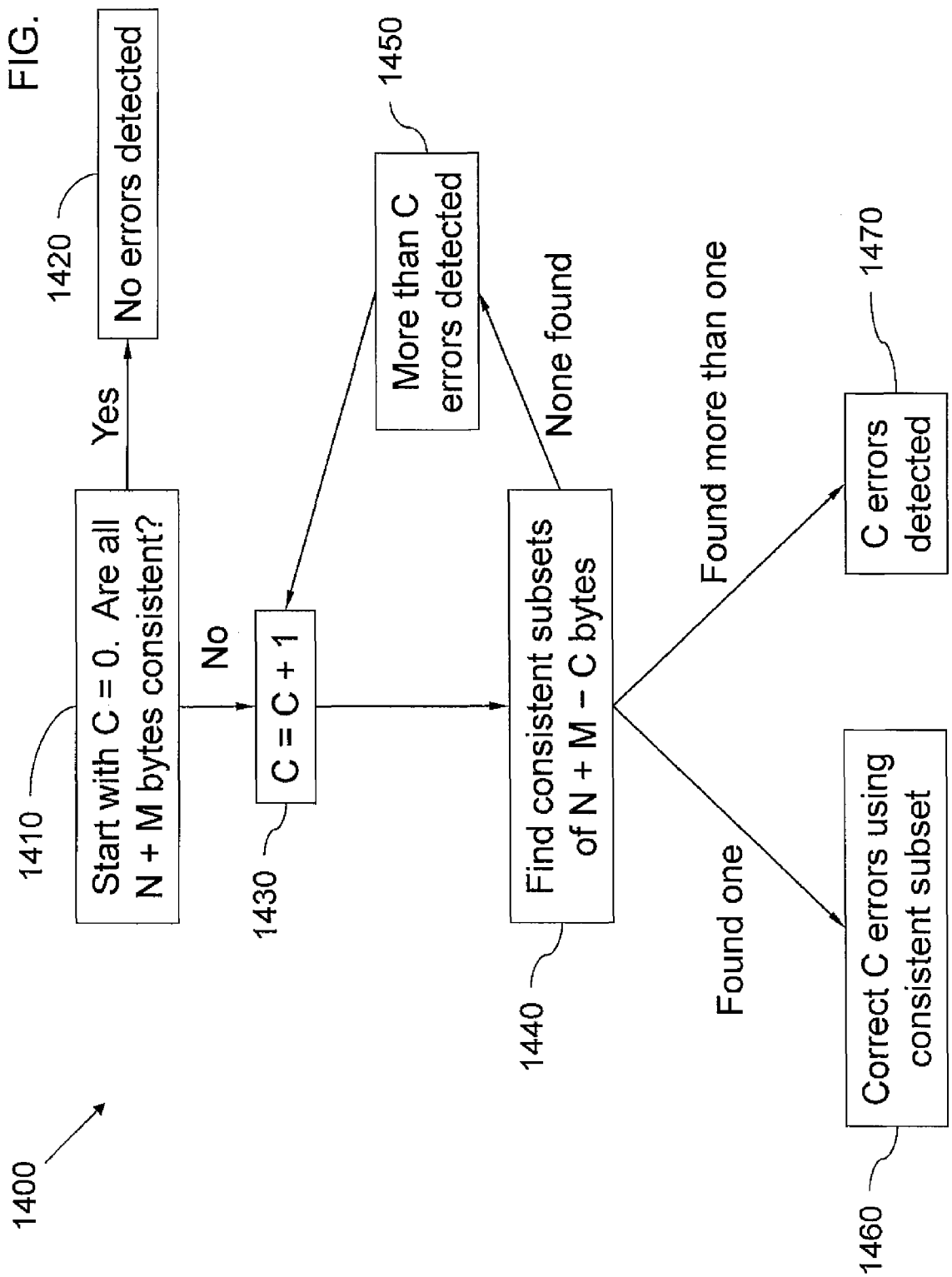

FIG. 14 illustrates an exemplary method 1400 for correcting errors according to an embodiment of the present invention.

Method 1400 increases or maximizes the chances of correcting data and check bytes with random SDCs when compared to, for example, method 1300 above. This correction capability comes at the expense of reducing or minimizing detection of SDCs, in that detection only takes place at the consistency distance, and then only when more than one solution presents itself. Method 1400 also determines the consistency distance of a set of data and check bytes.

Referring to FIG. 14, at step 1410, the number of errors (or consistency distance) C is initialized to 0, and a consistency check is made of the N+M bytes (using, for example, the consistency checking method 1200 of FIG. 12). If the data and check bytes are consistent, then processing proceeds to step 1420, and no SDCs are detected (i.e., the consistency distance C is 0). Otherwise, at least one SDC is detected, so processing proceeds to step 1430, where an attempt is made to correct the SDCs. In step 1430, the number of errors C is incremented by 1. Next, in step 1440, every subset of size N+M−C data and check bytes is tested for consistency. If none is found, the processing proceeds to step 1450, where it is determined that more than C SDCs have been detected. Accordingly, steps 1430 and 1440 are repeated (this time on smaller subsets of data and check bytes, i.e., larger values of the consistency distance C).

Otherwise, if in step 1440, a single consistent subset is found, then processing proceeds to step 1460, and that consistent subset is used to correct the C SDCs. Finally, if in step 1440, more than one consistent subset is found, then processing proceeds to step 1470, where it is determined that C SDCs have been detected, but correction is not possible (numerous solutions). At the conclusion of method 1400, C will be set to the consistency distance. Method 1400 is thus also a technique of determining the consistency distance.

Several shortcuts are possible in method 1400. For example, in step 1410, C can be initialized to a larger value to cut down the searching of larger subsets in step 1440. It should be noted though that C may no longer represent the consistency distance in such a case. It should also be noted that if C is initialized to a value larger than $$\left\lfloor \frac{M}{2} \right\rfloor - 1,$$

results may be unpredictable (for instance, multiple errors may be detected in place of identifying a unique set of corrections at the consistency distance). See, however, method 1500 in FIG. 15 below. In addition, in step 1440, the check for multiple consistent subsets can be bypassed if $$C \leq \left\lfloor \frac{M}{2} \right\rfloor$$

(that is, processing can proceed directly to step 1460 once any consistent subset is found). If $$C > \left\lfloor \frac{M}{2} \right\rfloor$$

in step 1440, then processing can go to step 1470 as soon as a second consistent subset is found. Further, in step 1430, once C=M, processing can proceed directly to step 1470, as the largest consistency distance M has already been determined, to which there are numerous possible sets of corrections.

Depending on the data, method 1400 can correct as many as M−1 SDCs. As a simple case, consider N=2 and M=3. If two random SDCs are injected into a set of 5=2+3 data and check bytes, they can be detected by method 1200 or method 1300. However, there is no guarantee that they can be corrected, since $$2 > \left\lfloor \frac{3}{2} \right\rfloor = 1.$$

Since there are only $$\binom{5}{3} = 10$$

possible subsets of three bytes to check for consistency, and one is guaranteed to be consistent (namely, the subset that does not include either of the two SDCs), that leaves 9 possible subsets that may also be consistent. Roughly speaking, there is a 1 in 256 chance that any one of these subsets is consistent, given random SDCs. Thus, about 96.5% of the time, i.e., $$1 - \left(\frac{255}{256}\right)^9,$$

these 9 subsets will all be inconsistent, and method 1400 will be able to correct the two errors.

Figure 15:
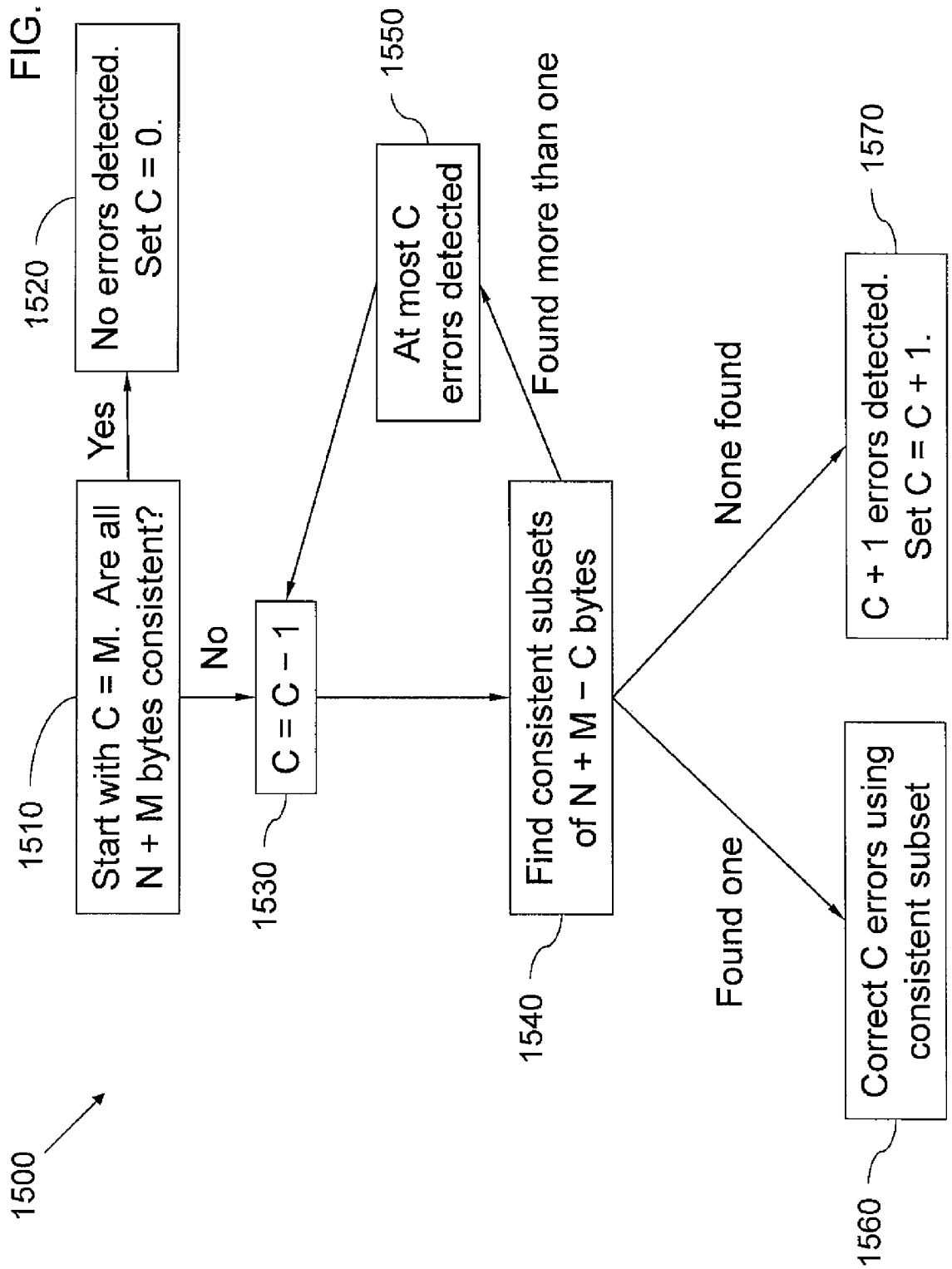

FIG. 15 illustrates an exemplary method 1500 for correcting errors according to another embodiment of the present invention.

Method 1500 is similar to method 1400 above. However, instead of starting the search for a consistent set of data and check bytes from the initial set of data and check bytes and fanning outward (as in method 1400), method 1500 starts searching from the maximum detectable consistency distance (i.e., M) and collapsing inward. As in method 1400, this correction capability comes at the expense of reducing or minimizing detection of SDCs, in that detection only takes place at the consistency distance, and then only when more than one solution presents itself. Like method 1400, method 1500 also determines the consistency distance of a set of data and check bytes.

Referring to FIG. 15, at step 1510, the number of errors (or consistency distance) C is initialized to M, representing the maximum number of detectable SDCs. While the main loop of method 1500 (i.e., steps 1530-1550) could be entered at this point, when the N+M data and check bytes are already consistent, this would lead to the unnecessary consistency checking of many subsets of more than N data and check bytes. Accordingly, as with method 1400, an initial consistency check is made of the N+M bytes (using, for example, the consistency checking method 1200 of FIG. 12). If all N+M data and check bytes are consistent, then processing proceeds to step 1520, and no SDCs are detected (i.e., the consistency distance is 0, so C should be set to 0 if C is returning the consistency distance). This check thus bypasses the processing of the main loop (steps 1530-1550) for the straightforward case of all N+M bytes being consistent.

On the other hand, if in step 1510, not all N+M data and check bytes are consistent, then at least one SDC is detected, so processing proceeds to step 1530, where an attempt is made to correct the SDCs. In step 1530, the number of (correctable) errors C is decremented by 1. Thus, on the first iteration of the main loop (steps 1530-1550), C=M−1, representing the maximum number of correctable SDCs. Next, in step 1540, every subset of size N+M−C data and check bytes is tested for consistency. If more than one are found, the processing proceeds to step 1550, where it is determined that at most C SDCs have been detected. Accordingly, steps 1530 and 1540 are repeated (this time on larger subsets of data and check bytes, i.e., smaller values of the consistency distance C).

Otherwise, if in step 1540, a single consistent subset is found, then processing proceeds to step 1560, and that consistent subset is used to correct the C SDCs. Finally, if in step 1540, no consistent subset is found, then processing proceeds to step 1570, where it is determined that C+1 SDCs have been detected, but correction is not possible (numerous solutions). If C is returning the consistency distance, then C should be set to C+1 in this case.

In practice, in step 1540, it may not be necessary to test every subset of size N+M−C data and check bytes for consistency. Once two such subsets have been found, processing can go directly to step 1550. This speeds up the processing for step 1540 when there are few SDCs in the data and check bytes, as there will be numerous consistent subsets in such a case, which hastens the time it takes to find any two such subsets.

While larger values of M and N may decrease the likelihood of correcting M−1 SDCs (since they introduce more subsets to check), this can be offset in one (or more) of several ways. For example, using two-byte (or larger) entries greatly reduces the likelihood of random SDCs producing consistent subsets. With two-byte entries, when correcting M−1 random SDCs, there is only a 1 in 65,536 chance that a subset with SDCs will be consistent. Increasing the element size also improves the encryption capability, as it increases the number of possible check rows in the check matrix, and it grows the size of each factor in the check matrix (making it that much harder to decrypt). As another example, correcting fewer SDCs (than M−1), such as M−2 or M−3, yet still more than $$\left\lfloor \frac{M}{2} \right\rfloor,$$

significantly increases the chance of success because it becomes increasingly less likely that such subsets will be consistent. This is because, while with M−1 SDCs, the subset has to randomly match one byte to be consistent (a 1 in 256 chance), it has to match two bytes (1 in 65,536) or three bytes (1 in 16,777,216) to be consistent when correcting M−2 errors or M−3 errors, respectively. As with RAID storage, then, increasing the number of check bytes (i.e., increasing M) may be a sure way of securing more data integrity in the face of random SDCs.

The decisions of how many (internal) check blocks to use, of how large to make the elements, and of how many errors to be able to detect versus how many to be able to correct are design tradeoffs and may depend on system design features (such as available system resources and reliability, or whether there is another way to recover the corrupted data, etc.)

Data Compression and Decompression

As discussed briefly earlier, the same techniques (such as methods 1300, 1400, and 1500) used for error correction can also be used to compress the data bytes in a cache. The basic idea is to identify sets of data bytes that are either the same or very similar, and store such sets of data bytes only once, relying on the corresponding check bytes (which are stored regardless) to recover the correct data bytes from a similar set of data bytes through error correction as discussed above.

Figure 16:
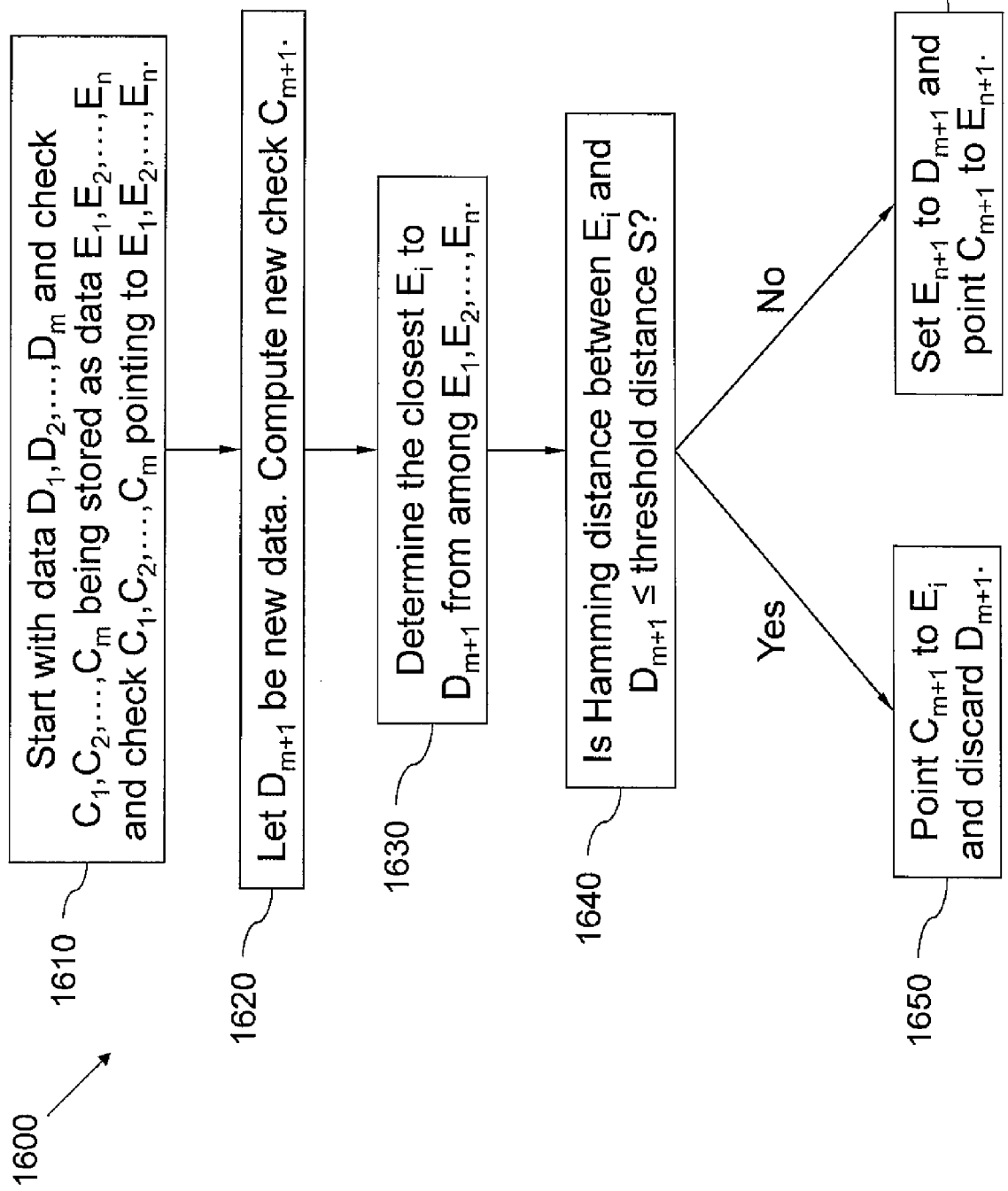

FIG. 16 illustrates an exemplary method 1600 of compressing data according to an embodiment of the present invention. It is assumed that a cache includes sets of data and check bytes as defined above, with the data bytes being compressed.

Referring to FIG. 16, method 1600 begins at step 1610, where m sets of data and check bytes are stored in the cache. These can be thought of as m sets of data bytes $D_1, D_2, \ldots, D_m$ and a corresponding m sets of check bytes $C_1, C_2, \ldots, C_m$. All m sets of check bytes $C_1, C_2, \ldots, C_m$ are stored in the cache. However, only n sets of data bytes $E_1, E_2, \ldots, E_n$ are stored in the cache, where n≤m and $\{E_1, E_2, \ldots, E_n\} \subseteq \{D_1, D_2, \ldots, D_m\}$. Each set of check bytes $C_1, C_2, \ldots, C_m$ points (i.e., directly points) to one of the sets of data bytes $E_1, E_2, \ldots, E_n$, but it is not necessarily a one-to-one correspondence. In fact, the more sharing that takes place (i.e., multiple sets of check bytes pointing to the same set of data bytes), the better the compression.

Each set of check bytes $C_j$ is paired with a set of data bytes $E_i$ in the cache, but the combination is not necessarily a consistent set of data and check bytes (i.e., an uncompressed pairing, where the corresponding data bytes $D_j$ are the same as the data bytes $E_i$). Rather, it can be an inconsistent set of data and check bytes, but one that can be corrected to a consistent set using, for example, the above methods 1300, 1400, or 1500 for error correction (i.e., a compressed pairing, where the corresponding data bytes $D_j$ are different from the data bytes $E_i$, and an error correction operation is needed to restore the desired data bytes $D_j$ from the stored data bytes $E_i$). While the type of pairing (uncompressed or compressed) can be detected by determining if the data bytes $E_i$ and check bytes $C_j$ are consistent, to save computation, the type of pairing (uncompressed or compressed) can also be stored with the check bytes $C_j$ and the pointer to the data bytes $E_i$.

In step 1620, a new set of data bytes $D_{m+1}$ is to be stored in the cache, i.e., become the (m+1)th set of data and check bytes in the cache. The corresponding check bytes $C_{m+1}$ are computed and stored in the cache.

In step 1630, $D_{m+1}$ is compared against each of $E_1, E_2, \ldots, E_n$, and the $E_i$ having the smallest Hamming distance to $D_{m+1}$ (i.e., the set of data bytes that is closest to $D_{m+1}$) is chosen. If there are multiple such closest sets of data bytes, then $E_i$ can represent any one of them. In other embodiments, different criteria can be used to choose such a representative $E_i$.

In step 1640, it is determined whether it will suffice to use $E_i$ to store $D_{m+1}$. That is, is $E_i$ close enough to $D_{m+1}$ that $E_i$ can be used to store $D_{m+1}$, relying on the check bytes $C_{m+1}$ to correct any differing bytes between $E_i$ and $D_{m+1}$? In other words, is the combination of data bytes $E_i$ and check bytes $C_{m+1}$, even though it may represent an inconsistent set of data and check bytes, nonetheless correctable to restore $D_{m+1}$? One way of making this determination is to see if the Hamming distance between $E_i$ and $D_{m+1}$ is ≤some threshold distance S. For example, if $$S \leq \left\lfloor \frac{M}{2} \right\rfloor,$$

then it is guaranteed that the inconsistent set of data and check bytes $E_i$ and $C_{m+1}$ can be corrected to the consistent set of data and check bytes $D_{m+1}$ and $C_{m+1}$. S may also be chosen to be smaller than $$\left\lfloor \frac{M}{2} \right\rfloor,$$

for example, it some amount of error detection and/or correction is desired with the compression.

In step 1650, if the Hamming distance between $E_i$ and $D_{m+1}$ is ≤S, then the data bytes $D_{m+1}$ do not need to be stored in the cache. Instead, the check bytes $C_{m+1}$ are pointed to $E_i$ (and error correction logic can be used to recreate $D_{m+1}$ from $E_i$ and $C_{m+1}$). This improves the compression of the cache. If $E_i$ and $D_{m+1}$ are the same (i.e., Hamming distance 0), the pairing is uncompressed (that is, no decompression needed). Otherwise, the pairing is compressed, and an error correction operation (that is, one level of error correction) is needed to restore (decompress) $D_{m+1}$ from $E_i$.

On the other hand, in step 1660, if the Hamming distance between $E_i$ and $D_{m+1}$ is >S, then the data bytes $D_{m+1}$ are stored in the cache. That is, a new data entry $E_{n+1}$ is created, $D_{m+}$ is stored in $E_{n+1}$, and the check bytes $C_{m+1}$ are pointed to $E_{n+1}$. In this case, the pairing is uncompressed (no decompression needed).

In method 1600, $$S \text{ is a threshold value} \leq \left\lfloor \frac{M}{2} \right\rfloor.$$

Accordingly, the error correction can follow method 1300 above. For even better compression, however, an error correction technique closer to that of method 1400 or 1500 can be employed, as described below with reference to FIG. 17. In such a case, a fixed threshold S would not be provided. Rather, the check bytes would be pointed to any set of data bytes from which the resulting combination of (inconsistent) data bytes and check bytes could be error corrected back to the desired data bytes.

As a possible enhancement to step 1630, a special check for duplicates (i.e., a new set of data bytes $D_{m+1}$ that matches an existing set of data bytes in the cache) can be made by comparing the new set of check bytes $C_{m+1}$ against the existing sets of check bytes $C_1, C_2, \ldots, C_m$. A mismatch guarantees that the data bytes are different, while a match indicates a high likelihood of a duplicate set of data bytes (by taking advantage of the hashing properties of the erasure code encoding). Accordingly, matches can then be specifically tested for duplicates with the corresponding existing set of data bytes in the cache (by comparing the existing set of data bytes with the new set of data bytes), with appropriate pointers and indicators (uncompressed or compressed) assigned to the check bytes $C_{m+1}$ if a duplicate is found. Since the number of check bytes is likely to be smaller (or significantly smaller) than the number of data bytes, this technique of duplicate checking (i.e., comparing check bytes) can be considerably faster than comparing all the data bytes when there is a high likelihood of duplicates in the sets of data bytes.

In one exemplary embodiment, the check byte testing for duplicates includes only testing a subset of the check bytes, such as those corresponding to one check block (or check disk). Further, the checking of a particular existing set of data bytes (including its corresponding check bytes) can be stopped as soon as a mismatch is found, as in such a case, the existing set of data bytes cannot be the same as the new set of data bytes.

Figure 17:
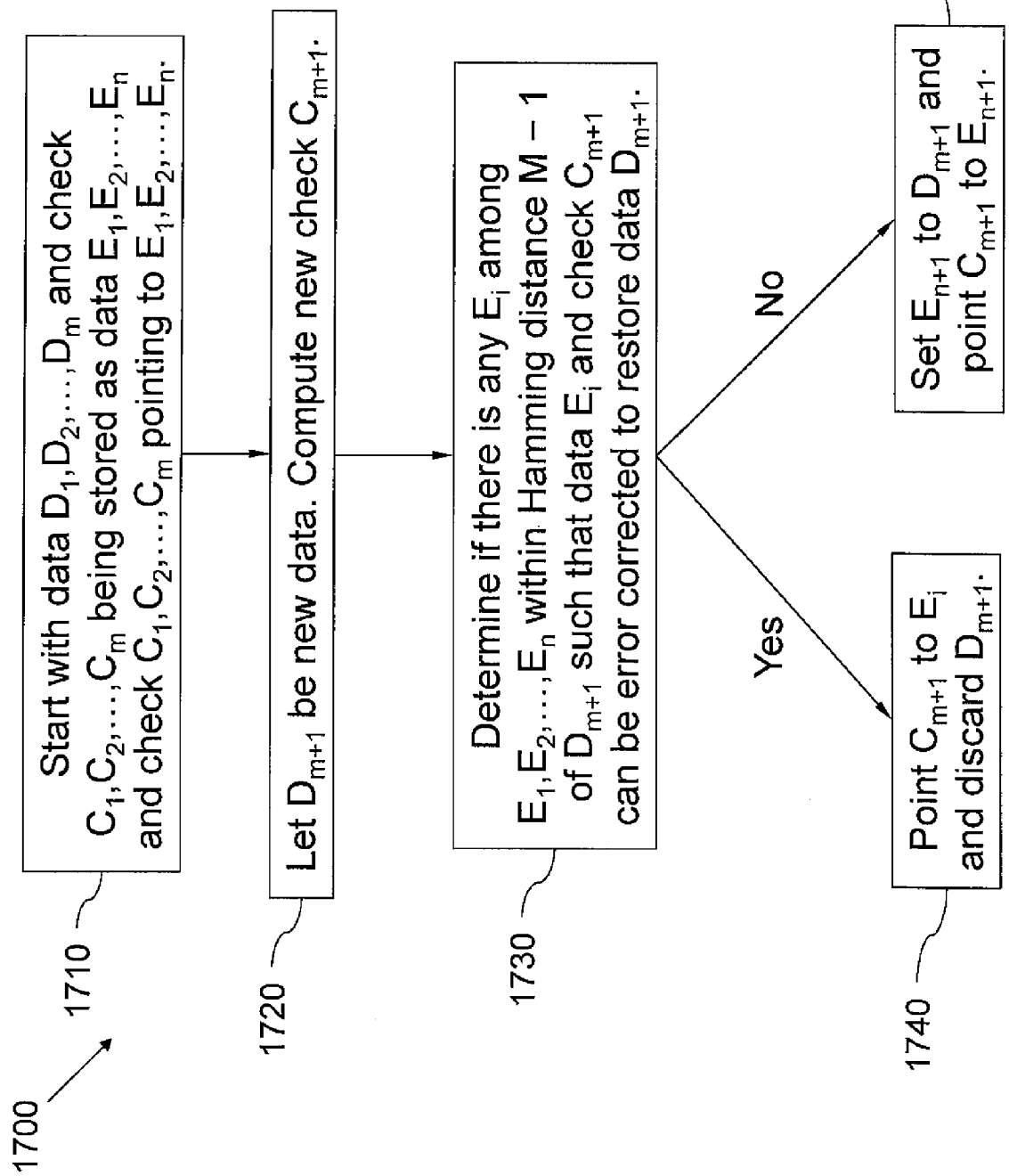

FIG. 17 illustrates an exemplary method 1700 of compressing data according to another embodiment of the present invention.

Referring to FIG. 17, in method 1700, steps 1710 and 1720 are similar to steps 1610 and 1620, respectively, of method 1600 above. Accordingly, a detailed description of them will not be repeated. In step 1730, however, $E_1, E_2, \ldots, E_n$ are searched for any set of data bytes $E_i$ that are within a Hamming distance M−1 of $D_{m+1}$ and that can be combined with check bytes $C_{m+1}$ to produce a possibly inconsistent set of data and check bytes but that can be "error corrected" (using an approach similar to method 1400 or 1500) to the consistent set of data bytes $D_{m+1}$ and check bytes $C_{m+1}$. If there are multiple such sets of data bytes, then $E_i$ can represent any one of them (e.g., the first one found).

In step 1740, if there is such a set of data bytes $E_i$, then the data bytes $D_{m+1}$ do not need to be stored in the cache. Instead, the check bytes $C_{m+1}$ are pointed to $E_i$ (and error correction logic can be used to recreate $D_{m+1}$ from $E_i$ and $C_{m+1}$). This further improves the compression of the cache compared to method 1600.

Otherwise, in step 1750, if no such set of data bytes $E_i$ is found, then the data bytes $D_{m+1}$ are stored in the cache. That is, a new data entry $E_{n+1}$ is created, $D_{m+1}$ is stored in $E_{n+1}$, and the check bytes $C_{m+1}$ are pointed to $E_{n+1}$.

Method 1700 thus increases the compression in the cache compared to method 1600. It should be noted that when in step 1730, when searching for $E_i$ and using method 1400 or 1500 to check out $E_i$, it suffices to search only the subsets of data bytes (and not the subsets of data and check bytes), as the check bytes $C_{m+1}$ can be assumed to be correct in this compression embodiment. That is, the check bytes $C_{m+1}$ are being used for compression, not actual error correction in the data. This significantly cuts down on the search time and increases the likelihood of finding a unique solution with method 1400 or 1500 above. In other embodiments, for example, where error detection and correction as well as compression are desired, this shortcut may not apply. In still other embodiments, it may be desirable to select the $E_i$ (or one such $E_i$) having the least Hamming distance to $D_{m+1}$.

Figure 18:
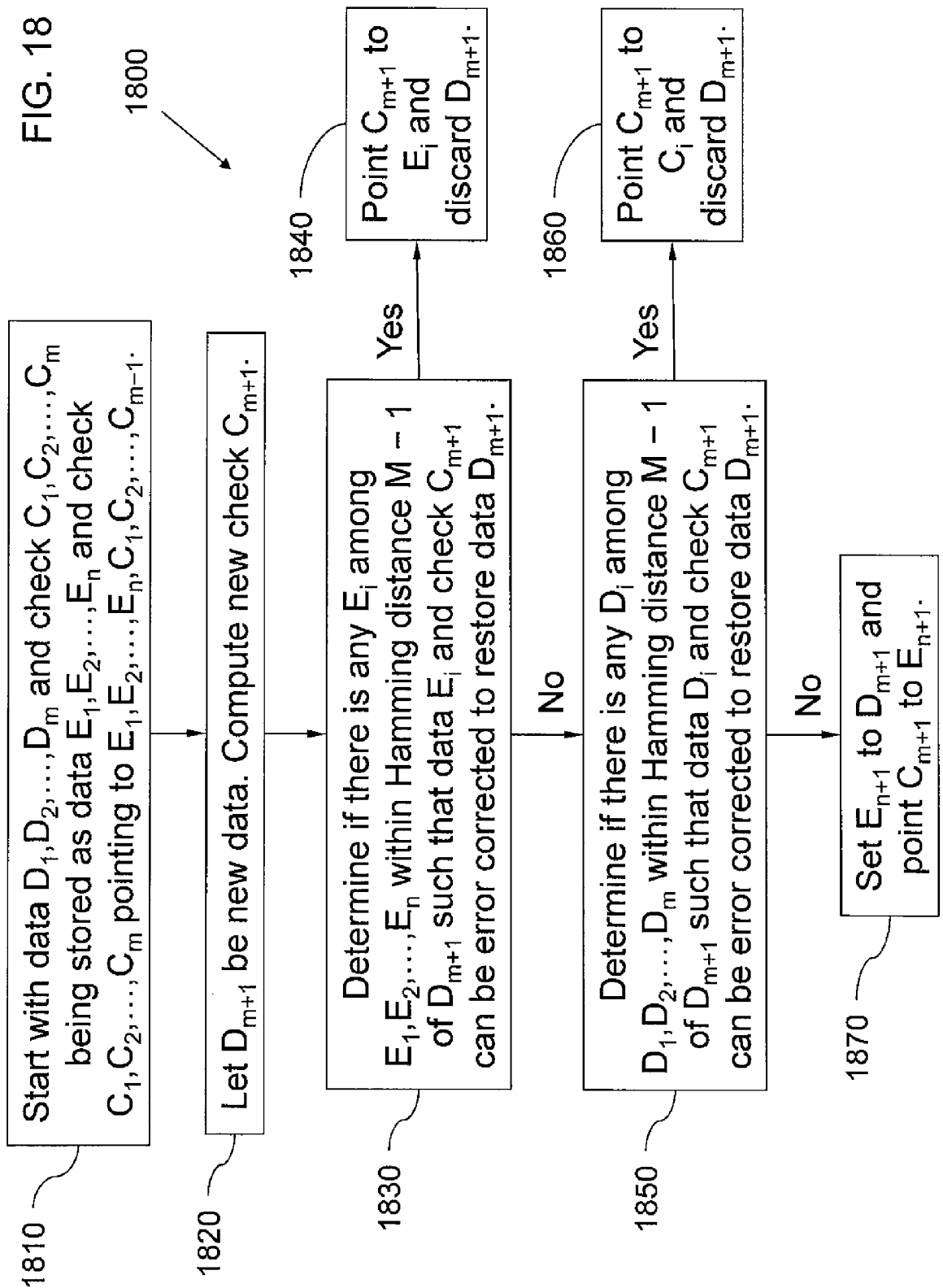

As discussed briefly above, the compression technique can be even further extended by considering already compressed data in the cache. FIG. 18 illustrates an exemplary method 1800 of compressing data according to yet another embodiment of the present invention.

Referring to FIG. 18, method 1800 differs from methods 1600 and 1700 above in that each of the sets of check bytes $C_2, C_3, \ldots, C_m$ can also point to one of the other sets of check bytes $C_1, C_2, \ldots, C_{m-1}$ instead of one of the data bytes $E_1, E_2, \ldots, E_n$. In this sense, such a set of check bytes will be said to indirectly point to one of the sets of data bytes $E_1, E_2, \ldots, E_n$ (via one or more intermediate sets of check bytes $C_1, C_2, \ldots, C_{m-1}$). Steps 1810, 1820, 1830, and 1840 are otherwise similar to steps 1710, 1720, 1730, and 1740 of method 1700 above.

In method 1800, when a set of check bytes, say $C_j$, points to another set of check bytes, say $C_i$, it means that the set of data bytes $D_j$ is close enough to the data bytes $D_i$ that any differing bytes can be corrected (through error correction) by using the check bytes $C_j$. That is, the set of possibly inconsistent data bytes and check bytes $D_i$ and $C_j$ is correctable to the consistent set of data and check bytes $D_j$ and $C_j$. This is similar to the approach used in steps 1830 and 1840 for data bytes $E_i$, only some additional indirection may be introduced by having to produce (i.e., decompress) the data bytes $D_i$. In other words, the data bytes $D_i$ may have to be decompressed from one of the sets of data bytes $E_1, E_2, \ldots, E_n$ or from another one of the sets of data bytes $D_1, D_2, \ldots, D_m$ (i.e., through another level of error correction), depending on whether $C_i$ points to one of $E_1, E_2, \ldots, E_n$ or to another one of $C_1, C_2, \ldots, C_m$.

Though the number of levels of error correction in method 1800 can be determined by following the data bytes' pointers and decompressing intermediate sets of data bytes, to save such calculations, the number of levels of error correction can be stored with the data bytes' pointer (in place of the simple indicator, uncompressed or compressed, used in methods 1600 and 1700). In this case, an uncompressed pairing can be represented by the number 0, a compressed pairing as defined in methods 1600 and 1700 can be represented by the number 1 (i.e., one level of error correction), and, in general, a number l can represent the number of levels of error correction needed to restore the desired data bytes $D_j$ from those pointed to by the check bytes $C_j$. l thus represents the level of indirection, or number of levels of error correction needed to decompress the desired data bytes from the stored data bytes.

In further detail, in step 1850, if there is no such $E_i$ that can be combined with $C_{m+1}$ to produce a possibly inconsistent set of data and check bytes $E_i$ and $C_{m+1}$ that can be corrected through error correction to the consistent set of data and check bytes $D_{m+1}$ and $C_{m+1}$, then at least two levels of error correction are needed to pair the new data bytes $D_{m+1}$ with the stored data bytes. A search is made through the sets of data bytes $D_1, D_2, \ldots, D_m$ (possibly requiring decompression of already compressed data bytes) for such a set of data bytes $D_i$ that can be combined with check bytes $C_{m+1}$ to produce a possibly inconsistent set of data and check bytes $D_i$ and $C_{m+1}$ that can be error corrected to the consistent set of data and check bytes $D_{m+1}$ and $C_{m+1}$. This search can be performed several ways, for example, finding the first such set of data bytes $D_i$, or starting the searching with the sets of data bytes that require the fewest levels of error correction to decompress, or only examining sets of data bytes whose number of levels of error correction is below a maximum number (e.g., a predefined maximum number) of error correction levels.

In step 1860, if there is such a set of data bytes $D_i$, then the data bytes $D_{m+1}$ do not need to be stored in the cache. Instead, the check bytes $C_{m+1}$ are pointed to $D_i$ (and error correction logic can be used to recreate $D_{m+1}$ from $D_i$ and $C_{m+1}$). This further improves the compression of the cache compared to methods 1600 and 1700. If $D_i$ and $D_{m+1}$ are the same, then $C_{m+1}$ can point to the same set of data bytes that $C_i$ points to (and has the same number of levels of error correction). Otherwise, an additional error correction operation (that is, one more level of error correction) is added to restore (decompress) $D_{m+1}$ from $D_i$.

On the other hand, in step 1870, if no such set of data bytes $D_i$ is found, then the data bytes $D_{m+1}$ are stored in the cache. That is, a new data entry $E_{n+1}$ is created, $D_{m+1}$ is stored in $E_{n+1}$, and the check bytes $C_{m+1}$ are pointed to $E_{n+1}$. In this case, the pairing is uncompressed (no levels of error correction needed).

In one exemplary embodiment, the number of levels l of error correction is maintained along with the pointer to the set of data bytes. l can be used to used, for example, to make it more efficient to find an existing set of data bytes in the cache that is similar to a new set of data bytes to be added to the cache. For example, searching for a candidate set of data bytes can begin with those sets of data bytes having l=0 (i.e., stored uncompressed in the cache without any error correction needed), then moving to l=1 if no such set is found that is close enough to the new set of data bytes, etc. For another example, l can be limited to a maximum value (such as 2 or 3), to limit the number of levels of error correction (decompression) needed to recreate the actual data.

In each of the compression methods 1600, 1700, and 1800 above, all of the check bytes are stored in the cache. However, if the check bytes are being used for compression and not error correction or detection, then it is not necessary to store the check bytes of the data whose original data bytes are being stored in the cache. An embodiment of this is described with reference to FIG. 19.

Figure 19:
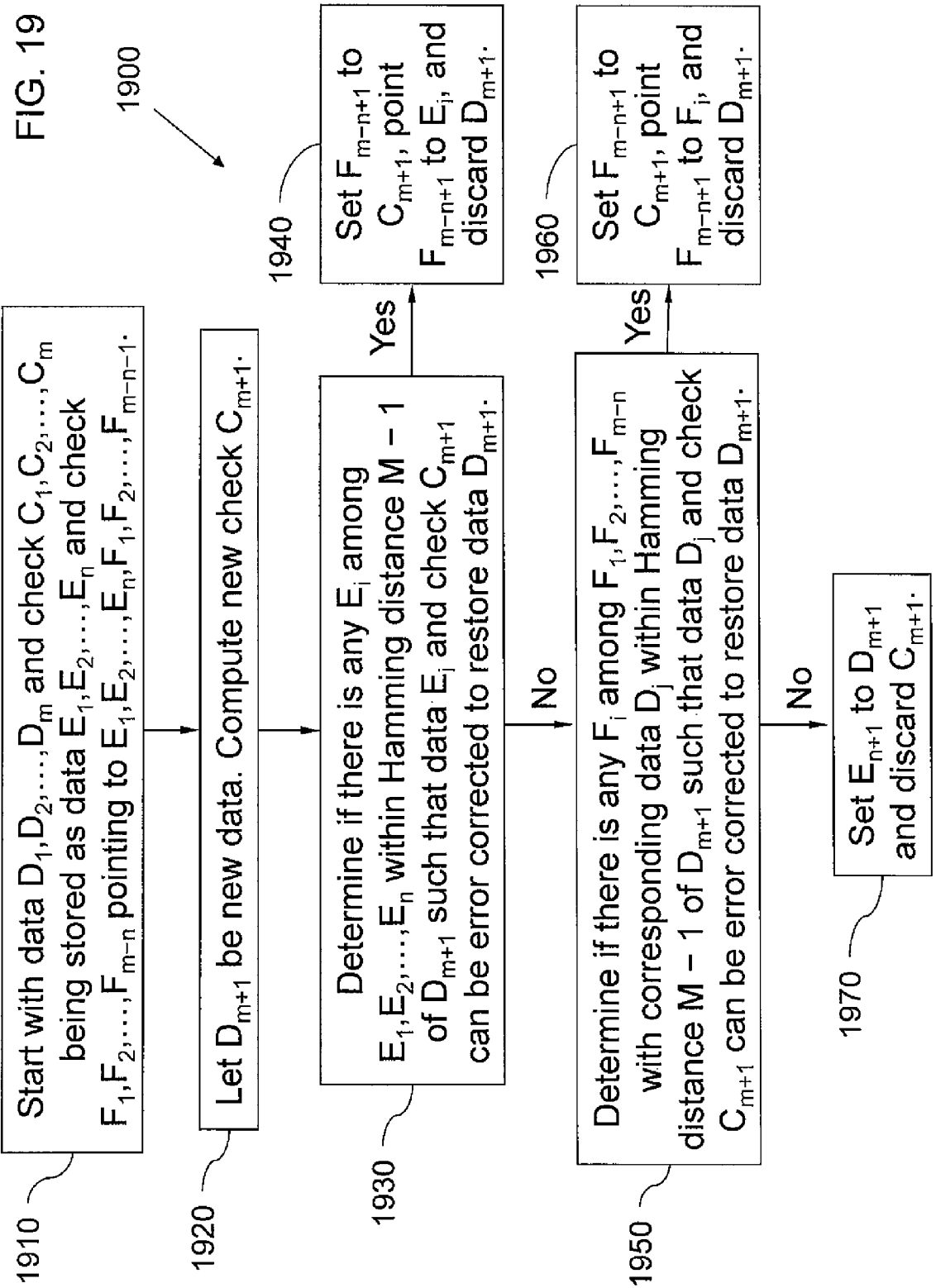

FIG. 19 illustrates an exemplary method 1900 of compressing data according to still yet another embodiment of the present invention.

Method 1900 is fashioned after method 1800 above, with steps 1910-1970 being similar to steps 1810-1870, respectively. Accordingly, only differences between the two methods will be highlighted. In step 1910, only some of the sets of check bytes $C_1, C_2, \ldots, C_m$ are stored in the cache, namely $F_1, F_2, \ldots, F_{m-n}$ that is, the m−n sets of check bytes that need decompression (i.e., l≥1) with one of the sets of data bytes $E_1, E_2, \ldots, E_n$ (and intermediate data sets when l≥2) to recover their corresponding original data bytes. The corresponding n sets of check bytes that do not need decompression with their sets of data bytes $E_1, E_2, \ldots, E_n$ are reconstructable from their corresponding data bytes. Accordingly, these sets of check bytes are not stored in the cache. Thus, each of the in sets of data bytes $D_1, D_2, \ldots, D_m$ and corresponding check bytes $C_1, C_2, \ldots, C_m$ is stored either as one of the sets of data bytes $E_1, E_2, \ldots, E_n$ (i.e., without compression) or as one of the sets of check bytes $F_1, F_2, \ldots, F_{m-n}$ that needs decompression with one of the sets of data bytes (and possible intermediate data sets).

If in step 1930, it is determined that there is a set of data bytes $E_i$ among the sets of data bytes $E_1, E_2, \ldots, E_n$ that is within Hamming distance M−1 of the new set of data bytes $D_{m+1}$ such that the set of data bytes $E_i$ and the new set of check bytes $C_{m+1}$ can be error corrected to restore the data bytes $D_{m+1}$, then in step 1940, the next set of check bytes $F_{m-n+1}$ is set to the check bytes $C_{m+1}$, $F_{m-n+1}$ is pointed to $E_i$ and the data bytes $D_{m+1}$ are discarded. Otherwise, in step 1950, if it is determined that there is a set of check bytes $F_i$ among the sets of check bytes $F_1, F_2, \ldots, F_{m-n}$ and that corresponds to the set of data bytes $D_j$ among the sets of data bytes $D_1, D_2, \ldots, D_m$, such that $D_j$ is within Hamming distance M−1 of the new set of data bytes $D_{m+1}$ and the set of data bytes $D_j$ and the new set of check bytes $C_{m+1}$ can be error corrected to restore the data bytes $D_{m+1}$, then in step 1960, the next set of check bytes $F_{m-n+1}$ is set to the check bytes $C_{m+1}$, $F_{m-n+1}$ is pointed to $F_i$, and the data bytes $D_{m+1}$ are discarded. Otherwise, in step 1970, the next set of data bytes $E_{n+1}$ is set to the data bytes $D_{m+1}$ and the check bytes $C_{m+1}$ are discarded.

Exemplary Hardware or Software Logic

Figure 20:
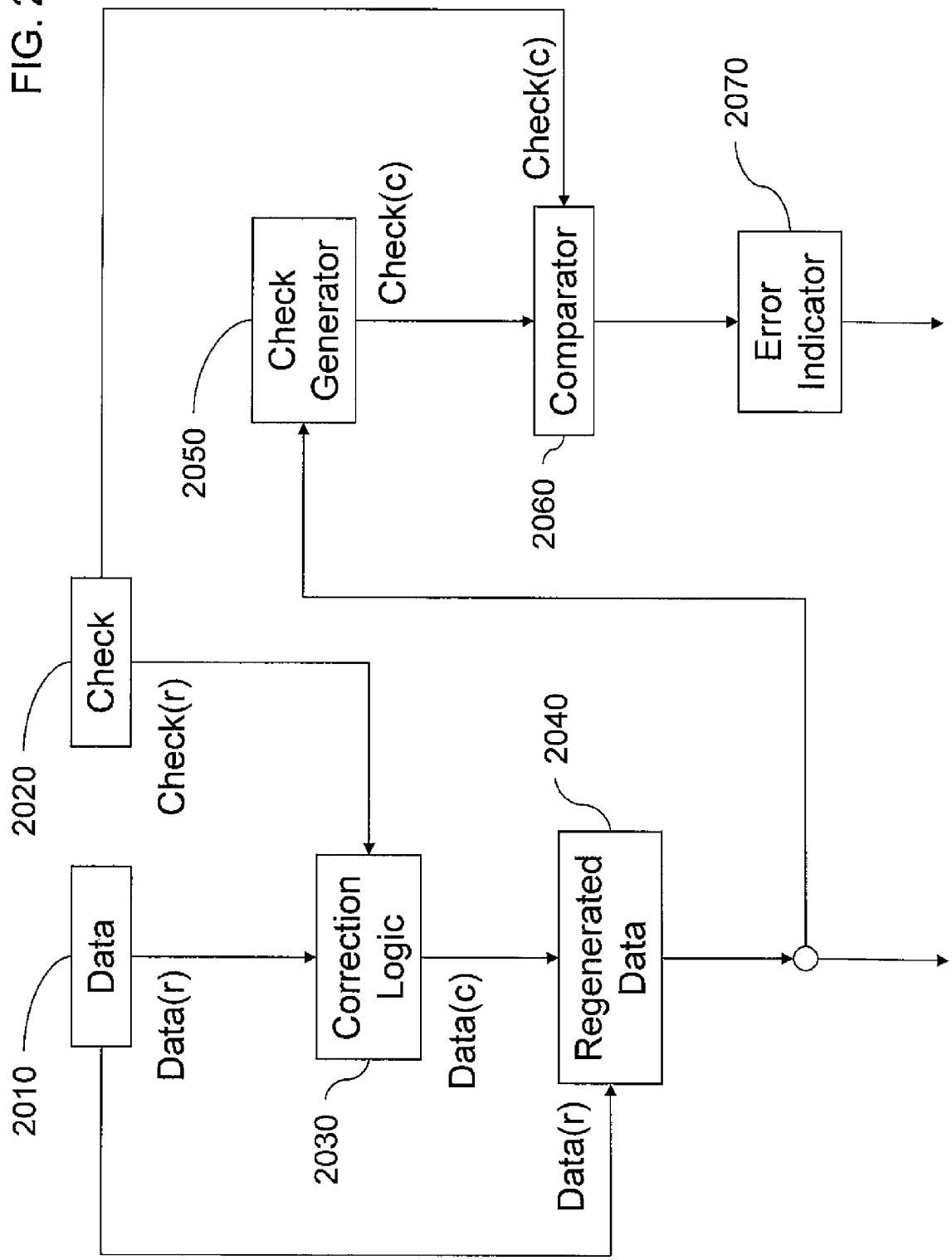

FIG. 20 illustrates exemplary hardware or software logic for implementing the error detecting and correcting logic according to an embodiment of the present invention.

FIG. 20 shows a process used to simultaneously correct and validate a data stream including N data bytes ("Data") and M check bytes ("Check"), where C errors are attempting to be corrected. FIG. 20 corresponds to the consistency checking done in method 1200, and in particular to the consistency checking done in steps 1340, 1440, and 1540 of methods 1300, 1400, and 1500 respectively. In these steps, a subset of size N+M−C (data and check) bytes is selected to see if it is consistent. The other C bytes are assumed to be SDCs and ignored in the testing of this subset. FIG. 20 shows an example embodiment of the steps needed to perform this consistency checking on a single subset of size N+M−C bytes. Accordingly, it may be necessary to perform the routine in FIG. 20 as many as $$\binom{N+M}{C}$$

times for each value of C being tested (i.e., once for each subset of size N+M−C bytes).

Let R represent the number of data bytes present in the subset of size N+M−C data and check bytes. Further, let Data(r) denote these R data bytes, and Data(c) denote the other N−R data bytes (that are not part of the subset). This leaves N+M−C−R check bytes in the subset. Split these N+M−C−R check bytes into two groups, Check(r) and Check(c), where Check(r) includes any N−R of these check bytes (the precise ones are unimportant) and Check(c) includes the remaining M−C of these check bytes. Check(r) is used with Data(r) to regenerate Data(c), while Check(c) is used to verify that this regeneration is correct.

In further detail, and referring to FIG. 20, Data 2010 provides Data(r) and Check 2020 provides Check(r) to Correction Logic 2030. Data(r) and Check(r) make up N bits of an erasure code, so can be used to regenerate Data(c) in Correction Logic 2030 (using erasure code correction of known byte locations). The regenerated Data(c) is then combined with Data(r) to form Regenerated Data 2040, which represents the corrected data stream if this particular subset contains consistent data. To verify the consistency, Regenerated Data 2040 is input to Check Generator 2050 (which generates the check data for this erasure code from the original data) to generate a copy of Check(c). This copy of Check(c) is input to Comparator 2060 together with the stored copy of Check(c). Error Indicator 2070 then indicates if the generated Check(c) is the same as the stored Check(c), that is, Error Indicator indicates if this subset of N+M−C data and check bytes is consistent. If so, then Regenerated Data 2040 represents the corrected data bytes (from which any incorrect check bytes can be generated using Check Generator 2050).

Thus, separating check bytes into two types, namely Check (r) for regenerating missing or presumed incorrect data bytes Data(c), and Check(c) for checking the correctness of the resulting data byte regeneration provides useful features. For example, on a system without SDCs, both the original data and the reconstructed data can be validated as correct. Further, on a system with multiple SDCs, the SDCs can be detected and different combinations of data and check bytes can be tested until a correct (i.e., consistent) combination is found, resulting in the ability to correct up to M−1 SDCs in the process.

Figure 21:
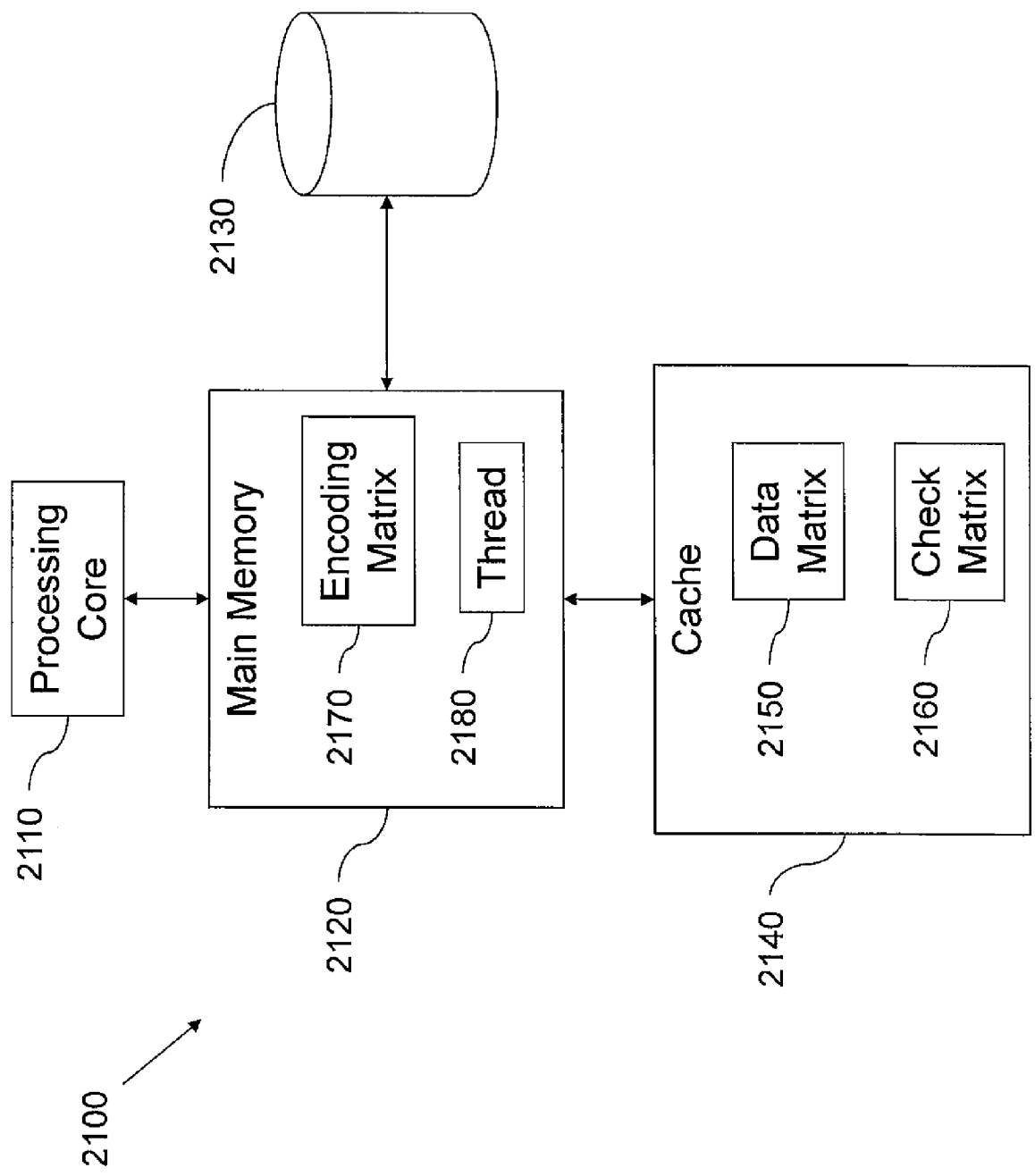

FIG. 21 illustrates an exemplary system 2100 for implementing software error-correcting code (ECC) protection or compression (such as in methods 1200-1900) of original data using ECC data in a cache 2140 (for example, a level in the memory or storage hierarchy, such as a RAID cache) according to an embodiment of the present invention.

The system 2100 (for example, a computer or computing system) includes a computer processing core 2110 (which can include a multi-core processor) for executing computer instructions and accessing data from a main memory 2120 (such as a random access memory), and a non-volatile storage medium 2130 (such as a disk drive) for storing the computer instructions. The processing core 2110, the storage medium 2130, and the computer instructions are configured to implement the software ECC protection or compression of the original data using the ECC data in the cache 2140 as described, for example, in the above methods 1200-1900.

The software ECC protection or compression includes a data matrix 2150 for holding the original data in the cache 2140, a check matrix 2160 for holding the ECC data in the first memory, and an encoding matrix 2170 for holding Galois Field multiplication factors in the main memory 2120. The multiplication factors are for encoding the original data into the ECC data (an example embodiment of which is described in detail in the Benefit Application and included above). The software ECC protection or compression also includes a thread 2180 for executing on the processing core 2110. The thread 2180 includes a Galois Field multiplier for multiplying entries of the data matrix 2150 by an entry of the encoding matrix 2170, and a sequencer for ordering operations through the data matrix 2150 and the encoding matrix 2170 using the Galois Field multiplier to generate the ECC data (further details of which are provided in the Benefit Application and included above).

The Galois Field multiplier may be a parallel multiplier for concurrently multiplying the entries of the data matrix 2150 by the entry of the encoding matrix 2170 (as described further in the Benefit Application and included above). The thread 2180 may also include a plurality of threads for executing on a multi-core processing unit. To this end, the software ECC protection or compression may further include a scheduler for generating the ECC data by dividing the data matrix 2150 into a plurality of data matrices, dividing the check matrix 2160 into a plurality of check matrices, assigning corresponding ones of the data matrices and the check matrices to the threads, and assigning the threads to the processing cores to concurrently generate portions of the ECC data corresponding to the check matrices from respective ones of the data matrices. Further details of the scheduler can be found in the Benefit Application that has been included above.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A system for software error-correcting code (ECC) protection or compression of original data using ECC data in a first memory, comprising:
    a processing core for executing computer instructions and accessing data from a main memory, the processing core comprising at least 16 data registers, each of the data registers comprising at least 16 bytes; and
    a non-volatile storage medium for storing the computer instructions,
    wherein the processing core, the non-volatile storage medium, and the computer instructions are configured to implement the software ECC protection or compression of the original data using the ECC data in the first memory, the software ECC protection or compression comprising:
        a data matrix for holding the original data in the first memory;
        a check matrix for holding the ECC data in the first memory;
        an encoding matrix for holding first factors in the main memory, the first factors being for encoding the original data into the ECC data; and
        a thread for executing on the processing core and comprising:

a Galois Field multiplier for multiplying entries of the data matrix by an entry of the encoding matrix; and a sequencer for ordering operations through the data matrix and the encoding matrix using the Galois Field multiplier to generate the ECC data.

2. The system of claim 1, wherein the sequencer is configured to access each entry of the data matrix from the main memory at most once while generating the ECC data.

3. The system of claim 2, wherein the Galois Field multiplier comprises two lookup tables for doing concurrent multiplication of 4-bit quantities across at least 16 byte-sized entries using the PSHUFB (Packed Shuffle Bytes) or equivalent instruction.

4. The system of claim 3, wherein the sequencer is further configured to generate the ECC data on write operations of the original data to the first memory.

5. The system of claim 2, wherein the sequencer is further configured to generate the ECC data on write operations of the original data to the first memory.

6. The system of claim 1, wherein the Galois Field multiplier comprises two lookup tables for doing concurrent multiplication of 4-bit quantities across at least 16 byte-sized entries using the PSHUFB (Packed Shuffle Bytes) or equivalent instruction.

7. The system of claim 6, wherein the sequencer is configured to generate the ECC data on write operations of the original data to the first memory.

8. The system of claim 1, wherein the sequencer is configured to generate the ECC data on write operations of the original data to the first memory.

9. A method of error-correcting code (ECC) protection or compression of original data with ECC data in a first memory using a computing system comprising a non-volatile storage medium for storing computer instructions, and a processing core for executing the computer instructions and accessing data from a main memory, the processing core comprising at least 16 data registers, each of the data registers comprising at least 16 bytes, the method comprising:

accessing the computer instructions from the non-volatile storage medium;

executing the computer instructions on the processing core;

arranging the original data as a data matrix in the first memory;

arranging the ECC data as a check matrix in the first memory;

arranging first factors as an encoding matrix in the main memory; and encoding the original data into the ECC data using the first factors, comprising:

multiplying entries of the data matrix by an entry of the encoding matrix using Galois Field multiplication; and ordering operations through the data matrix and the encoding matrix using the Galois Field multiplication to generate the ECC data.

10. The method of claim 9, wherein the ordering of the operations through the data matrix and the encoding matrix using the Galois Field multiplication to generate the ECC data comprises accessing each entry of the data matrix from the main memory at most once while generating the ECC data.

11. The method of claim 10, wherein the multiplying of the entries of the data matrix by the entry of the encoding matrix using Galois Field multiplication comprises using two lookup tables for doing concurrent multiplication of 4-bit quantities across at least 16 byte-sized entries using the PSHUFB (Packed Shuffle Bytes) or equivalent instruction.

12. The method of claim 11, wherein the ordering of the operations through the data matrix and the encoding matrix using the Galois Field multiplication to generate the ECC data further comprises generating the ECC data on write operations of the original data to the first memory.

13. The method of claim 10, wherein the ordering of the operations through the data matrix and the encoding matrix using the Galois Field multiplication to generate the ECC data further comprises generating the ECC data on write operations of the original data to the first memory.

14. The method of claim 9, wherein the multiplying of the entries of the data matrix by the entry of the encoding matrix using Galois Field multiplication comprises using two lookup tables for doing concurrent multiplication of 4-bit quantities across at least 16 byte-sized entries using the PSHUFB (Packed Shuffle Bytes) or equivalent instruction.

15. The method of claim 14, wherein the ordering of the operations through the data matrix and the encoding matrix using the Galois Field multiplication to generate the ECC data comprises generating the ECC data on write operations of the original data to the first memory.

16. The method of claim 9, wherein the ordering of the operations through the data matrix and the encoding matrix using the Galois Field multiplication to generate the ECC data comprises generating the ECC data on write operations of the original data to the first memory.

* * * * *